(12) United States Patent
Bae et al.

(10) Patent No.: US 12,334,484 B2
(45) Date of Patent: Jun. 17, 2025

(54) DISPLAY DEVICE

(71) Applicant: Samsung Display Co., LTD., Yongin-si (KR)

(72) Inventors: Sung Geun Bae, Hwaseong-si (KR); Jang Soon Park, Asan-si (KR); Hyun Wook Lee, Suwon-si (KR); Da Sol Jeong, Seoul (KR); Won Hyeong Heo, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 586 days.

(21) Appl. No.: 17/692,575

(22) Filed: Mar. 11, 2022

(65) Prior Publication Data

US 2023/0030101 A1     Feb. 2, 2023

(30) Foreign Application Priority Data

Jul. 27, 2021    (KR) ........................ 10-2021-0098241

(51) Int. Cl.
    *H10K 59/122*       (2023.01)
    *H01L 25/16*        (2023.01)
                (Continued)

(52) U.S. Cl.
    CPC ......... *H01L 25/167* (2013.01); *H10K 50/858* (2023.02); *H10K 50/865* (2023.02);
                (Continued)

(58) Field of Classification Search
    CPC ..... H10K 59/122; H10K 50/865; H10K 59/38
    See application file for complete search history.

(56) References Cited

U.S. PATENT DOCUMENTS 10,943,947 B2    3/2021   Im et al.
11,621,305 B2    4/2023   Park et al.
                (Continued)

FOREIGN PATENT DOCUMENTS

KR    10-2019-0121894    10/2019
KR    10-2020-0073340     6/2020
                (Continued)

OTHER PUBLICATIONS

International Search Report, corresponding to International Application No. PCT/KR2022/010814 dated Nov. 1, 2022.

(Continued)

*Primary Examiner* — Eliseo Ramos Feliciano
*Assistant Examiner* — Mikka Liu
(74) *Attorney, Agent, or Firm* — KILE PARK REED & HOUTTEMAN PLLC

(57) ABSTRACT

A display device includes a first electrode and a second electrode on a substrate spaced apart from each other, a first insulating layer on the first and second electrodes, wall patterns on the first insulating layer and overlapping the first electrode and the second electrode, a second insulating layer on the first insulating layer and overlapping the wall patterns, light-emitting elements directly on the second insulating layer and between the wall patterns, a bank layer on the first insulating layer and surrounding an area including the light-emitting elements, and a first connecting electrode on the first electrode electrically contacting the light-emitting elements, and a second connecting electrode on the second electrode electrically contacting the light-emitting elements, the first insulating layer includes an organic insulating material, and the second insulating layer includes an inorganic insulating material.

28 Claims, 45 Drawing Sheets

(51) Int. Cl.
*H10K 50/858* (2023.01)
*H10K 50/86* (2023.01)
*H10K 59/131* (2023.01)
*H10K 59/38* (2023.01)
*H10K 59/80* (2023.01)

(52) U.S. Cl.
CPC ......... *H10K 59/122* (2023.02); *H10K 59/131* (2023.02); *H10K 59/38* (2023.02); *H10K 59/879* (2023.02); *H10K 59/8792* (2023.02)

(56) References Cited

U.S. PATENT DOCUMENTS

| | | | |
|---|---|---|---|
| 2007/0046590 A1* | 3/2007 | Umezaki | G09G 3/3225 345/76 |
| 2018/0358339 A1 | 12/2018 | Iguchi | |
| 2019/0131557 A1* | 5/2019 | Lee | H10K 85/626 |
| 2019/0326348 A1* | 10/2019 | Im | H01L 27/156 |
| 2021/0151419 A1 | 5/2021 | Lee et al. | |
| 2021/0193734 A1 | 6/2021 | Im et al. | |
| 2021/0202810 A1 | 7/2021 | Jung et al. | |
| 2022/0068901 A1 | 3/2022 | Kong et al. | |
| 2022/0393071 A1 | 12/2022 | Moon et al. | |
| 2023/0057723 A1 | 2/2023 | Li et al. | |

FOREIGN PATENT DOCUMENTS

| | | | |
|---|---|---|---|
| KR | 10-2021-0031586 | 3/2021 | |
| KR | 10-2021-0055831 | 5/2021 | |
| KR | 10-2021-0059107 | 5/2021 | |
| KR | 10-2021-0077086 | 6/2021 | |
| KR | 10-2021-0086816 | 7/2021 | |
| WO | WO-2020122337 A1 * | 6/2020 | ........... G02F 1/1362 |

OTHER PUBLICATIONS

Written Opinion, corresponding to International Application No. PCT/KR2022/010814, dated Nov. 1, 2022.

* cited by examiner

FIG. 1
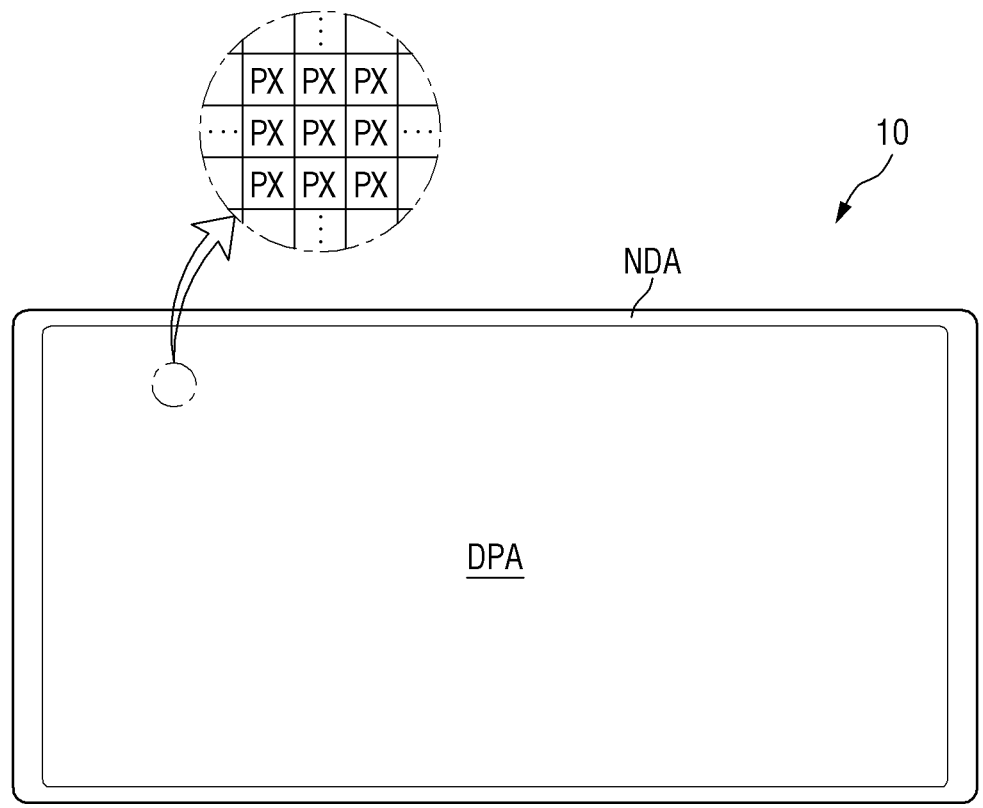
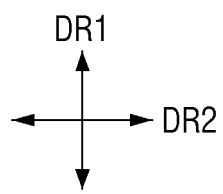

FIG. 45
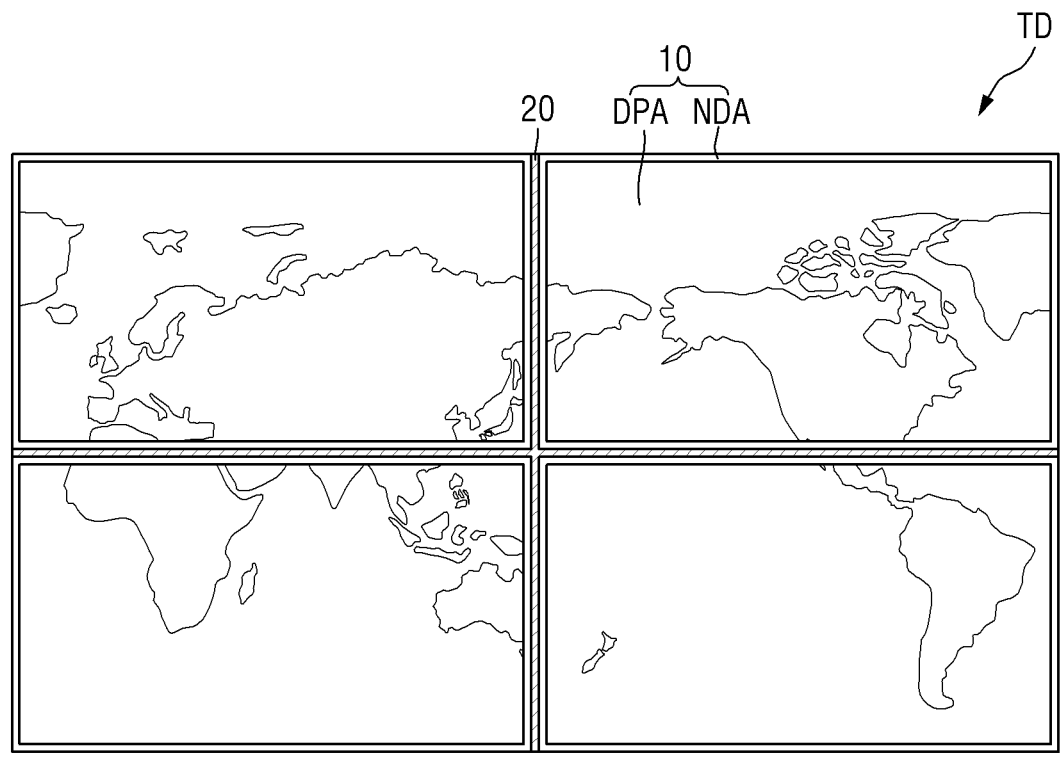
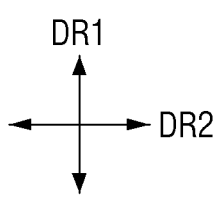

DISPLAY DEVICE

CROSS-REFERENCE TO RELATED APPLICATION(S)

This application claims priority to and benefits of Korean Patent Application No. 10-2021-0098241 under 35 U.S.C. § 119 filed on Jul. 27, 2021 in the Korean Intellectual Property Office, the entire contents of which are incorporated herein by reference.

BACKGROUND

1. Technical Field

The disclosure relates to a display device.

2. Description of the Related Art

Display devices are becoming increasingly important with the development of multimedia. Accordingly, various types of display devices such as organic light emitting displays (OLEDs) and liquid crystal displays (LCDs) are being used.

As a device for displaying an image of a display device, there is a self-luminous display device including a light emitting element. The self-luminous display device may be an organic light emitting display using an organic material as a light emitting material as a light emitting element or an inorganic light emitting display using an inorganic material as a light emitting material.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a display device that prevents connection defects between electrodes and lower conductive layers and alignment defects of light-emitting elements that may be caused by height differences formed by the electrodes.

However, embodiments are not restricted to those set forth herein. The above and other embodiments will become more apparent to one of ordinary skill in the art to which the disclosure pertains by referencing the detailed description given below.

According to an embodiment, a display device may include a first electrode and a second electrode disposed on a substrate, the first electrode and the second electrode being spaced apart from each other; a first insulating layer disposed on the first electrode and the second electrode; wall patterns disposed on the first insulating layer and overlapping the first electrode and the second electrode; a second insulating layer disposed on the first insulating layer and overlapping the wall patterns; light-emitting elements disposed directly on the second insulating layer and disposed between the wall patterns; a bank layer disposed on the first insulating layer and surrounding an area including the light-emitting elements; a first connecting electrode disposed on the first electrode and electrically contacting the light-emitting elements, and a second connecting electrode disposed on the second electrode and electrically contacting the light-emitting elements, wherein the first insulating layer may include an organic insulating material, and the second insulating layer may include an inorganic insulating material.

The wall patterns may be disposed directly on the first insulating layer, and parts of the second insulating layer may be disposed directly on the wall patterns.

The bank layer may be disposed directly on the first insulating layer, and the second insulating layer may be disposed in the area surrounded by the bank layer.

The bank layer may overlap parts of the second insulating layer disposed directly on the first insulating layer.

The second insulating layer may be disposed directly on the first insulating layer, and the wall patterns may be disposed directly on the second insulating layer.

The bank layer may be disposed directly on the first insulating layer and does not overlap the second insulating layer.

The display device may further comprise a via layer disposed between the substrate and the first electrode and disposed between the substrate and the second electrode, the via layer including an organic insulating material, wherein a thickness of the first insulating layer may be less than a thickness of the via layer.

A distance between the first electrode and the second electrode may be less than a distance between the wall patterns.

The display device may further include a first voltage line and a second voltage line disposed on the substrate; and a passivation layer disposed on the first voltage line and the second voltage line, wherein the first electrode and the second electrode may be disposed on the passivation layer.

The first connecting electrode and the second connecting electrode may be electrically connected to the first voltage line and the second voltage line, respectively.

Part of the second electrode that does not overlap the first insulating layer may directly electrically contact the second voltage line through a contact hole penetrating the passivation layer, in an area that does not overlap the first insulating layer, and part of the second connecting electrode that does not overlap the first insulating layer may directly electrically contact the second electrode through a contact hole penetrating the second insulating layer.

The second connecting electrode may directly electrically contact the second voltage line through a contact hole penetrating the second insulating layer and the passivation layer.

The display device may further include a third electrode disposed on the substrate and disposed between the first electrode and the second electrode; and a fourth electrode disposed on the substrate, the fourth electrode being spaced apart from the third electrode, the second electrode disposed between the fourth electrode and the third electrode, wherein the wall patterns may include a first wall pattern overlapping the first electrode, a second wall pattern overlapping the fourth electrode, and a third wall pattern overlapping the second electrode and the third electrode, and the light-emitting elements may include first light-emitting elements disposed between the first wall patterns and the third wall patterns, and second light-emitting elements disposed between the second wall patterns and the third wall patterns.

The first connecting electrode may electrically contact the first light-emitting elements, the second connecting electrode may electrically contact the second light-emitting elements, and the display device may further include a third connecting electrode disposed on the third electrode and electrically contacting the first light-emitting elements, and a fourth connecting electrode disposed on the fourth electrode and electrically contacting the second light-emitting elements.

The display device may further include a color control structure disposed on the light-emitting elements, the color control structure including wavelength conversion particles; a color filter layer disposed on the color control structure; and a light-blocking member disposed on the bank layer, the light-blocking member surrounding the color filter layer.

The display device may further include an upper bank layer disposed on the bank layer; and a low refractive layer disposed between the color control structure and the color filter layer, wherein the color control structure may be disposed in an area surrounded by the upper bank layer.

According to an embodiment, a display device may include a substrate including an emission area and a subarea disposed on a side in a first direction of the emission area; a first electrode and a second electrode extending in the first direction on the substrate, spaced apart from each other in the first direction, and disposed in the emission area and the subarea; a first insulating layer disposed in the emission area and overlapping parts of the first electrode and the second electrode in the emission area; wall patterns extending in the first direction in the emission area and spaced apart from one another in a second direction; a bank layer surrounding the emission area and the subarea; a second insulating layer including a first insulating pattern disposed in the emission area and overlapping the wall patterns; and a second insulating pattern disposed in the subarea; light-emitting elements disposed on the second insulating layer and disposed between the wall patterns; a first connecting electrode disposed on the first electrode in the emission area and the subarea, and electrically contacting the light-emitting elements; and a second connecting electrode disposed on the second electrode in the emission area and the subarea, and electrically contacting the light-emitting elements.

The first insulating layer may overlap parts of the bank layer that surround the emission area of the substrate, and the first insulating pattern of the second insulating layer may not overlap the parts of the bank layer that surround the emission area of the substrate.

The second insulating pattern may include a first contact exposing part of a top surface of the first electrode in the subarea; and a second contact exposing part of a top surface of the second electrode in the subarea, the first connecting electrode may directly electrically contact the first electrode through the first contact, and the second connecting electrode may directly electrically contact the second electrode through the second contact.

The second insulating pattern may include a first contact which does not overlap the first electrode in the subarea, and a second contact which does not overlap the second electrode in the subarea, the first connecting electrode may not contact the first electrode, and the second connecting electrode may not contact the second electrode.

The first insulating layer may include an organic insulating material, and the second insulating layer may include an inorganic insulating material.

The display device may further include a third insulating layer disposed on the light-emitting elements and disposed between the wall patterns.

The display device may further comprise a third electrode disposed between the first electrode and the second electrode, and a fourth electrode spaced apart from the third electrode in the second direction, the second electrode being disposed between the fourth electrode and the third electrode, wherein the wall patterns may include a first wall pattern overlapping the first electrode; a second wall pattern overlapping the fourth electrode; and a third wall pattern overlapping the second electrode and the third electrode.

The light-emitting elements may include first light-emitting elements, second light-emitting elements, third light-emitting elements, and fourth light-emitting elements, the first light-emitting elements and the third light-emitting elements may be disposed on the first electrode and the third electrode and disposed between the first wall patterns and the third wall patterns, and the second light-emitting elements and the fourth light-emitting elements may be disposed on the second electrode and the fourth electrode and disposed between the second wall patterns and the third wall patterns.

The display device may further include a third connecting electrode spaced apart from the first connecting electrode and disposed on the first electrode and the third electrode; a fourth connecting electrode spaced apart from the second connecting electrode and disposed on the second electrode and the fourth electrode; and a fifth connecting electrode spaced apart from the third connecting electrode and the fourth connecting electrode and disposed on the third electrode and the fourth electrode.

According to the aforementioned and other embodiments, as an organic insulating layer is disposed between electrodes and conductive layers, layers disposed on the electrodes can be prevented from being damaged by height differences formed by the electrodes. Also, as light-emitting elements are disposed on a flat surface, regardless of whether they overlap the electrodes, the degrees of alignment and deflection of the light-emitting elements can be improved.

Other features and embodiments may be apparent from the following detailed description, the drawings, and the claims.

BRIEF DESCRIPTION OF THE DRAWINGS

The above and other embodiments and features will become more apparent by describing in detail embodiments thereof with reference to the attached drawings, in which:

FIG. 1 is a schematic plan view of a display device according to an embodiment;

FIG. 45 is a schematic plan view of a tiled display device including display devices according to an embodiment.

DETAILED DESCRIPTION OF THE EMBODIMENTS

Figure 2:
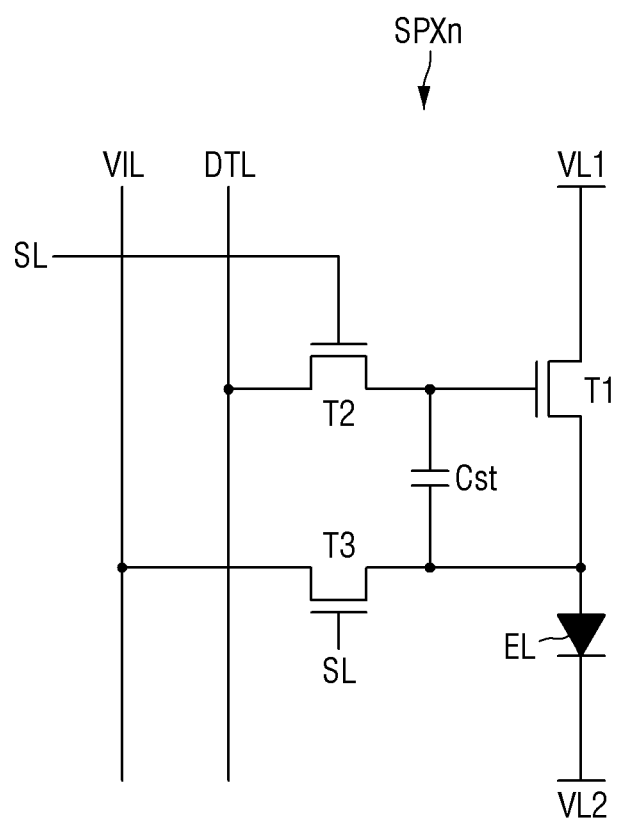
FIG. 2 is a schematic diagram of an equivalent circuit of a subpixel of the display device of FIG. 1.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be described with reference to the accompanying drawings.

FIG. 1 is a schematic plan view of a display device according to an embodiment.

Referring to FIG. 1, a display device 10 displays a moving or still image. The display device 10 may refer to nearly all types of electronic devices that provide a display screen. Examples of the display device 10 may include a television (TV), a notebook computer, a monitor, a billboard, an Internet-of-Things (IoT) device, a mobile phone, a smartphone, a tablet personal computer (PC), an electronic watch, a smartwatch, a watchphone, a head-mounted display (HMD), a mobile communication terminal, an electronic notepad, an electronic book (e-book), a portable multimedia player (PMP), a navigation device, a gaming console, a digital camera, a camcorder, and the like within the spirit and the scope of the disclosure.

The display device 10 may include a display panel that provides a display screen. Examples of the display panel of the display device 10 include an inorganic light-emitting diode (ILED) display panel, an organic light-emitting diode (OLED) display panel, a quantum-dot light-emitting diode (QLED) display panel, a plasma display panel (PDP), a field-emission display (FED) panel, and the like within the spirit and the scope of the disclosure. The display panel of the display device 10 will hereinafter be described as being, for example, an ILED display panel, but the disclosure is not limited thereto. For example, various other display panels are also applicable to the display panel of the display device 10.

The shape of the display device 10 may vary. In one example, the display device 10 may have a rectangular shape that extends longer in a horizontal direction than in a vertical direction, a rectangular shape that extends longer in the vertical direction than in the horizontal direction, a square shape, a tetragonal shape with rounded corners, a non-tetragonal polygonal shape, or a circular shape. The shape of a display area DPA of the display device 10 may be similar to the shape of the display device 10. FIG. 1 illustrates that the display device 10 and the display area DPA both have a rectangular shape that extends in a second direction DR2. It is to be understood that the shapes disclosed herein may include shapes substantially identical or similar to the shapes.

The display device 10 may include the display area DPA and a non-display area NDA. The display area DPA may be an area in which a screen is displayed, and the non-display area NDA may be an area in which a screen is not displayed. The display area DPA may also be referred to as an active area, and the non-display area NDA may also be referred to as an inactive area. The display area DPA may occupy the middle part of the display device 10.

The display area DPA may include pixels PX. The pixels PX may be arranged (or disposed) in row and column directions. Each of the pixels PX may have a rectangular or square shape in a plan view, but the disclosure is not limited thereto. For example, each of the pixels PX may have a rhombus shape having sides inclined with respect to a particular or given direction. The pixels PX may be arranged (or disposed) in a stripe fashion or an island fashion. Each of the pixels PX may include one or more light-emitting elements, which emit light of a particular or given wavelength range.

The non-display area NDA may be disposed around the display area DPA. The non-display area NDA may surround the entire display area DPA or part of the display area DPA or may be adjacent to the display area DPA. The display area DPA may have a rectangular shape, and the non-display area NDA may be disposed adjacent to four sides of the display area DPA. The non-display area NDA may form the bezel of the display device 10. Lines or circuit drivers included in the display device 10 may be disposed in the non-display area NDA, or external devices may be mounted in the non-display area NDA.

FIG. 2 is a schematic diagram of an equivalent circuit of a subpixel of the display device of FIG. 1.

Referring to FIG. 2, a pixel PX or a subpixel SPXn (where n is an integer of 1 to 3) of the display device 10 may include a pixel driving circuit. The pixel driving circuit may include transistors and capacitors. The numbers of transistors and capacitors included in the pixel driving circuit may vary. In one example, the pixel driving circuit may have a "3T1C" structure including three transistors and one capacitor. The pixel driving circuit will hereinafter be described as having the "3T1C" structure, but the disclosure is not limited thereto. For example, various other structures such as a "2T1C", "7T1C", or "6T1C" structure may also be applicable to the pixel driving circuit.

The subpixel SPXn of the display device 10 may include a light-emitting diode (LED) "EL", three transistors, for example, first, second, and third transistors T1, T2, and T3, and one storage capacitor Cst.

The LED "EL" emits light in accordance with a current applied thereto via the first transistor T1. The LED "EL" may include a first electrode, a second electrode, and at least one light-emitting element disposed between the first and second electrodes. The light-emitting element may emit light of a particular or given wavelength range in accordance with electric signals transmitted thereto from the first and second electrodes.

A first end of the LED "EL" may be connected to the source electrode of the first transistor T1, and a second end of the LED "EL" may be connected to a second voltage line VL2, to which a low-potential voltage (hereinafter, a second power supply voltage) is supplied. Here, the second power supply voltage is lower than a high-potential voltage (hereinafter, a first power supply voltage), which is supplied to a first voltage line VL1. The second end of the LED "EL" may be connected to the source electrode of the second transistor T2.

The term "connect" or "connection", as used herein, not only means that one element is coupled to another element through physical contact, but also means that one element may be coupled to another element via yet another element. One integral member may be understood as having parts connected to one another. Also, the connection between two elements may encompass not only a direct connection between the two elements, but also an electrical connection between the two elements.

The first transistor T1 controls a current flowing from the first voltage line VL1, to which the first power supply voltage is supplied, to the LED "EL" in accordance with the difference in voltage between the gate electrode and the source electrode of the first transistor T1. In one example, the first transistor T1 may be a transistor for driving the LED "EL". The gate electrode of the first transistor T1 may be connected to the source electrode of the second transistor T2, the source electrode of the first transistor T1 may be connected to the first electrode of the LED "EL", and the drain electrode of the first transistor T1 may be connected to the first voltage line VL1, to which the first power supply voltage is supplied.

The second transistor T2 is turned on by a scan signal from a scan line SL to connect a data line DTL to the gate electrode of the first transistor T1. The gate electrode of the second transistor T2 may be connected to the scan line SL, the source electrode of the second transistor T2 may be connected to the gate electrode of the first transistor T1, and the drain electrode of the second transistor T2 may be connected to the data line DTL.

The third transistor T3 is turned on by a second scan signal from a second scan line SL to connect an initialization voltage line VIL to a first end of the LED "EL". The gate electrode of the third transistor T3 may be connected to the second scan line SL, the drain electrode of the third transistor T3 may be connected to the initialization voltage line VIL, and the source electrode of the third transistor T3 may be connected to the first end of the LED "EL" or the source electrode of the first transistor T1. The second and third transistors T2 and T3 may be turned on by a same scan signal.

Figure 3:
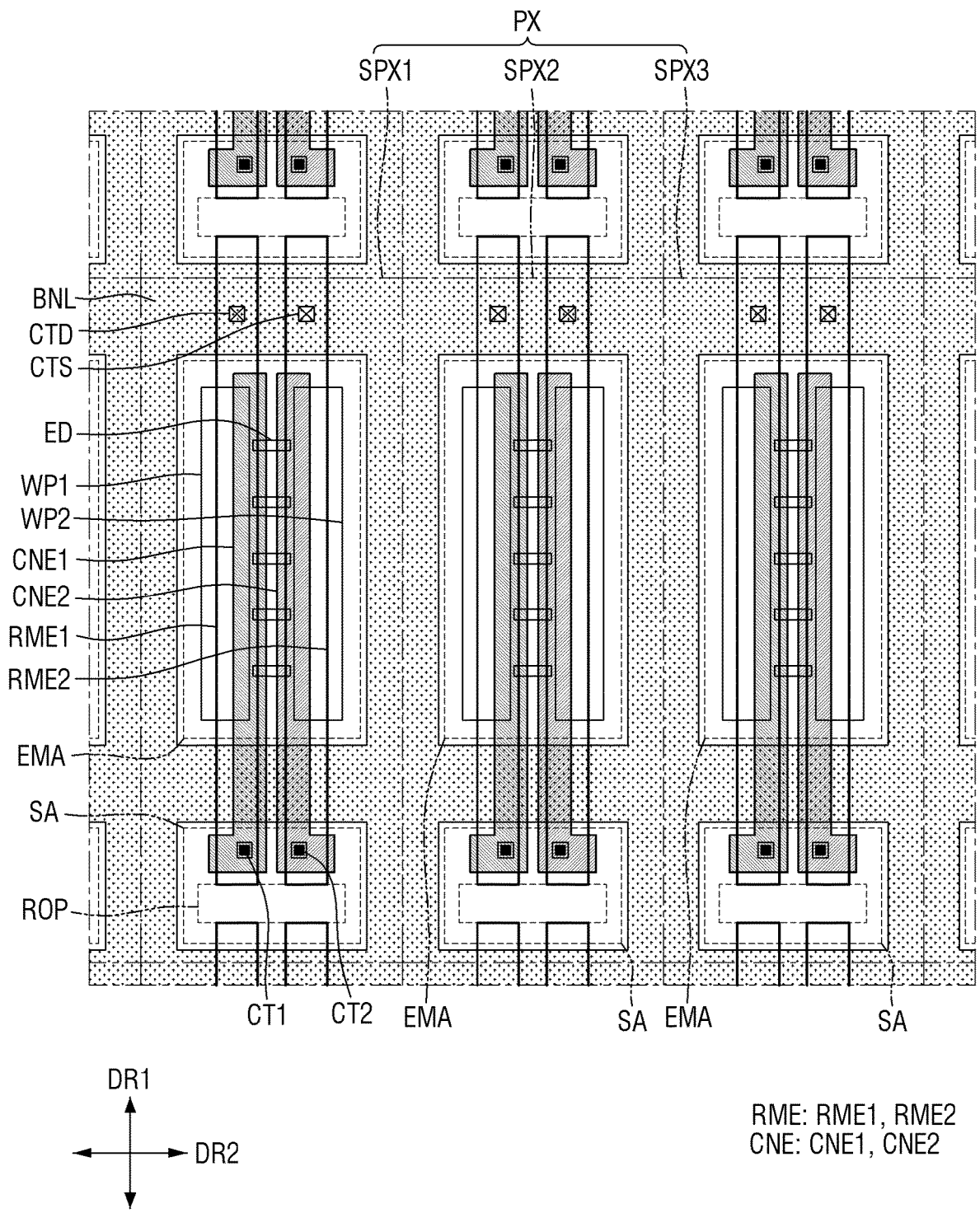
FIG. 3 is a schematic plan view of a pixel of the display device of FIG. 1.

The source electrodes and the drain electrodes of the first, second, and third transistors T1, T2, and T3 are not limited to the above descriptions. The first, second, and third transistors T1, T2, and T3 may be formed as thin-film transistors (TFTs). FIG. 3 illustrates that the first, second, and third transistors T1, T2, and T3 are formed as N-type metal-oxide semiconductor field-effect transistors (MOSFETs), but the disclosure is not limited thereto. For example, the first, second, and third transistors T1, T2, and T3 may all be formed as P-type MOSFETs. As an example, some or a number of the first, second, and third transistors T1, T2, and T3 may be formed as N-type MOSFETS, and the other transistor(s) may be formed as P-type MOSFETs.

The storage capacitor Cst is formed between the gate electrode and the source electrode of the first transistor T1. The storage capacitor Cst stores a differential voltage corresponding to the difference in voltage between the gate electrode and the source electrode of the first transistor T1.

The structure of a pixel PX of the display device 10 will hereinafter be described in further detail.

Figure 4:
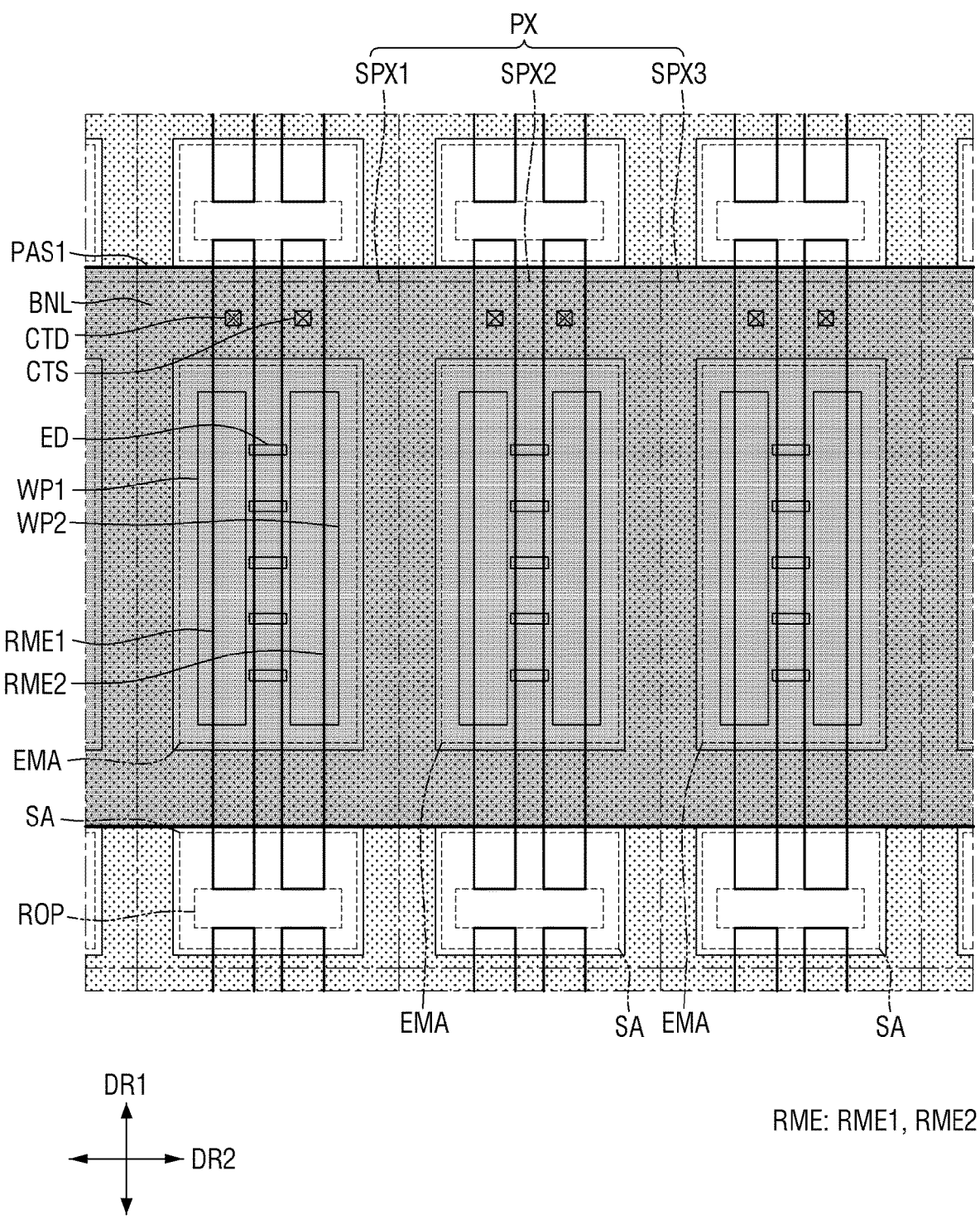
FIG. 4 is a schematic plan view illustrating a first insulating layer in the pixel of FIG. 3.
Figure 5:
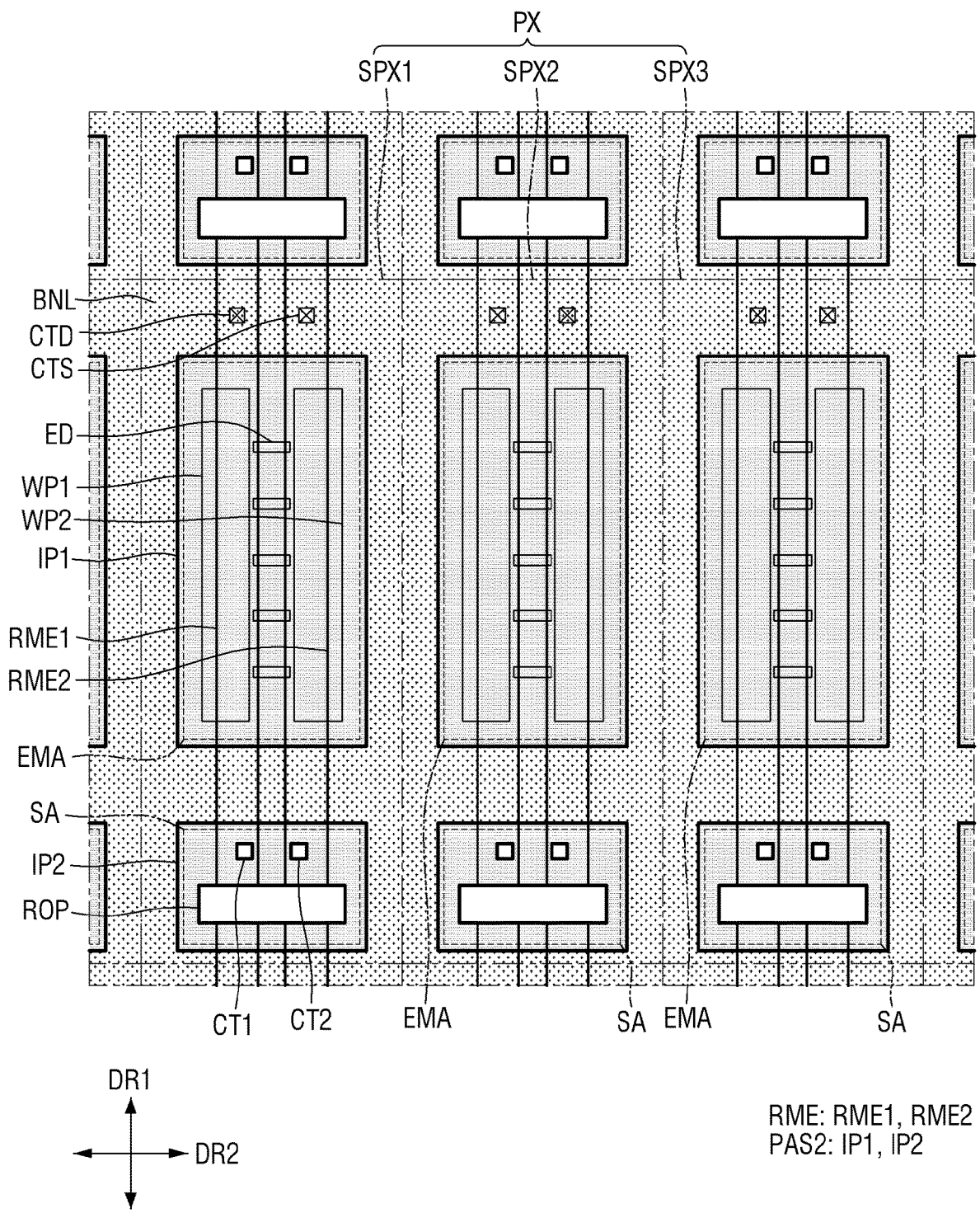
FIG. 5 is a schematic plan view illustrating a second insulating layer in the pixel of FIG. 3.

FIG. 3 is a schematic plan view of a pixel of the display device of FIG. 1. FIG. 4 is a schematic plan view of a first insulating layer disposed in the pixel of FIG. 3. FIG. 5 is a schematic plan view of a second insulating layer disposed in the pixel of FIG. 3.

FIG. 3 illustrates the layout of electrodes RME, wall patterns (WP1 and WP2), a bank layer BNL, light-emitting elements ED, and connecting electrodes CNE in a pixel PX. FIG. 4 illustrates the layout of the electrodes RME, the wall patterns (WP1 and WP2), the bank layer BNL, and a first insulating layer PAS1 in the pixel PX of FIG. 3, and FIG. 5 illustrates the layout of the electrodes RME, the wall patterns (WP1 and WP2), the bank layer BNL, and a second insulating layer PAS2 in the pixel PX of FIG. 3.

Referring to FIGS. 3 through 5, a pixel PX may include subpixels SPXn. In one example, the pixel PX may include first, second, and third subpixels SPX1, SPX2, and SPX3. The first subpixel SPX1 may emit first-color light, the second subpixel SPX2 may emit second-color light, and the third subpixel SPX3 may emit third-color light. In one example, the first-color light, the second-color light, and the third-color light may be blue light, green light, and red light, respectively, but the disclosure is not limited thereto. For example, the subpixels SPXn may all emit light of a same color. In one example, the subpixels SPXn may all emit blue light. FIGS. 3 through 5 illustrate that the pixel PX may include three subpixels SPXn, but the disclosure is not limited thereto. For example, the pixel PX may include more than three subpixels SPXn.

The subpixels SPXn may include emission areas EMA and non-emission areas. The emission areas EMA may be areas that output light of a particular or given wavelength range due to the presence of light-emitting elements ED therein. The non-emission areas may be areas that are not reached by light emitted by the light-emitting elements ED and do not output light due to the absence of light-emitting elements therein.

The emission areas EMA may include regions where arrays of light-emitting elements ED are disposed and regions around the arrays of light-emitting elements ED that output light emitted by the light-emitting elements ED. For example, the emission areas EMA may also include regions that output light, emitted by the light-emitting elements ED and reflected or refracted by other members. Light-emitting elements ED may be disposed in each of the subpixels SPXn to form an emission area EMA including a region where the light-emitting elements ED are disposed and the surroundings of the region in which the light-emitting elements ED are disposed.

FIGS. 3 through 5 illustrate that the emission areas EMA of the first, second, and third subpixels SPX1, SPX2, and SPX3 have a same size. In an embodiment, the emission areas EMA of the subpixels SPXn may have different sizes depending on the color or the wavelength of light emitted by light-emitting elements ED.

The subpixels SPXn may further include subareas SA, which are disposed in the non-emission areas of the subpixels SPXn. The subareas SA may be disposed on the lower sides of the emission areas EMA. In one example, the emission areas EMA and the subareas SA may be arranged (or disposed) one after another in the first direction DR1, and the subareas SA may be disposed between the emission areas EMA of pairs of subpixels SPXn that are spaced apart from each other in the first direction DR1. For example, the emission areas EMA and the subareas SA may be alternately arranged (or disposed) in the first direction DR1, and the emission areas EMA or the subareas SA may be repeatedly arranged (or disposed) in the second direction DR2. However, the disclosure is not limited to this example. For example, the emission areas EMA and the subareas SA may have a different layout from that illustrated in FIG. 3.

As no light-emitting elements ED are disposed in the subareas SA, no light may be output from the subareas SA, but electrodes RME may be disposed in part in the subareas SA. The electrodes RME may be separated from one another, between different subpixels SPXn, by separation parts ROP of the subareas SA.

Lines (or wires) and circuit elements of a circuit layer disposed in the pixel PX to be connected to light-emitting elements ED may be connected to the first, second, and third subpixels SPX1, SPX2, and SPX3. However, the lines and the circuit elements may not be disposed to correspond to the first, second, and third subpixels SPXn or the emission areas EMA of the first, second, and third subpixels SPX1, SPX2, and SPX3, but may be disposed regardless of the locations of the emission areas EMA of the first, second, and third subpixels SPX1, SPX2, and SPX3 in the pixel PX.

The bank layer BNL may be disposed to surround the subpixels SPXn, the emission areas EMA, and the subareas SA. The bank layer BNL may be disposed not only along the boundaries between each pair of subpixels SPXn that are adjacent to each other in the first or second direction DR1 or DR2, but also along the boundaries between the emission areas EMA, between the subareas SA, and between the emission areas EMA and the subareas SA. The subpixels SPXn, the emission areas EMA, and the subareas SA may be areas defined by the bank layer BNL. The distances between the subpixels SPXn, the emission areas EMA, and the subareas SA may vary depending on the width of the bank layer BNL.

The bank layer BNL may include parts extending in the first direction DR1 and parts extending in the second direction DR2 and may be arranged (or disposed) in a lattice shape in a plan view, over the entire display area DPA. The bank layer BNL may be disposed along the boundaries of each of the subpixels SPXn to separate the subpixels SPXn from one another. Also, the bank layer BNL may be disposed to surround and separate the emission areas EMA and the subareas SA of the subpixels SPXn.

Electrodes RME may be disposed in each of the subpixels SPXn to extend in one direction or in a direction. The electrodes RME may extend in the first direction DR1 to be disposed in the emission areas EMA and the subareas of the subpixels SPXn and may be spaced apart from one another in the second direction DR2.

The display device 10 may include first and second electrodes RME1 and RME2 in each of the subpixels SPXn. First electrodes RME1 may be disposed, for example, on the left sides of the centers of the emission areas EMA, and second electrodes RME2 may be spaced apart from the first electrodes RME1 in the second direction DR2, for example, on the right sides of the centers of the emission areas EMA. The first electrodes RME1 may be disposed to overlap first wall patterns WP1, and the second electrodes RME2 may be disposed to overlap second wall patterns WP2. The first electrodes RME1 may be spaced apart from one another by separation parts ROP in the subareas SA, between pairs of subpixels SPXn that are adjacent to each other in the first direction DR1. It is to be understood that elements may overlap in a plan view.

FIGS. 3 through 5 illustrate that two electrodes RME are disposed in each of the subpixels SPXn to extend in the first direction DR1, but the disclosure is not limited thereto. For example, more than two electrodes RME may be disposed in each of the subpixels SPXn, and the electrodes RME may be bent in part and may have different widths from one location to another location.

The first insulating layer PAS1 may be disposed in the emission areas EMA of the subpixels SPXn. For example, the first insulating layer PAS1 may have a larger width in the first direction DR1 than the emission areas EMA and may extend in the second direction DR2. The first insulating layer PAS1 may be disposed in the emission areas EMA of subpixels SPXn that are arranged (or disposed) in the second direction DR2 and may be arranged (or disposed) as a linear pattern in the display area DPA, but the disclosure is not limited thereto. For example, the first insulating layer PAS1 may be disposed to correspond to each of the emission areas EMA and may be arranged (or disposed) as an island pattern.

The first insulating layer PAS1 may be disposed to surround the bank layer BNL, which surrounds the emission areas EMA, and the electrodes RME, which are disposed in the emission areas EMA, but may not be disposed in the subareas SA. Parts of the electrodes RME that are disposed in the subareas SA may not overlap the first insulating layer PAS1. Parts of the bank layer BNL that surround the emission areas EMA may overlap the first insulating layer PAS1, and parts of the bank layer BNL that surround the subareas SA and extend in the first direction DR1 may not overlap the first insulating layer PAS1.

The wall patterns (WP1 and WP2) may be disposed in the emission areas EMA of the subpixels SPXn. The wall patterns (WP1 and WP2) may have a width in the second direction DR2 and may extend in the first direction DR1. The wall patterns (WP1 and WP2) may be disposed in the emission areas EMA to overlap the first insulating layer PAS1 and the electrodes RME.

For example, the wall patterns (WP1 and WP2) may include the first wall patterns WP1 and the second wall patterns WP2, and the first wall patterns WP1 may be spaced apart from the second wall patterns WP2 in the second direction DR2, in the emission areas EMA of the subpixels SPXn. The first wall patterns WP1 may be disposed on the left sides of the centers of the emission areas EMA, and the second wall patterns WP2 may be disposed on the right sides of the centers of the emission areas EMA. The first wall patterns WP1 may partially overlap the first electrodes RME1, and the second wall patterns WP2 may partially overlap the second electrodes RME2. The first wall patterns WP1 and the second wall patterns WP2 may be alternately arranged (or disposed) in the second direction DR2 as island patterns in the display area DPA.

The first wall patterns WP1 and the second wall patterns WP2 may have a same length in the first direction DR1, and the length, in the first direction DR1, of the first wall patterns WP1 and the second wall patterns WP2 may be less than the length, in the first direction DR1, of the emission areas EMA, surrounded by the bank layer BNL. The first wall patterns WP1 and the second wall patterns WP2 may be spaced apart from the parts of the bank layer BNL that extend in the second direction DR2, but the disclosure is not limited thereto. For example, the wall patterns (WP1 and WP2) and the bank layer BNL may be integral with each other or may partially overlap the parts of the bank layer BNL that extend in the second direction DR2, in which case, the length, in the first direction DR1, of the wall patterns (WP1 and WP2) may be the same as the length, in the first direction DR1, of the emission areas EMA, surrounded by the bank layer BNL.

The first wall patterns WP1 and the second wall patterns WP2 may have a same width in the second direction DR2, but the disclosure is not limited thereto. For example, the first wall patterns WP1 and the second wall patterns WP2 may have different widths in the second direction DR2. For example, the first wall patterns WP1 may have a larger width than the second wall patterns WP2, or vice versa. Whichever of the first wall patterns WP1 and the second wall patterns WP2 have a larger width than the other wall patterns may be disposed between the emission areas EMA of pairs of subpixels SPXn that are adjacent to each other in the second direction DR2, and the parts of the bank layer BNL that extend in the first direction DR1 may overlap the second wall patterns WP2 in a thickness direction.

The second insulating layer PAS2, which accounts for areas surrounded by the bank layer BNL, may be disposed in the emission areas EMA and the subareas SA of the subpixels SPXn. For example, the second insulating layer PAS2 may include first insulating patterns IP1, which are disposed in the emission areas EMA, and second insulating patterns IP2, which are disposed in the subareas SA.

The first insulating patterns IP1 of the second insulating layer PAS2 may be disposed in the emission areas EMA to overlap parts of the wall patterns (WP1 and WP2) and the electrodes RME. The second insulating patterns IP2 of the second insulating layer PAS2 may be disposed in the subareas SA to overlap parts of the electrodes RME. The second insulating patterns IP2 may be disposed to cover or overlap the electrodes RME in the entire subareas SA except for the separation parts ROP and contacts (CT1 and CT2). The first insulating patterns IP1 and the second insulating patterns IP2 of the second insulating layer PAS2 may be arranged (or disposed) in a similar manner in both the emission areas EMA and the subarea SA. For example, the first insulating patterns IP1 or the second insulating patterns IP2 may be repeatedly arranged (or disposed) in the second direction DR2, and the first insulating patterns IP1 and the second insulating patterns IP2 may be alternately arranged (or disposed) in the first direction DR1.

The first insulating patterns IP1 and the second insulating patterns IP2 of the second insulating layer PAS2 may be disposed not to overlap the bank layer BNL, the first insulating patterns IP1 may be disposed to overlap the first insulating layer PAS1, and the second insulating patterns IP2 may be disposed not to overlap the first insulating layer PAS1. As will be described later, the order in which the second insulating layer PAS2, the wall patterns (WP1 and WP2), and the bank layer BNL are formed is not particularly limited, and the layout of the second insulating layer PAS2, the wall patterns (WP1 and WP2), and the bank layer BNL relative to one another may vary in accordance with the order in which the second insulating layer PAS2, the wall patterns (WP1 and WP2), and the bank layer BNL are formed during the fabrication of the display device 10. However, the top surface of at least the bank layer BNL is not covered or overlapped by the second insulating layer PAS2. In an embodiment, the second insulating layer PAS2 may be disposed to overlap the bank layer BNL, from below the bank layer BNL, and this will be described later.

Light-emitting elements ED may be arranged (or disposed) in each of the emission areas EMA. The light-emitting elements ED may be disposed between the wall patterns (WP1 and WP2) and may be spaced apart from one another in the first direction DR1. For example, the light-emitting elements ED may extend in one direction or in a direction, and both end portions of each of the light-emitting elements ED may be disposed on different electrodes RME. The direction in which the light-emitting elements ED extend may be orthogonal to the first direction DR1, but the disclosure is not limited thereto. For example, the direction in which the light-emitting elements ED extend may be orthogonal to, or inclined with respect to, the second direction DR2.

Connecting electrodes CNE may be disposed on the electrodes RME and the wall patterns (WP1 and WP2) and may be in contact with the light-emitting elements ED. The connecting electrodes CNE may extend in one direction or in a direction and may be spaced apart from one another.

The connecting electrodes CNE may include first and second connecting electrodes CNE1 and CNE2, which are disposed in each of the subpixels SPXn. First connecting electrodes CNE1 may extend in the first direction DR1 and may be disposed on the first electrodes RME1 or the first wall patterns WP1. The first connecting electrodes CNE1 may partially overlap the first electrodes RME1 and may be disposed not only in the emission areas EMA, but also in the subareas SA beyond the bank layer BNL. Second connecting electrodes CNE2 may extend in the first direction DR1 and may be disposed on the second electrodes RME2 or the second wall patterns WP2. The second connecting electrodes CNE2 may partially overlap the second electrodes RME2 and may be disposed not only in the emission areas EMA, but also in the subareas SA beyond the bank layer BNL. The first connecting electrodes CNE1 and the second connecting electrodes CNE2 may be in contact with the light-emitting elements ED and may be electrically connected to the electrodes RME or the underlying conductive layers.

The structure of the display device 10 will hereinafter be described in further detail.

Figure 6:
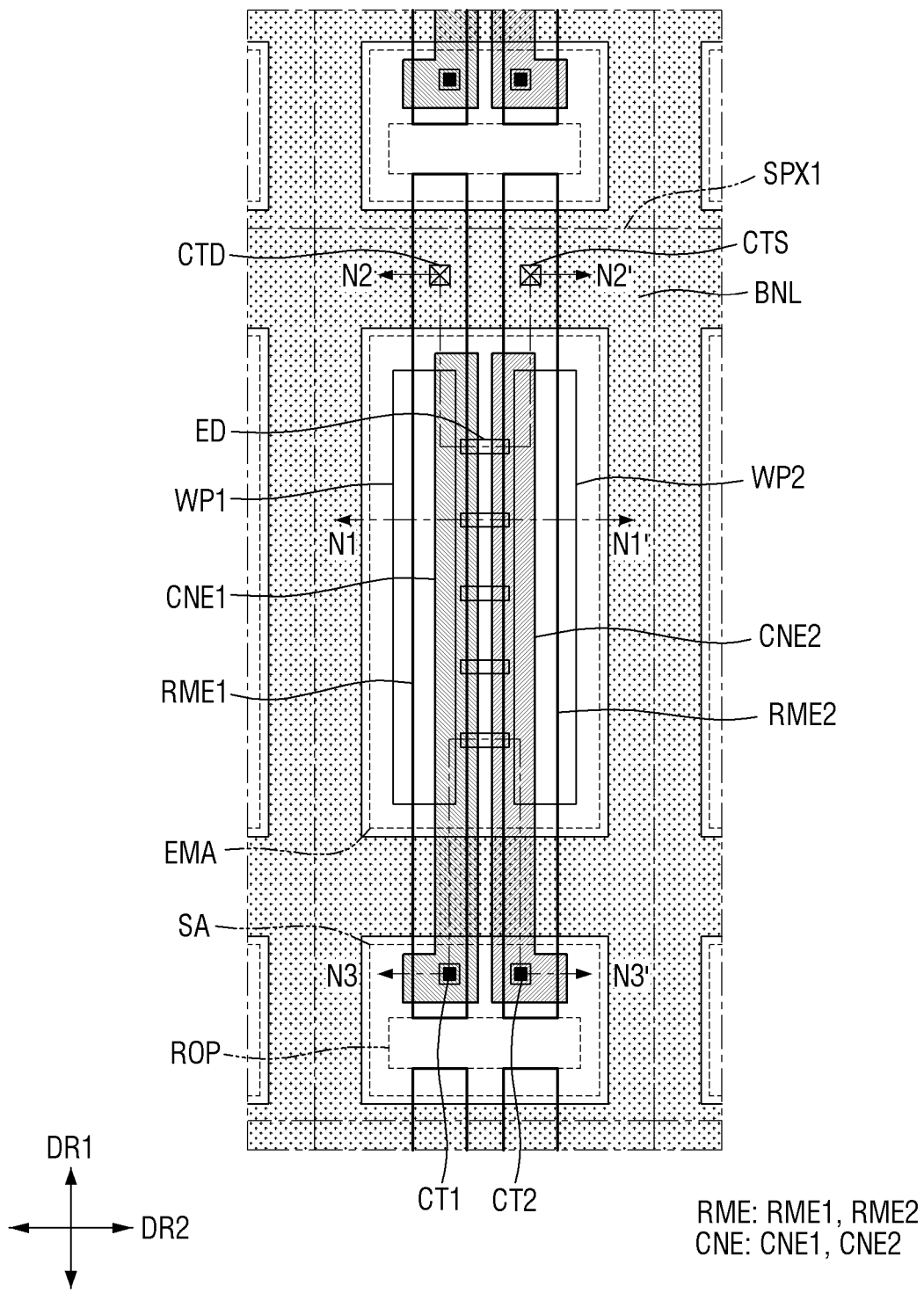
FIG. 6 is a schematic plan view of a first subpixel of FIG. 3.
Figure 7:
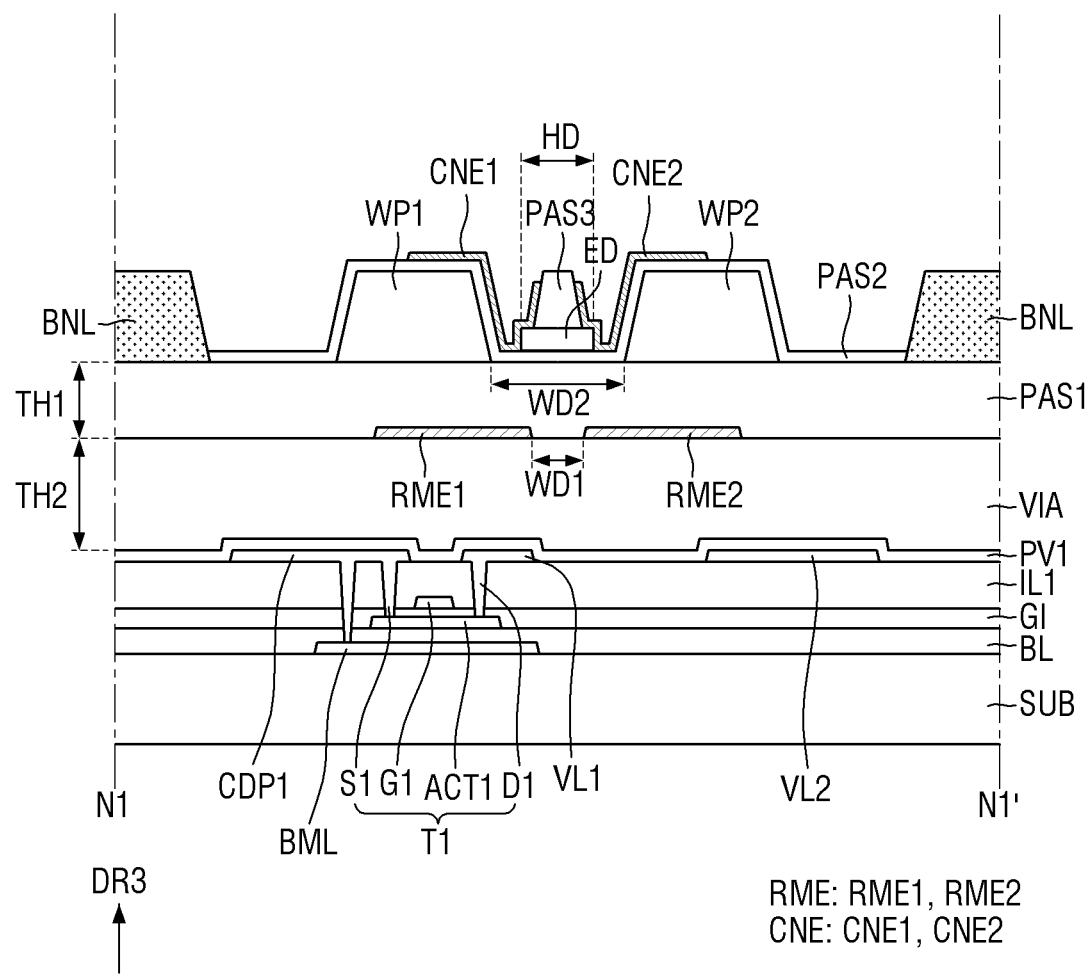
FIG. 7 is a schematic cross-sectional view taken along line N1-N1' of FIG. 6.
Figure 8:
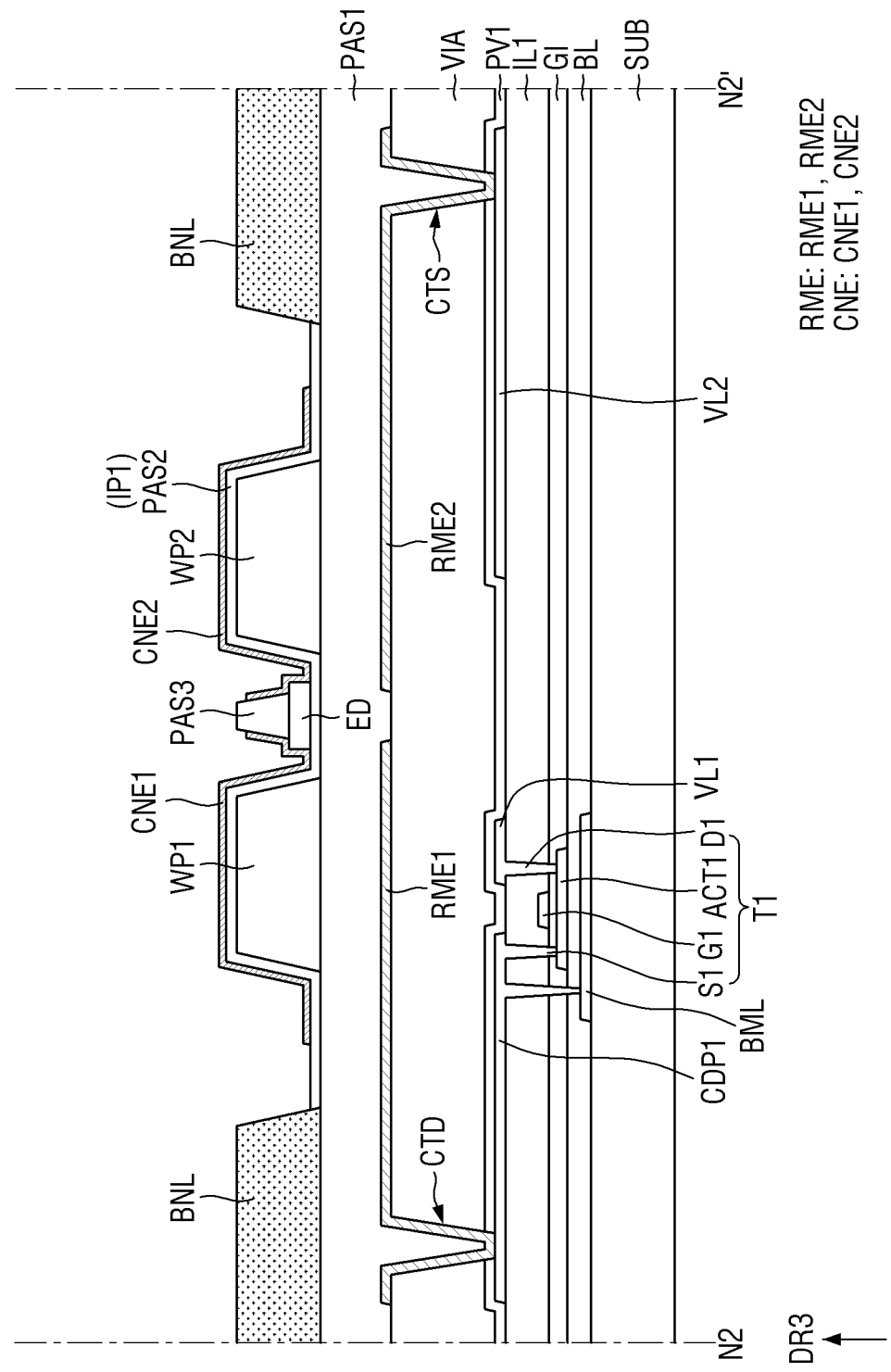
FIG. 8 is a schematic cross-sectional view taken along line N2-N2' of FIG. 6.
Figure 9:
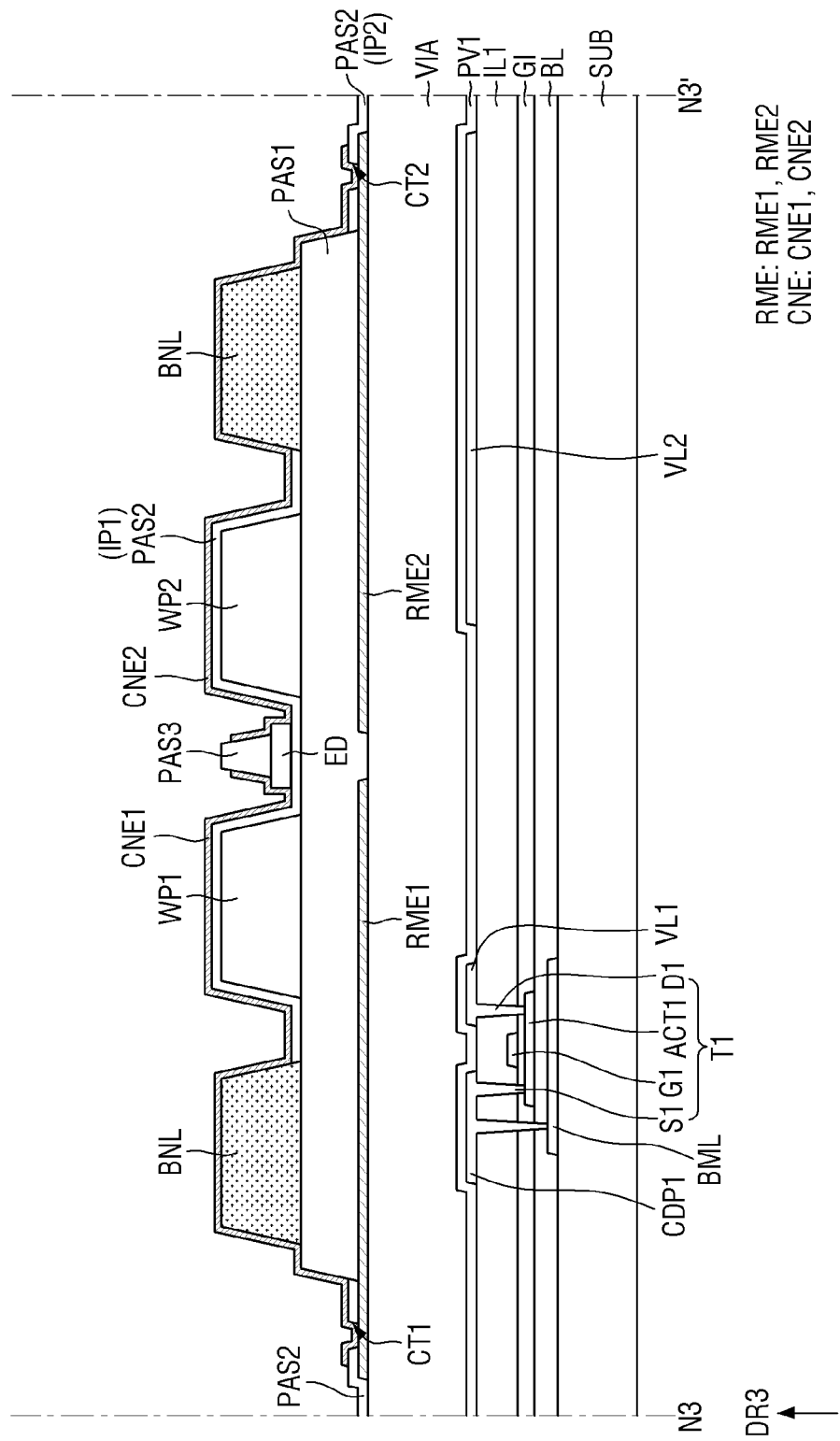
FIG. 9 is a schematic cross-sectional view taken along line N3-N3' of FIG. 6.

FIG. 6 is a schematic plan view of the first subpixel of FIG. 3. FIG. 7 is a schematic cross-sectional view taken along line N1-N1' of FIG. 6. FIG. 8 is a schematic cross-sectional view taken along line N2-N2' of FIG. 6. FIG. 9 is a schematic cross-sectional view taken along line N3-N3' of FIG. 6. FIG. 7 illustrates a schematic cross-sectional view taken across both end portions of a light-emitting element ED disposed in the first subpixel SPX1. FIG. 8 illustrates a schematic cross-sectional view taken across a light-emitting element ED and contact holes (CTD and CTS) of FIG. 6, and FIG. 9 illustrates a schematic cross-sectional view taken across a light-emitting element ED and contacts (CT1 and CT2) of FIG. 6.

Referring to FIGS. 6 through 9 and further to FIGS. 3 through 5, the display device 10 may include, in the first subpixel SPX1, a first substrate SUB and may further include a semiconductor layer, conductive layers, and insulating layers, which are disposed on the first substrate SUB. The semiconductor layer, the conductive layers, and the insulating layers may form a circuit layer and a display element layer of the display device 10.

The first substrate SUB may be an insulating substrate. The first substrate SUB may be formed of an insulating material such as glass, quartz, or a polymer resin. The first substrate SUB may be a rigid substrate or may be a flexible substrate that may be bendable, foldable, or rollable. The first substrate SUB may include a display area DPA and a non-display area NDA, which surrounds (or may be adjacent to) the display area DPA, and the display area DPA may include an emission area EMA and a subarea SA, which is part of a non-emission area.

A first conductive layer may be disposed on the first substrate SUB. The first conductive layer may include a lower metal layer BML, and the lower metal layer BML may be disposed to overlap an active layer ACT1 of a first transistor T1. The lower metal layer BML may include a material that blocks the transmission of light and may prevent light from being incident upon the active layer ACT1 of the first transistor T1. The lower metal layer BML may not be provided.

A buffer layer BL may be disposed on the lower metal layer BML and the first substrate SUB. The buffer layer BL may be formed on the first substrate SUB to protect the transistors of the first subpixel SPX1 from moisture that may penetrate through the first substrate SUB, which is vulnerable to moisture, and may perform a surface planarization function.

The semiconductor layer is disposed on the buffer layer BL. The semiconductor layer may include the active layer ACT1 of the first transistor T1. The active layer ACT1 of the first transistor T1 may be disposed to partially overlap a gate electrode G1 in a second conductive layer that will be described later.

The semiconductor layer may include polycrystalline silicon, monocrystalline silicon, or an oxide semiconductor. For example, the semiconductor layer may include polycrystalline silicon. The oxide semiconductor may be an oxide semiconductor containing indium (In). In one example, the oxide semiconductor may be at least one of indium tin oxide (ITO), indium zinc oxide (IZO), indium gallium oxide (IGO), indium zin tin oxide (IZTO), indium gallium tin oxide (IGTO), or indium gallium zinc tin oxide (IGZTO).

FIGS. 6 through 9 illustrate that the first subpixel SPX1 may include only one transistor, for example, the first transistor T1, but the disclosure is not limited thereto. For example, the first subpixel SPX1 may include more than one transistor.

A first gate insulating layer GI is disposed on the semiconductor layer and the buffer layer BL. The first gate insulating layer GI may function as a gate insulating film for the first transistor T1.

The second conductive layer is disposed on the first gate insulating layer GI. The second conductive layer may include a gate electrode G1 of the first transistor T1. The gate electrode G1 may be disposed to overlap the channel region of the active layer ACT1 in the thickness direction, for example, in a third direction DR3.

A first interlayer insulating layer IL1 is disposed on the second conductive layer. The first interlayer insulating layer IL1 may function as an insulating film between the second conductive layer and layers disposed on the second conductive layer and may protect the second conductive layer.

A third conductive layer is disposed on the first interlayer insulating layer IL1. The third conductive layer may include first and second voltage lines VL1 and VL2, which are disposed in the display area DPA, and a conductive pattern CDP1.

A high-potential voltage (or a first power supply voltage) to be delivered to a first electrode RME1 may be applied to the first voltage line VL1, and a low-potential voltage (or a second power supply voltage) to be delivered to a second electrode RME2 may be applied to the second voltage line VL2. Part of the first voltage line VL1 may be in contact with the active layer ACT1 of the first transistor T1 through a contact hole that penetrates the first interlayer insulating layer IL1 and the first gate insulating layer GI. The first voltage line VL1 may function as a first drain electrode D1 of the first transistor T1.

The conductive pattern CDP1 may be in contact with the active layer ACT1 of the first transistor T1 through a contact hole that penetrates the first interlayer insulating layer IL1 and the first gate insulating layer GI. Also, the conductive pattern CDP1 may be in contact with the lower metal layer BML through another contact hole. The conductive pattern CDP1 may function as a first source electrode Si of the first transistor T1. The conductive pattern CDP1 may be connected to the first electrode RME1 or a first connecting electrode CNE1 that will be described later. The first transistor T1 may transmit the first power supply voltage from the first voltage line VL1 to the first electrode RME1 or the first connecting electrode CNE1.

A first passivation layer PV1 is disposed on the third conductive layer. The first passivation layer PV1 may function as an insulating film between the third conductive layer and other layers and protect the third conductive layer.

Each of the buffer layer BL, the first gate insulating layer G, the first interlayer insulating layer IL1, and the first passivation layer PV1 may consist of inorganic layers that may be alternately stacked each other. In one example, each of the buffer layer BL, the first gate insulating layer G, the first interlayer insulating layer IL1, and the first passivation layer PV1 may be formed as a double- or multilayer in which inorganic layers of at least one of silicon oxide ($SiO_x$), silicon nitride ($SiN_x$), and silicon oxynitride ($SiO_xN_y$) may be alternately stacked each other, but the disclosure is not limited thereto. In another example, each of the buffer layer BL, the first gate insulating layer G, the first interlayer insulating layer IL1, and the first passivation layer PV1 may be formed as a single inorganic layer including silicon oxide ($SiO_x$), silicon nitride ($SiN_x$), or silicon oxynitride ($SiO_xN_y$). Also, in an embodiment, the first interlayer insulating layer IL1 may be formed of an organic insulating material such as polyimide (PI).

The second and third conductive layers may be formed as single layers or multilayers including molybdenum (Mo), aluminum (Al), chromium (Cr), gold (Au), titanium (T1), nickel (Ni), neodymium (Nd), copper (Cu), or an alloy thereof, but the disclosure is not limited thereto.

A via layer VIA is disposed on the third conductive layer, in the display area DPA. The via layer VIA may include an organic insulating material such as, for example, PI, and may perform a surface planarization function by compensating for any height differences generated by the underlying conductive layers. In an embodiment, the via layer VIA may not be provided.

Electrodes RME, for example, the first and second electrodes RME1 and RME2, may be disposed on the first passivation layer PV1 or the via layer VIA. In a case where the display device 10 may include the via layer VIA, the electrodes RME may be disposed on or directly disposed on the via layer VIA. In a case where the display device 10 does not include the via layer VIA, the electrodes RME may not be disposed on or directly disposed on the first passivation layer PV1.

The first and second electrodes RME1 and RME2 may be spaced apart from each other in the second direction DR2. Parts of the first and second electrodes RME1 and RME2 in the emission area EMA may be covered or overlapped by a first insulating layer PAS1, and parts of the first and second electrodes RME1 and RME2 in the subarea SA may be covered or overlapped by a second insulating layer PAS2.

The electrodes RME may be in direct contact with the third conductive layer through the contact holes (CTD and CTS) in areas where the electrodes RME overlap the bank layer BNL, between the emission area EMA and the subarea SA. A first contact hole CTD may be formed in a region where the bank layer BNL and the first electrode RME1 overlap each other, and a second contact hole CTS may be formed in a region where the bank layer BNL and the second electrode RME2 overlap each other. The first electrode RME1 may be in contact with the conductive pattern CDP1 through the first contact hole CTD, which penetrates the via layer VIA and the first passivation layer PV1. The second electrode RME2 may be in contact with the second voltage line VL2 through the second contact hole CTS, which penetrates the via layer VIA and the first passivation layer PV1. The first electrode RME1 may be electrically connected to the first transistor T1 through the conductive pattern CDP1 and may thus receive the first power supply voltage, and the second electrode RME2 may be electrically connected to the second voltage line VL2 and may thus receive the second power supply voltage. However, the disclosure is not limited to this. For example, the electrodes RME may not be electrically connected to the first and second voltage lines VL1 and VL2 of the third conductive layer.

The electrodes RME may include a conductive material with high reflectance. For example, the electrodes RME may include a metal such as silver (Ag), Cu, or Al, an alloy containing Al, Ni, or lanthanum (La), or a stack of the alloy and a layer of a metal such as Ti, Mo, or niobium (Nb). In an embodiment, the electrodes RME may be formed as double- or multilayers in which at least one layer or a layer of an alloy containing Al and at least one layer or a layer of a metal such as Ti, Mo, or Nb may be stacked each other.

However, the disclosure is not limited to this. For example, the electrodes RME may further include a transparent conductive material. For example, the electrodes RME may include a material such as ITO, IZO, or ITZO. In an embodiment, the electrodes RME and dummy patterns DP may have a structure in which at least one layer or a layer of a transparent conductive material and at least one layer or a layer of a metal with high reflectance may be stacked each other or may be formed as single-layer films including the transparent conductive material and the metal with high reflectance. For example, the electrodes RME may have a stack structure such as ITO/Ag/ITO/, ITO/Ag/IZO, or ITO/Ag/ITZO/IZO. The electrodes RME may be electrically connected to the light-emitting elements ED and may reflect light some of the light, emitted from the light-emitting elements ED, in an upward direction from the first substrate SUB.

The first insulating layer PAS1 may be disposed to cover or overlap the electrodes RME, on the first passivation layer PV1 or the via layer VIA. The first insulating layer PAS1 may be disposed in the emission area EMA and may be placed on or directly placed on parts of the electrodes RME in the emission area EMA. As already mentioned above, the first insulating layer PAS1 may not be disposed in the subarea SA, and the second insulating layer PAS2 may be disposed on or directly disposed on parts of the electrodes RME in the subarea SA. The first insulating layer PAS1 may protect the electrodes RME and may insulate the electrodes RME from each other. For example, as the first insulating layer PAS1 is disposed to cover or overlap the electrodes RME, before the formation of the bank layer BNL, the first insulating layer PAS1 can prevent the electrodes RME from being damaged during the formation of the bank layer BNL. Also, the first insulating layer PAS1 can prevent the light-emitting elements ED from being in direct contact with, and damaged by, other members.

For example, the first insulating layer PAS1 may include an organic insulating material. The first insulating layer PAS1 may cover or overlap and protect the electrodes RME and may form a flat surface in the emission area EMA by compensating for height differences formed by the electrodes RME. Even if layers are disposed on the first insulating layer PAS1 to overlap the electrodes RME, the top surfaces of the layers may be formed to be flat. For example, the top surface of the second insulating layer PAS2, which is disposed on the first insulating layer PAS1, may be disposed to be flat at least between wall patterns (WP1 and WP2). The light-emitting elements ED, which are disposed between the wall patterns (WP1 and WP2), may be disposed on a flat top surface of the second insulating layer PAS2 and may be prevented from being arranged (or disposed) at an inclination due to the height differences formed by the electrodes RME.

The wall patterns (WP1 and WP2) may be disposed on the first insulating layer PAS1. For example, the wall patterns (WP1 and WP2) may be disposed on or directly disposed on the first insulating layer PAS1 and may overlap the lower electrodes RME below the first insulating layer PAS1 in the third direction DR3, which is the thickness direction. A first wall pattern WP1 may overlap the first electrode RME1 in the thickness direction, and the second wall pattern WP2 may overlap the second electrode RME2 in the thickness direction.

At least parts of the wall patterns (WP1 and WP2) may protrude from the top surface of the first insulating layer PAS1. Protruding parts of the wall patterns (WP1 and WP2) may have inclined or curved side surfaces. For example, the wall patterns (WP1 and WP2) may have a semicircular or semielliptical shape in a schematic cross-sectional view. The walls (WP1 and WP2) may include an organic insulating material such as PI, but the disclosure is not limited thereto.

The bank layer BNL may be disposed on the first insulating layer PAS1. The bank layer BNL may include parts extending in the first direction DR1 and parts extending in the second direction DR2 and may surround the first subpixel SPX1. The bank layer BNL may be disposed along the boundaries of the display area DPA to separate the display area DPA and the non-display area NDA. The bank layer BNL may be disposed in the entire display area DPA to form a lattice shape, and parts of the display area DPA that are opened by the bank layer BNL may include the emission area EMA and the subarea SA.

The bank layer BNL, like the wall patterns (WP1 and WP2), may have a height. In an embodiment, the height of the bank layer BNL may be greater than the height of the wall patterns (WP1 and WP2), and the thickness of the bank layer BNL may be the same as, or greater than, the thickness of the wall patterns (WP1 and WP2). The bank layer BNL may prevent ink from spilling into other neighboring subpixels SPXn in an inkjet printing process during the fabrication of the display device 10. The bank layer BNL, like the wall patterns (WP1 and WP2), may include an organic insulating material such as PI.

The second insulating layer PAS2 may be disposed on the first insulating layer PAS1. The second insulating layer PAS2 may include first and second insulating patterns IP1 and IP2, which are disposed in the emission area EMA and the subarea SA, respectively, surrounded by the bank layer BNL. The first insulating pattern IP1 may be disposed to overlap the electrodes RME and the wall patterns (WP1 and WP2), in the emission area EMA. The second insulating pattern IP2 may be disposed to cover or overlap the entire subarea SA except for a separation part ROP and the contacts (CT1 and CT2). Parts of the electrodes RME in the emission area EMA may be covered or overlapped not by the first insulating layer PAS1, but by the second insulating layer PAS2, and may be partially exposed depending on the locations of the contacts (CT1 and CT2). The first insulating pattern IP1 may completely cover or overlap the top surface of the first insulating layer PAS1, in the emission area EMA, but the second insulating pattern IP2 may not be disposed in the separation part ROP. Thus, the top surface of the via layer VIA or the first passivation layer PV1 may be exposed, and parts of the top surfaces of the electrodes RME may be exposed through the contacts (CT1 and CT2).

The second insulating layer PAS2 may be formed after the arrangement of the wall patterns (WP1 and WP2) and the bank layer BNL, and the first insulating pattern IP1 of the second insulating layer PAS2 may be disposed on or directly disposed on the wall patterns (WP1 and WP2), in the emission area EMA. The first insulating pattern IP1 may be disposed not to overlap the bank layer BNL, and the top surface of the bank layer BNL may be exposed.

However, the layout of the second insulating layer PAS2, the wall patterns (WP1 and WP2), and the bank layer BNL is not particularly limited. For example, in an embodiment where the second insulating layer PAS2 is formed before the formation of the bank layer BNL and the wall patterns (WP1 and WP2), the second insulating layer PAS2 may be disposed on or directly disposed on the first insulating layer PAS1, and the wall patterns (WP1 and WP2) and the bank layer BNL may be disposed on or directly disposed on the second insulating layer PAS2. The bank layer BNL and the first insulating pattern IP1 of the second insulating layer PAS2 may overlap the bank layer BNL in the thickness direction.

The first insulating layer PAS1 may include an organic insulating material, and the second insulating layer PAS2 may include an inorganic insulating material. The second insulating layer PAS2 may be disposed on or directly disposed on a flat top surface formed by the first insulating layer PAS1 and may have a flat top surface between the wall patterns (WP1 and WP2). The light-emitting elements ED, which are disposed between the wall patterns (WP1 and WP2), may be arranged (or disposed) on the flat top surface of the second insulating layer PAS2 without being inclined.

The second insulating layer PAS2 may have a hydrophilic property, and the bank layer BNL may have a hydrophobic property. For example, the second insulating layer PAS2 may include an inorganic insulating material, and the top surface of the second insulating layer PAS2 may be hydrophilically treated. For example, the bank layer BNL may include an organic insulating material, and the top surface of the bank layer BNL may be hydrophobically treated. The arrangement of the light-emitting elements ED may be performed by inkjet printing. The light-emitting elements ED may be prepared in a state of being dispersed in ink and may be ejected onto the electrodes RME in a region in the first subpixel SPX1, surrounded by the bank layer BNL. In an embodiment where the light-emitting elements ED are printed using hydrophilic ink, ink ejected onto the second insulating layer PAS2, which has a hydrophilic property, and ink ejected onto the bank layer BNL, which has a hydrophobic property, may be seated in the emission area EMA surrounded by the bank layer BNL. As a result, the ink can be prevented from spilling over the bank layer BNL from the emission area EMA and can reduce the loss of light-emitting elements ED during the fabrication of the display device 10.

The light-emitting elements ED may be disposed on the second insulating layer PAS2. The light-emitting elements ED may extend in one direction or in a direction, and the direction in which the light-emitting elements ED extend may be parallel to the top surface of the first substrate SUB. As will be described later, each of the light-emitting elements ED may include multiple semiconductor layers that are arranged (or disposed) in the direction in which the light-emitting elements ED extend, and the multiple semiconductor layers may be sequentially arranged (or disposed) in a direction parallel to the top surface of the first substrate SUB. However, the disclosure is not limited to this. For example, the multiple semiconductor layers may be arranged (or disposed) in a direction perpendicular to the first substrate SUB.

The light-emitting elements ED may include different materials for their semiconductor layers in different subpixels SPXn and may thus emit light of different wavelength ranges in the different subpixels SPXn, but the disclosure is not limited thereto. For example, the light-emitting elements ED may include a same material or a similar material for their semiconductor layers, even in different subpixels SPXn, and may thus emit light of a same color in the different subpixels SPXn.

The light-emitting elements ED may be disposed on the second insulating layer PAS2 between the wall patterns (WP1 and WP2). The light-emitting elements ED may be disposed on or directly disposed on the second insulating layer PAS2 and may partially overlap the electrodes RME below the first insulating layer PAS1, between the wall patterns (WP1 and WP2).

A region between the first and second wall patterns WP1 and WP2 may overlap a region between the first and second electrodes RME1 and RME2 in the thickness direction. As the locations and the alignment directions of the light-emitting elements ED, which are disposed between the wall patterns (WP1 and WP2), are changing due to an electric field formed by the electrodes RME, the light-emitting elements ED may be placed on the second insulating layer PAS2 and may eventually be disposed between the wall patterns (WP1 and WP2) by the electric field formed by the electrodes RME, because the region between the wall patterns (WP1 and WP2) overlaps the region between the electrodes RME.

A first distance WD1 between the electrodes RME may be less than a second distance WD2 between the wall patterns (WP1 and WP2), and a length HD of the light-emitting elements ED may be greater than the first distance WD1, but less than the second distance WD2. The light-emitting elements ED may be disposed between the wall patterns (WP1 and WP2) such that at least one end portion of each of the light-emitting elements ED may be placed on one of the electrodes RME, or that both end portions of each of the light-emitting elements ED may be placed on different electrodes RME. First end portions of the light-emitting elements ED may be disposed to overlap the first electrode RME1, and second end portions of the light-emitting elements ED may be disposed to overlap the second electrode RME2. However, the disclosure is not limited to this. For example, the light-emitting elements ED may be disposed close to one of the wall patterns (WP1 and WP2), and only one end portion of each of the light-emitting elements ED may overlap the electrodes RME.

The light-emitting elements ED may be disposed on or directly disposed on the second insulating layer PAS2, which forms a flat top surface on the first insulating layer PAS1. The light-emitting elements ED may be disposed on the flat top surfaces of the first and second insulating layers PAS1 and PAS2, regardless of whether both end portions or only one end portion of each of the light-emitting elements ED overlaps the electrodes RME. Part of the second insulating layer PAS2 where the light-emitting elements ED are disposed may have a flat top surface regardless of height differences formed by the electrodes RME. Even though the light-emitting elements ED are disposed to overlap the electrodes RME, the light-emitting elements ED may be properly arranged (or disposed) on the second insulating layer PAS2 without being inclined, regardless of the height differences formed by the electrodes RME. As a result, the degrees of alignment and deflection of the light-emitting elements ED can be improved, and any connection defects between the light-emitting elements ED and connecting electrodes CNE can be prevented regardless of any underlying height differences.

As described above, the light-emitting elements ED may be disposed on the second insulating layer PAS2 by the electric field formed by the electrodes RME. The first insulating layer PAS1, which is disposed between the electrodes RME and the second insulating layer PAS2, may planarize the top surface of the via layer VIA and may have a relatively small thickness. The first insulating layer PAS1 and the via layer VIA may both include an organic insulating material, and a first thickness TH1 of the first insulating layer PAS1 may be less than a second thickness TH2 of the via layer VIA. For example, the first thickness TH1 may be 0.3 to 0.5 times the second thickness TH2. Even though the first and second insulating layers PAS1 and PAS2 are disposed on the electrodes RME, the electric field formed by the electrodes RME may align the light-emitting elements ED between the wall patterns (WP1 and WP2).

A third insulating layer PAS3 may be disposed on the light-emitting elements ED. The third insulating layer PAS3 may extend in the first direction DR1 between the wall patterns (WP1 and WP2) and may be disposed to surround parts of outer surfaces of the light-emitting elements ED. The third insulating layer PAS3 may be disposed not to cover or overlap both ends or end portions of each of the light-emitting elements ED, and both ends or end portions of each of the light-emitting elements ED may be in contact with the connecting electrodes CNE. The third insulating layer PAS3 may protect and fix the light-emitting elements ED during the fabrication of the display device 10.

The connecting electrodes CNE, for example, the first connecting electrode CNE1 and a second connecting electrode CNE2, may be disposed on the electrodes RME and the wall patterns (WP1 and WP2). The connecting electrodes CNE may be in contact with the light-emitting elements ED and may be electrically connected to the third conductive layer.

For example, the first and second connecting electrodes CNE1 and CNE2 may be disposed on side surfaces of the third insulating layer PAS3 and may be in contact with the light-emitting elements ED. The first connecting electrode CNE1 may partially overlap the first electrode RME1 and may be in contact with the first end portions of the light-emitting elements ED. The second connecting electrode CNE2 may partially overlap the second electrode RME2 and may be in contact with the second end portions of the light-emitting elements ED. The connecting electrodes CNE may be disposed not only in the emission area EMA, but also in the subarea SA beyond the emission area EMA. The connecting electrodes CNE may be in contact with the light-emitting elements ED, in the emission area EMA, and may be electrically connected to the third conductive layer, in the subarea SA.

The display device 10 may be in contact with the electrodes RME through the contacts (CT1 and CT2), which are disposed in the subarea SA. The first connecting electrode CNE1 may be in contact with the first electrode RME1 through a first contact CT1, which penetrates the second insulating pattern IP2 of the second insulating layer PAS2, in the subarea SA. The second connecting electrode CNE2 may be in contact with the second electrode RME2 through a second contact CT2, which penetrates the second insulating pattern IP2 of the second insulating layer PAS2, in the subarea SA. The connecting electrodes CNE may be electrically connected to the third conductive layer through the electrodes RME below the second insulating layer PAS2. The first connecting electrode CNE1 may be electrically connected to the first transistor T1 and may thus receive the first power supply voltage, and the second connecting electrode CNE2 may be electrically connected to the second voltage line VL2 and may thus receive the second power supply voltage. The connecting electrodes CNE may be in contact with the light-emitting elements ED, in the emission area EMA, to transmit the first and second power supply voltages to the light-emitting elements ED.

However, the disclosure is not limited to this. For example, the connecting electrodes CNE may be in direct contact with the third conductive layer and may be electrically connected to the third conductive layer through patterns other than the electrodes RME.

The connecting electrodes CNE may include a conductive material. For example, the connecting electrodes CNE may include ITO, IZO, ITZO, or Al. For example, the connecting electrode CNE may include a transparent conductive material so that light emitted from the light-emitting elements ED may be output through the connecting electrodes CNE.

The second and third insulating layers PAS2 and PAS3 may include an inorganic insulating material or an organic insulating material. For example, the second insulating layer PAS2 may include an inorganic insulating material, and the third insulating layer PAS3 may include an organic insulating material. However, the disclosure is not limited to this example. In another example, the second insulating layer PAS2 and/or the third insulating layer PAS3 may be formed in a structure where multiple insulating layers may be alternately or repeatedly stacked each other.

Figure 10:
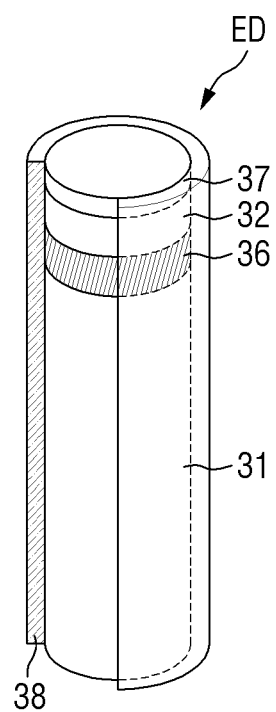
FIG. 10 is a schematic perspective view of a light-emitting element according to an embodiment.

FIG. 10 is a schematic perspective view of a light-emitting element according to an embodiment.

Referring to FIG. 10, a light-emitting element ED may be a light-emitting diode (LED), for example, an ILED having a size of several nanometers or micrometers and formed of an inorganic material. If an electric field is formed in a particular or given direction between two opposite electrodes, the light-emitting element ED may be aligned between the two electrodes where polarities are formed.

The light-emitting element ED may have a shape that extends in one direction or in a direction. The light-emitting element ED may have the shape of a cylinder, a rod, a wire, or a tube, but the shape of the light-emitting element ED is not particularly limited. For example, the light-emitting element ED may have the shape of a polygonal column such as a regular cube, a rectangular parallelepiped, or a hexagonal column or may have a shape that extends in one direction or in a direction but with a partially inclined outer surface.

The light-emitting element ED may include semiconductor layers doped with a dopant of an arbitrary conductivity type (for example, a p type or an n type). The semiconductor layers may receive electric signals from an external power source to emit light of a particular or given wavelength range. The light-emitting element ED may include a first semiconductor layer 31, a second semiconductor layer 32, the light-emitting layer 36, an electrode layer 37, and the insulating film 38.

The first semiconductor layer 31 may include an n-type semiconductor. The first semiconductor layer 31 may include a semiconductor material, for example, $Al_xGa_yIn_{1-x-y}N$ (where $0 \leq x \leq 1$, $0 \leq y \leq 1$, and $0 \leq x+y \leq 1$). In one example, the first semiconductor layer 31 may include at least one of AlGaInN, GaN, AlGaN, InGaN, AlN, and InN that are doped with an n-type dopant. The n-type dopant may be Si, Ge, or Sn.

The second semiconductor layer 32 may be disposed on the first semiconductor layer 31 with the light-emitting layer 36 interposed therebetween. The second semiconductor layer 32 may include a p-type semiconductor. The second semiconductor layer 32 may include a semiconductor material, for example, $Al_xGa_yIn_{1-x-y}N$ (where 0≤x≤1, 0≤y≤1, and 0≤x+y≤1). In one example, the second semiconductor layer 32 may include at least one of AlGaInN, GaN, AlGaN, InGaN, AlN, and InN that are doped with a p-type dopant. The p-type dopant may be Mg, Zn, Ca, Se, or Ba.

FIG. 10 illustrates that the first and second semiconductor layers 31 and 32 are formed as single layers, but the disclosure is not limited thereto. For example, each of the first and second semiconductor layers 31 and 32 may include more than one layer such as, for example, a clad layer or a tensile strain barrier reducing (TSBR) layer, depending on the material of the light-emitting layer 36.

The light-emitting layer 36 may be disposed between the first and second semiconductor layers 31 and 32. The light-emitting layer 36 may include a single- or multi-quantum well structure material. In a case where the light-emitting layer 36 may include a material having a multi-quantum well structure, the light-emitting layer 36 may have a structure in which multiple quantum layers and multiple well layers may be alternately stacked each other. The light-emitting layer 36 may emit light by combining electron-hole pairs in accordance with electric signals applied thereto via the first and second semiconductor layers 31 and 32. The light-emitting layer 36 may include a material such as AlGaN or AlGaInN. In case that the light-emitting layer 36 has a multi-quantum well structure in which multiple quantum layers and multiple well layers may be alternately stacked each other, the quantum layers may include a material such as AlGaN or AlGaInN, and the well layers may include a material such as GaN or AlInN.

The light-emitting layer 36 may have a structure in which a semiconductor material having a large band gap energy and a semiconductor material having a small band gap energy may be alternately stacked each other or may include group-III or group-V semiconductor materials depending on the wavelength of light to be emitted. The type of light emitted by the light-emitting layer 36 is not particularly limited. The light-emitting layer 36 may emit light of a red or green wavelength range as necessary, instead of blue light.

The electrode layer 37 may be an ohmic connecting electrode, but the disclosure is not limited thereto. For example, the electrode layer 37 may be a Schottky connecting electrode. The light-emitting element ED may include at least one electrode layer 37. The light-emitting element ED may include more than one electrode layer 37, but the disclosure is not limited thereto. For example, the electrode layer 37 may not be provided.

The electrode layer 37 may reduce the resistance between the light-emitting element ED and electrodes RME or (connecting electrodes CNE) in case that the light-emitting element ED is electrically connected to the electrodes RME or (the connecting electrodes CNE). The electrode layer 37 may include a conductive metal. In one example, the electrode layer 37 may include at least one of Al, Ti, In, Au, Ag, ITO, IZO, and ITZO.

The insulating film 38 may be disposed to surround the first and second semiconductor layers 31 and 32 and the electrode layer 37. In one example, the insulating film 38 may be disposed to surround at least the light-emitting layer 36, but to expose both end portions, in the length direction, of the light-emitting element ED. The insulating film 38 may be formed to be rounded in a schematic cross-sectional view, in a region adjacent to at least one end of the light-emitting element ED.

The insulating film 38 may include a material with insulating properties such as, for example, silicon oxide ($SiO_x$), silicon nitride ($SiN_x$), silicon oxynitride ($SiO_xN_y$), aluminum nitride ($AlN_x$), or aluminum oxide ($AlO_x$). The insulating film 38 is illustrated as being a single-layer film, but the disclosure is not limited thereto. For example, in an embodiment, the insulating film 38 may be formed as a multilayer film in which multiple layers may be stacked each other.

The insulating film 38 may protect the first and second semiconductor layers 31 and 32 and the electrode layer 37. The insulating film 38 can prevent any short circuit that may occur in the light-emitting element 36 in case that the light-emitting element ED is in direct contact with electrodes to which electric signals are applied. Also, the insulating film 38 can prevent the degradation of the emission efficiency of the light-emitting element ED.

The outer surface of the insulating film 38 may be subjected to surface treatment. The light-emitting element ED may be sprayed on electrodes while being dispersed in ink. Here, the surface of the insulating film 38 may be hydrophobically or hydrophilically treated to keep the light-emitting element ED dispersed in ink without agglomerating with other neighboring light-emitting elements ED.

The fabrication of the display device 10 will hereinafter be described.

FIGS. 11 through 16 are schematic cross-sectional views illustrating a method of fabricating a display device according to an embodiment. FIGS. 11 through 16 illustrate schematic cross-sectional views of structures obtained in the process of forming layers in each subpixel SPXn of the semiconductor layer 10. For example, FIGS. 11 through 16 illustrate the order in which electrodes RME, insulating layers (PAS1, PAS2, and PAS3), wall patterns (WP1 and WP2), a bank layer BNL, light-emitting elements ED, and connecting electrodes CNE are formed, and the structures illustrated in FIGS. 11 through 16 may correspond to the structure illustrated in FIG. 7. The layers of the display device 10 may be formed by a patterning process. Thus, detailed descriptions of how to form the layers of the display device 10 will be omitted, and the order in which the layers of the display device 10 are formed will hereinafter be described.

Figure 11:
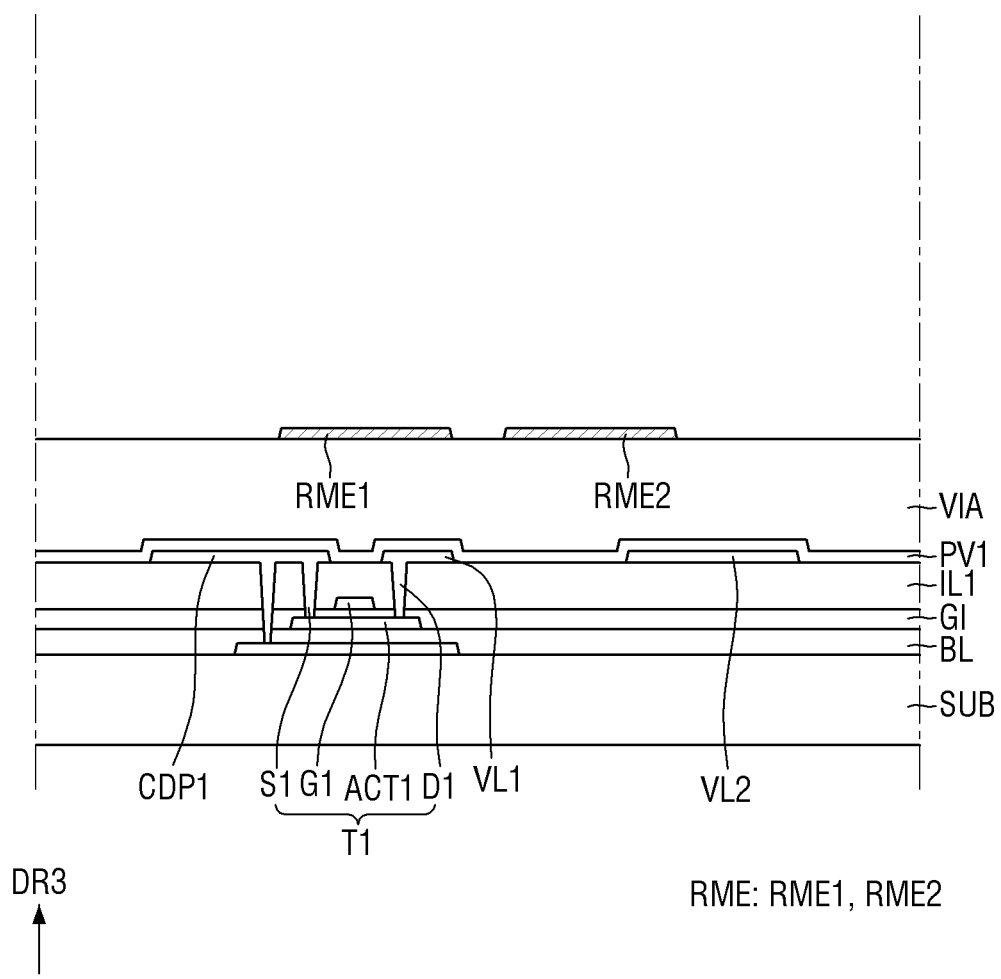
FIGS. 11 through 16 are schematic cross-sectional views illustrating a method of fabricating a display device according to an embodiment.

Referring to FIG. 11, the first substrate SUB is prepared, and first, second, and third conductive layers, a buffer layer BL, a first gate insulating layer GI, a first interlayer insulating layer IL1, a first passivation layer PV1, a via layer VIA, and electrodes RME are formed on the first substrate SUB. The first, second, and third conductive layers and the electrodes RME may be formed by depositing layers of their respective materials (for example, metallic materials) and patterning the layers using masks. The buffer layer BL, the first gate insulating layer GI, the first interlayer insulating layer IL1, and the via layer VIA may be formed on the first substrate SUB by applying layers of their respective materials (for example, insulating materials) and patterning the layers using masks.

Although not illustrated in FIG. 11, first and second electrode RME1 and RME2 may be in contact with the third conductive layer through contact holes (CTD and CTS), which penetrate the via layer VIA and the first passivation layer PV1, as illustrated in FIG. 8.

Figure 12:
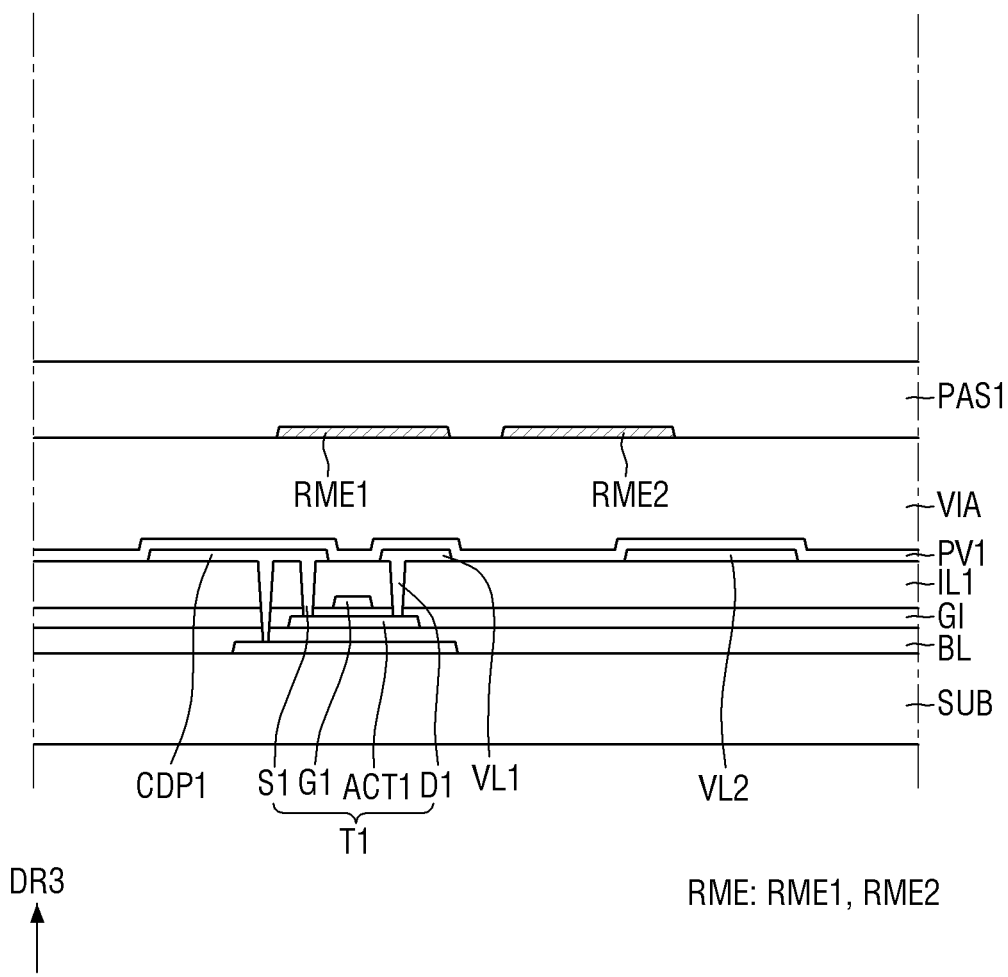

Thereafter, referring to FIG. 12, the first insulating layer PAS1 is formed on the via layer VIA and the electrodes RME. The first insulating layer PAS1 may include an organic insulating material and may be formed by a same process as the via layer VIA. The first insulating layer PAS1 may be disposed on part of the via layer VIA corresponding to an emission area EMA and may cover or overlap the top surfaces of parts of the electrodes RME in the emission area EMA.

Figure 13:
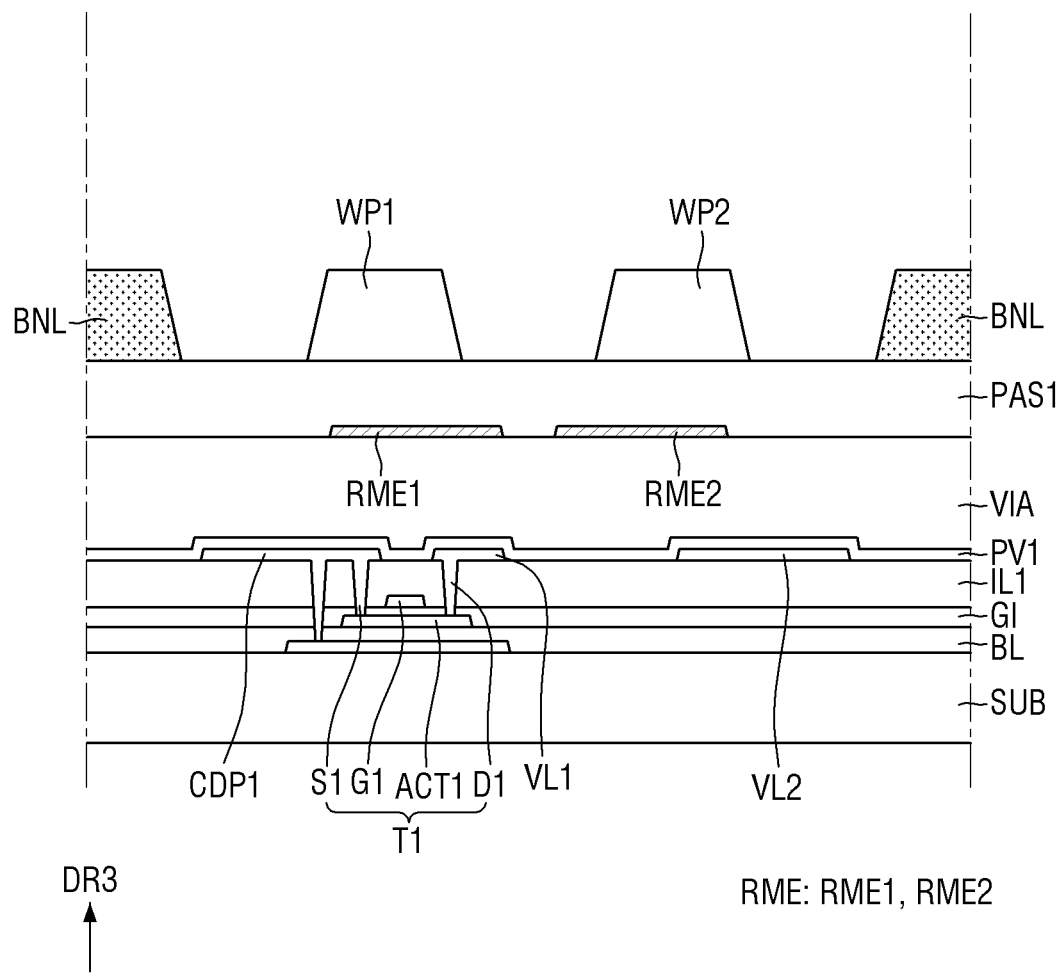
Figure 14:
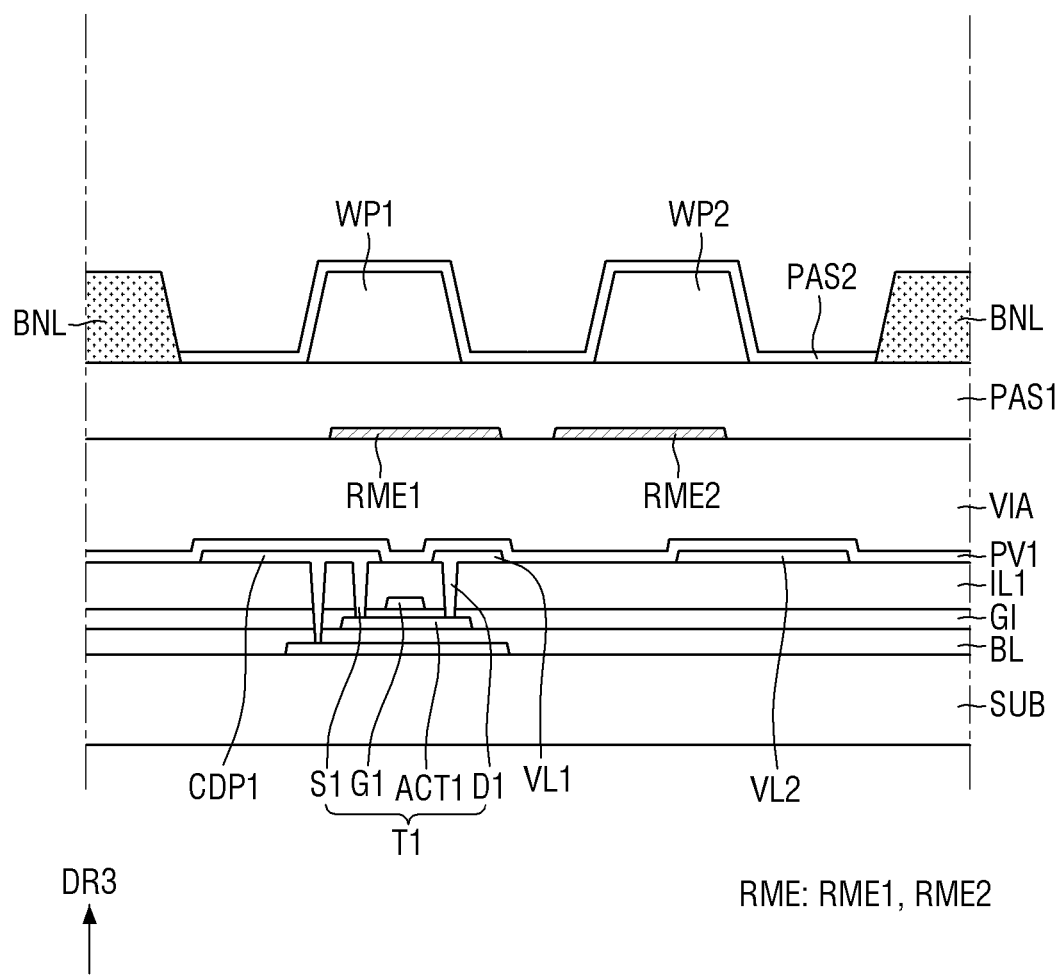

Thereafter, referring to FIGS. 13 and 14, the wall patterns (WP1 and WP2) and the bank layer BNL are formed on the first insulating layer PAS1, and the second insulating layer PAS2 may be disposed in an area surrounded by the bank layer BNL. The wall patterns (WP1 and WP2) and the bank layer BNL may be formed by a deposition process or by application and patterning processes. The order in which the wall patterns (WP1 and WP2) and the bank layer BNL are formed is not particularly limited. For example, the wall patterns (WP1 and WP2) and the bank layer BNL may be formed one after another or may be formed at a same time.

The second insulating layer PAS2 may be formed in the area surrounded by the bank layer BNL. The second insulating layer PAS2 may be formed by a deposition process or by application and patterning processes and may expose to expose the top surface of the bank layer BNL. For example, the second insulating layer PAS2 may initially be disposed on the entire surfaces of the first insulating layer PAS1 and the via layer VIA and may be patterned later to expose the top surface of the bank layer BNL. As illustrated in FIGS. 8 and 9, part of the second insulating layer PAS2 in the emission area EMA, for example, a first insulating pattern IP1, may be disposed to cover or overlap the wall patterns (WP1 and WP2), and part of the second insulating layer PAS2 in a subarea SA, for example, a second insulating pattern IP2, may be disposed to cover or overlap the electrodes RME because of the absence of the first insulating layer PAS1 in the subarea SA.

Although not specifically illustrated, in an embodiment, the second insulating layer PAS2 and the bank layer BNL may be further subjected to a surface treatment process. For example, the second insulating layer PAS2 may be hydrophilically surface-treated, and the bank layer BNL may be hydrophobically surface-treated. The surface treatment process may be performed on the second insulating layer PAS2 and the bank layer BNL directly after the formation of the bank layer BNL and the second insulating layer PAS2.

Figure 15:
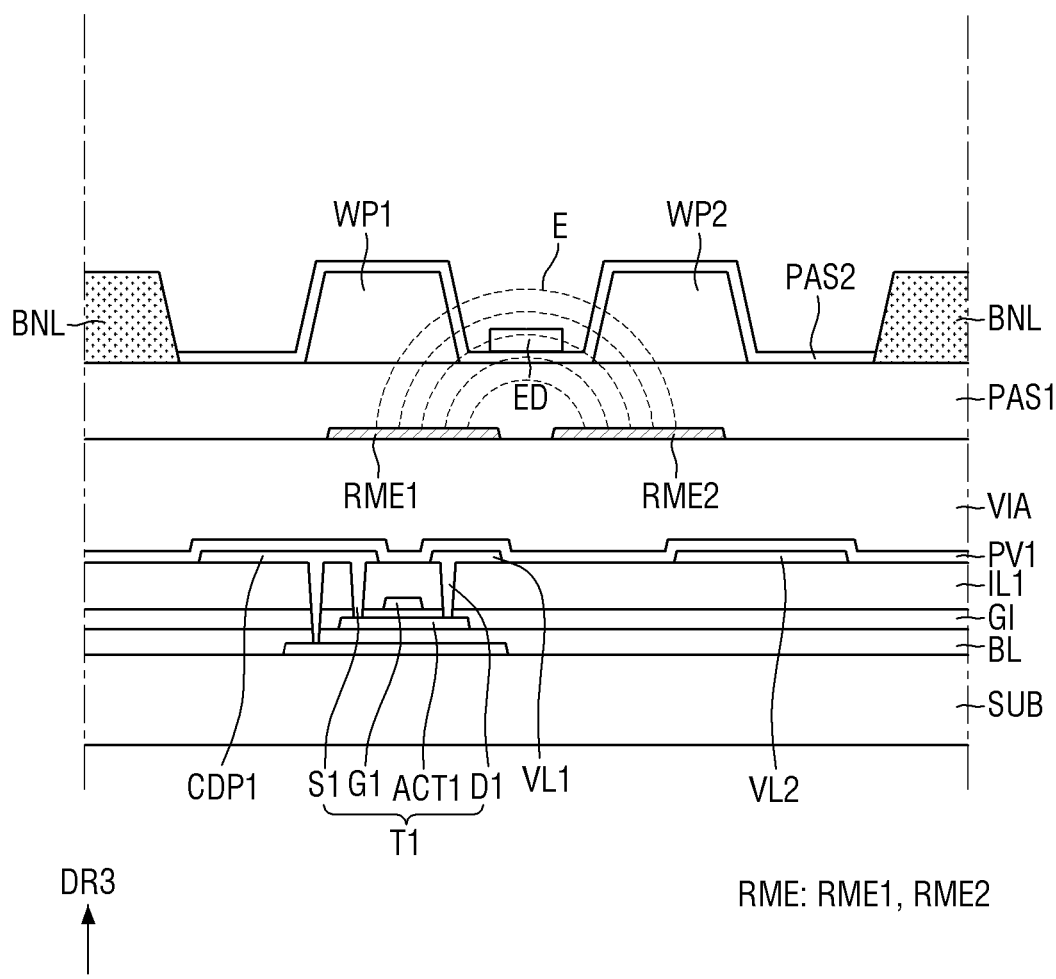

Thereafter, referring to FIG. 15, light-emitting elements ED are disposed on the second insulating layer PAS2, between the wall patterns (WP1 and WP2). Light-emitting elements ED may be disposed on the electrodes RME by an inkjet printing process. As ink having the light-emitting elements ED dispersed therein is sprayed into the area surrounded by the bank layer BNL and electrical signals are applied to the electrodes RME, an electric field E may be formed on the electrodes RME. As the locations and the alignment directions of the light-emitting elements ED included in the ink are changing, the light-emitting elements ED may be settled on the electrode RME, between the wall patterns (WP1 and WP2).

Figure 16:
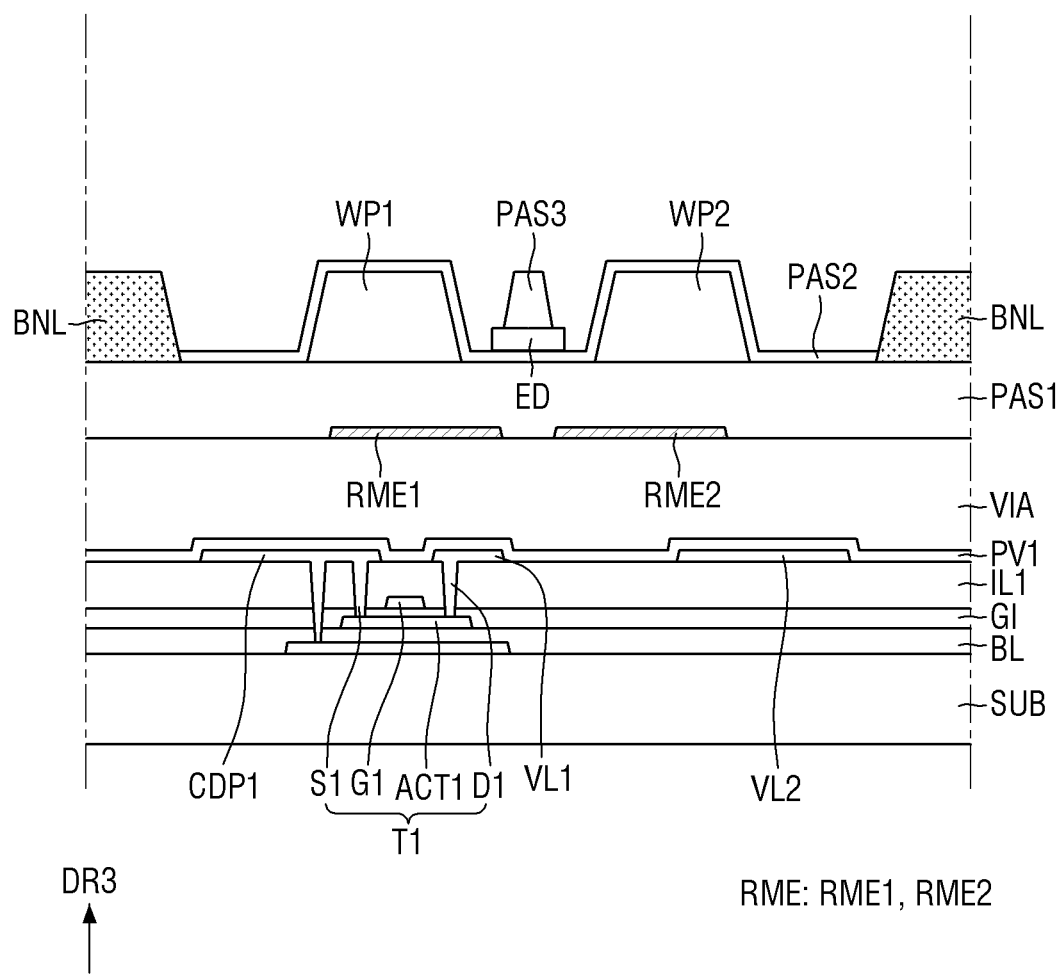

Thereafter, referring to FIG. 16, a third insulating layer PAS3 is formed on the light-emitting elements ED. The third insulating layer PAS3 may cover or overlap and fix the light-emitting elements ED. The third insulating layer PAS3 may initially be formed on the entire surface of the second insulating layer PAS2, in the display area DPA, and may be patterned later not to cover or overlap both end portions of each of the light-emitting elements ED.

Thereafter, although not specifically illustrated, connecting electrodes CNE, which are disposed on the wall patterns (WP1 and WP2) and the electrodes RME to be in contact with both end portions of each of the light-emitting elements ED, are formed, thereby obtaining the display device 10.

Display devices according to embodiments will hereinafter be described.

Figure 17:
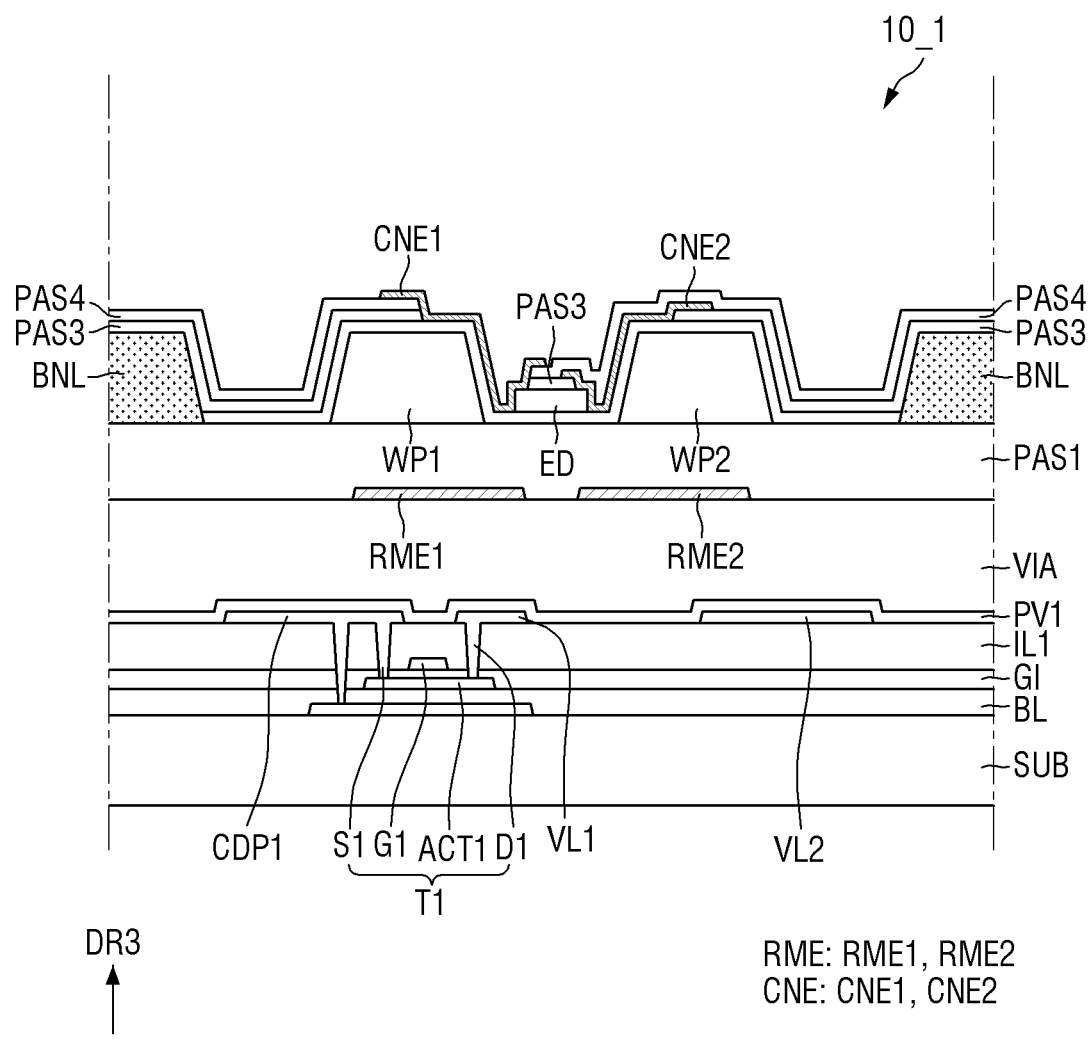
FIG. 17 is a schematic cross-sectional view of part of a display device according to an embodiment.

FIG. 17 is a schematic cross-sectional view of part of a display device according to an embodiment.

Referring to FIG. 17, a display device 10_1 may further include a fourth insulating layer PAS4, which is disposed on a third insulating layer PAS3. The third insulating layer PAS3 may include an inorganic insulating material, and as the fourth insulating layer PAS4 is further provided, connecting electrodes CNE, for example, first and second connecting electrodes CNE1 and CNE2, may be disposed in different layers with the fourth insulating layer PAS4 interposed therebetween.

The third insulating layer PAS3 may include parts disposed on the light-emitting elements ED and parts disposed on a second insulating layer PAS2 and a bank layer BNL. The third insulating layer PAS3 may initially be formed on the entire surfaces of the second insulating layer PAS2 and the bank layer BNL and may be patterned later to expose both end portions of each of the light-emitting elements ED. In areas where the third insulating layer PAS3 is not disposed, the top surface of the second insulating layer PAS2 and both end portions of each of the light-emitting elements ED may be exposed and may be disposed on the first and second connecting electrodes CNE1 and CNE2.

The second connecting electrode CNE2 may be disposed on the third insulating layer PAS3, and the fourth insulating layer PAS4 may be disposed on the second connecting electrode CNE2 and the third insulating layer PAS3. The fourth insulating layer PAS4 may be disposed on the entire surface of the third insulating layer PAS3 to cover or overlap the second connecting electrode CNE2, and the first connecting electrode CNE1 may be disposed on the fourth insulating layer PAS4. The fourth insulating layer PAS4 may insulate the first and second connecting electrodes CNE1 and CNE2 not to be in direct contact with each other.

In the display device 10_1, unlike in the display device 10 of FIG. 6, the connecting electrodes CNE may be disposed in different layers, and insulating layers including an inorganic insulating material may be further provided on the light-emitting elements ED.

Figure 18:
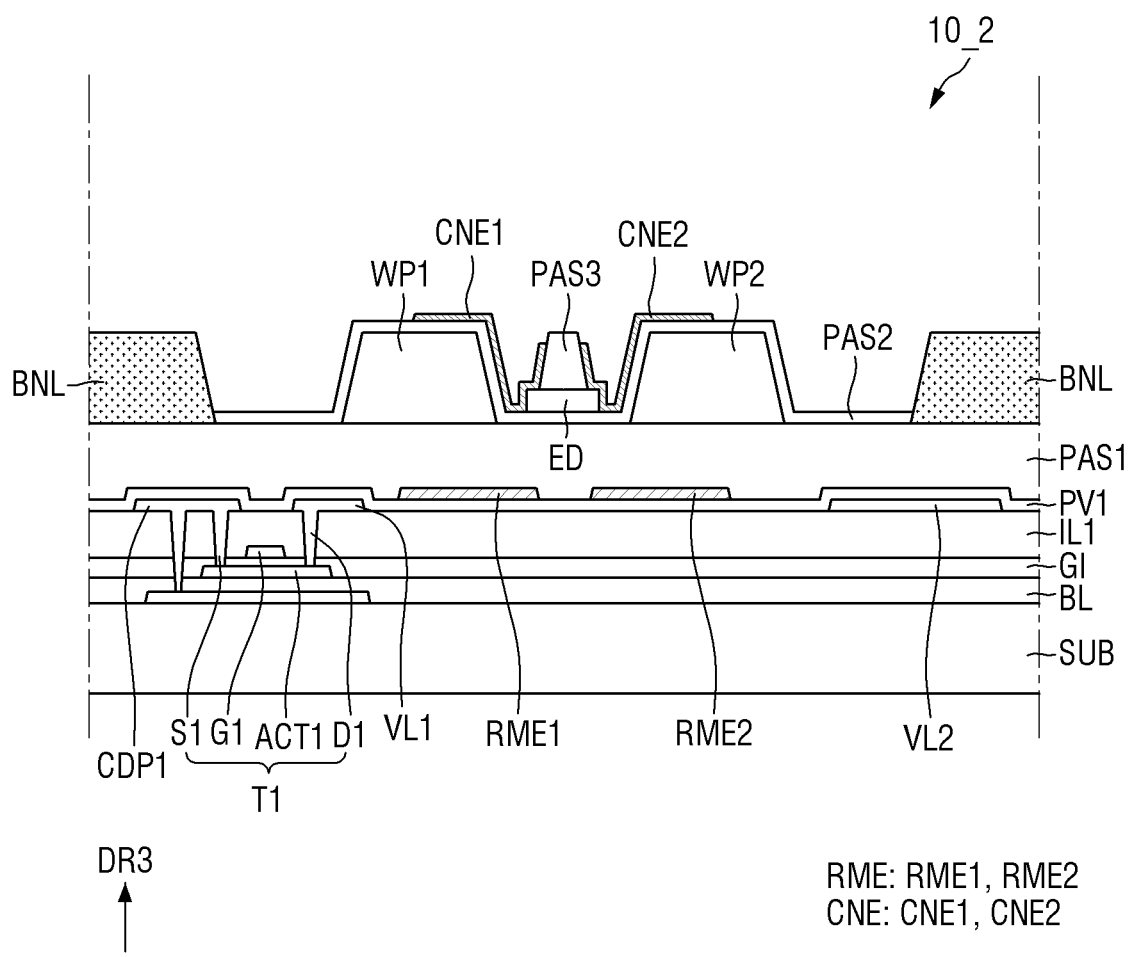
FIG. 18 is a schematic cross-sectional view of part of a display device according to an embodiment.

FIG. 18 is a schematic cross-sectional view of part of a display device according to an embodiment.

Referring to FIG. 18, in a display device 10_2, a via layer VIA may not be provided, and electrodes RME, for example, first and second electrodes RME1 and RME2, may be disposed on or directly disposed on a first passivation layer PV1. The first and second electrodes RME1 and RME2 may be disposed on or directly disposed on the first passivation layer PV1, and a first insulating layer PAS1 may be disposed on or directly disposed on the first passivation layer PV1 to cover or overlap parts of the electrodes RME. Although not specifically illustrated, contact holes (CTD and CTS) may penetrate the first passivation layer PV1 because of the absence of a via layer VIA. The display device 10_2 differs from the display device 10 of FIG. 7 in the distance between a third conductive layer and the electrodes RME, and in the display device 10_2, the height difference between the third conductive layer and the electrodes RME may be reduced. Even though the electrodes RME are disposed on or directly disposed on the first passivation layer PV1, a flat top surface may be provided on which wall patterns (WP1 and WP2), a bank layer BNL, and a second insulating layer PAS2 are to be disposed, because the first insulating layer PAS1, which may include an organic insulating material, is disposed on the first passivation layer PV1 and covers or overlaps the electrodes RME. The degree of alignment of light-emitting elements ED can be improved, and any connection defects between the third conductive layer and the electrodes RME can be prevented.

The order in which layers disposed on the first insulating layer PAS1, such as the second insulating layer PAS2, the wall patterns (WP1 and WP2), and the bank layer BNL, are formed is not limited to that described above with reference to FIGS. 11 through 16. The layout of the layers disposed on the first insulating layer PAS1 may vary depending on the order in which the second insulating layer PAS2, the wall patterns (WP1 and WP2), and the bank layer BNL are formed on the first insulating layer PAS1.

Figure 19:
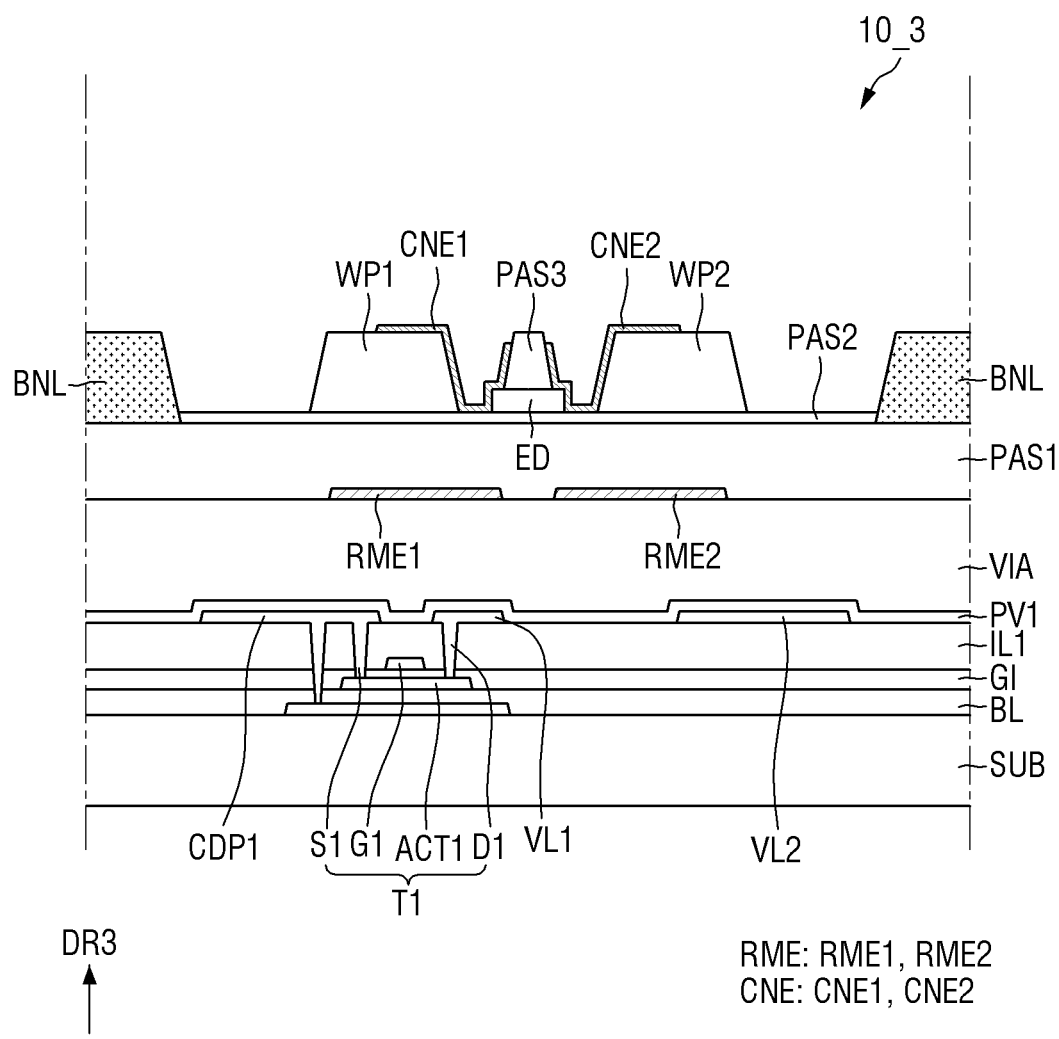
FIGS. 19 through 21 are schematic cross-sectional views of parts of display devices according to embodiments.
Figure 20:
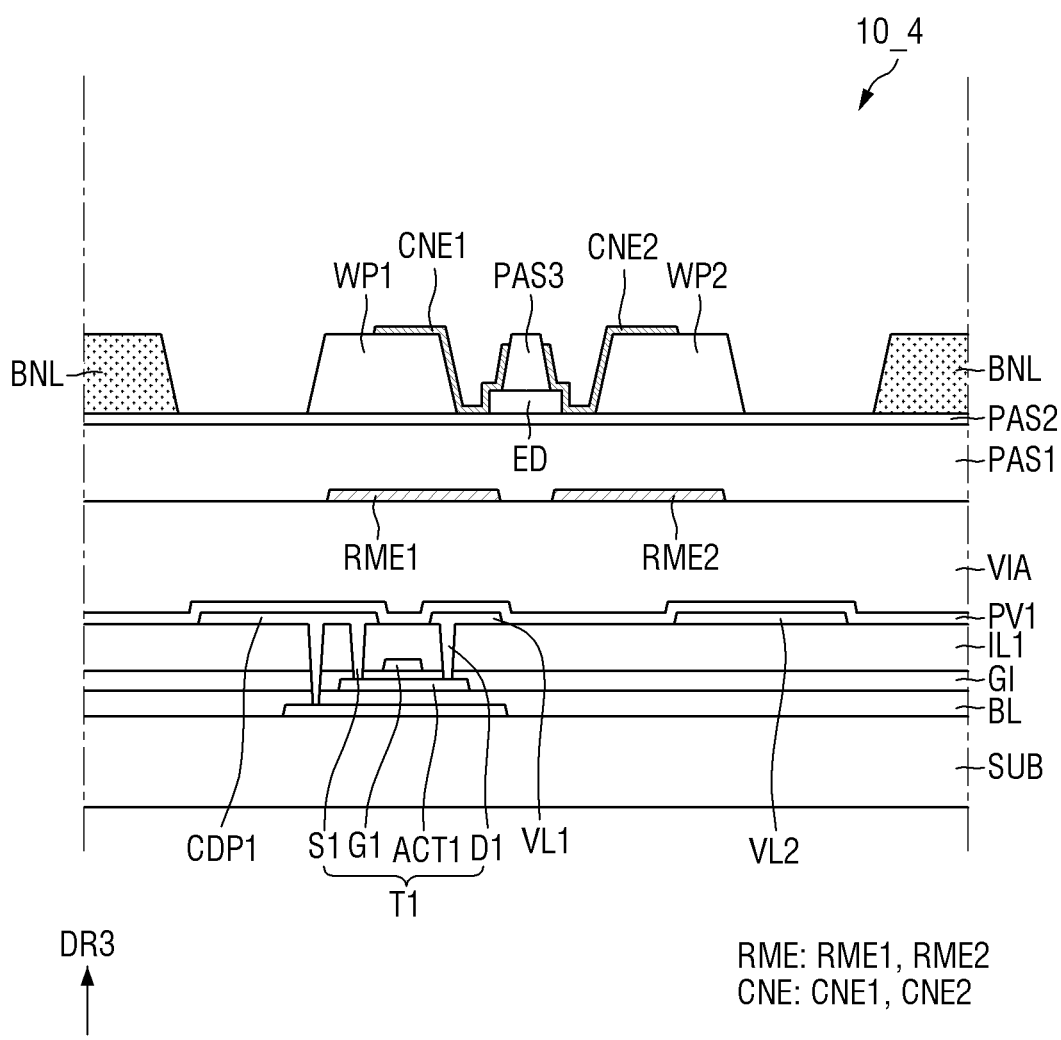
Figure 21:
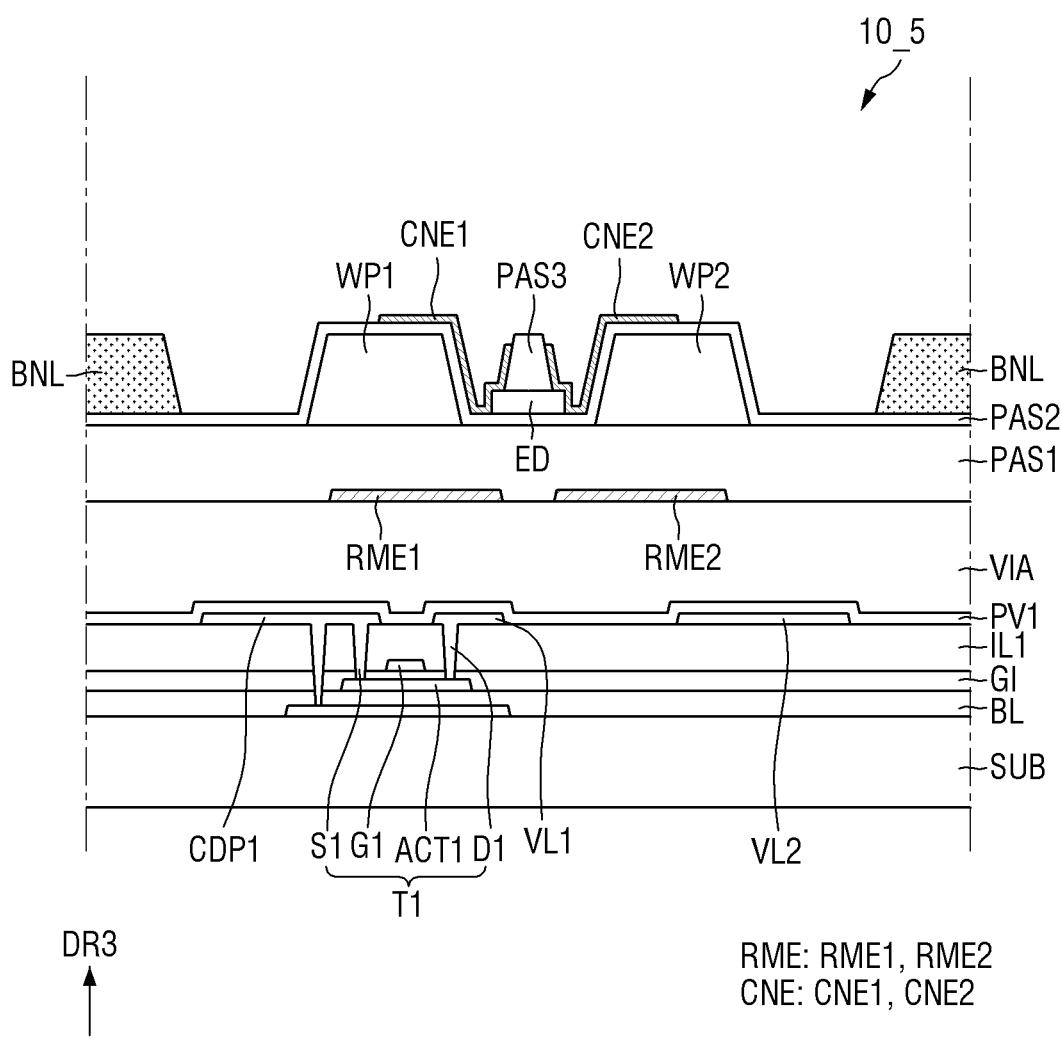

FIGS. 19 through 21 are schematic cross-sectional views of parts of display devices according to embodiments.

Referring to FIG. 19, in a display device 10_3, a bank layer BNL and a second insulating layer PAS2 may be disposed on or directly disposed on a first insulating layer PAS1, and wall patterns (WP1 and WP2) may be disposed on the second insulating layer PAS2. During the fabrication of the display device 10_3, the bank layer BNL may be formed first on the first insulating layer PAS1, and the second insulating layer PAS2 and the wall patterns (WP1 and WP2) may be sequentially formed. The second insulating layer PAS2 may be disposed not to overlap the bank layer BNL, in an area surrounded by the bank layer BNL, and may be placed on or directly placed on the first insulating layer PAS1.

As the second insulating layer PAS2 is formed before the formation of the wall patterns (WP1 and WP2), the top surface of a first insulating pattern IP1 of the second insulating layer PAS2, which is disposed in the emission area EMA, may be completely flat. The embodiment of FIG. 19 is advantageous in that the second insulating layer PAS2 may be formed flat or substantially flat. A surface treatment process for the second insulating layer PAS2 and the bank layer BNL may be performed before the formation of the wall patterns (WP1 and WP2).

Referring to FIG. 20, in a display device 10_4, a second insulating layer PAS2 may be disposed on or directly disposed on a first insulating layer PAS1, and a bank layer BNL and wall patterns (WP1 and WP2) may be disposed on the second insulating layer PAS2. During the fabrication of the display device 10_4, the second insulating layer PAS2 may be formed first on the first insulating layer PAS1, and the bank layer BNL and the wall patterns (WP1 and WP2) may be sequentially formed. The embodiment of FIG. 20 differs from the embodiment of FIG. 19 in that the second insulating layer PAS2 is formed before the formation of the bank layer BNL. As the second insulating layer PAS2 is formed before the formation of the bank layer BNL, the patterning of the second insulating layer PAS2 may not be performed to expose the top surface of the bank layer BNL, even though the second insulating layer PAS2 is formed on the entire surface of the first insulating layer PAS1. In the display device 10_4, the second insulating layer PAS2 may be disposed on the entire surface of the first insulating layer PAS1, and the bank layer BNL may overlap the second insulating layer PAS2 in a thickness direction.

Referring to FIG. 21, in a display device 10_5, wall patterns (WP1 and WP2) may be disposed on or directly disposed on a first insulating layer PAS1, a second insulating layer PAS2 may be disposed on the wall patterns (WP1 and WP2), and a bank layer BNL may be disposed on the second insulating layer PAS2. During the fabrication of the display device 10_5, the wall patterns (WP1 and WP2) may be formed first on the first insulating layer PAS1, the second insulating layer PAS2 may be formed, and, the bank layer BNL may be formed. The display device 10_5 differs from the display device 10_4 of FIG. 20 in that the wall patterns (WP1 and WP2) are disposed between the first and second insulating layers PAS1 and PAS2, and a detailed description thereof will be omitted.

Figure 22:
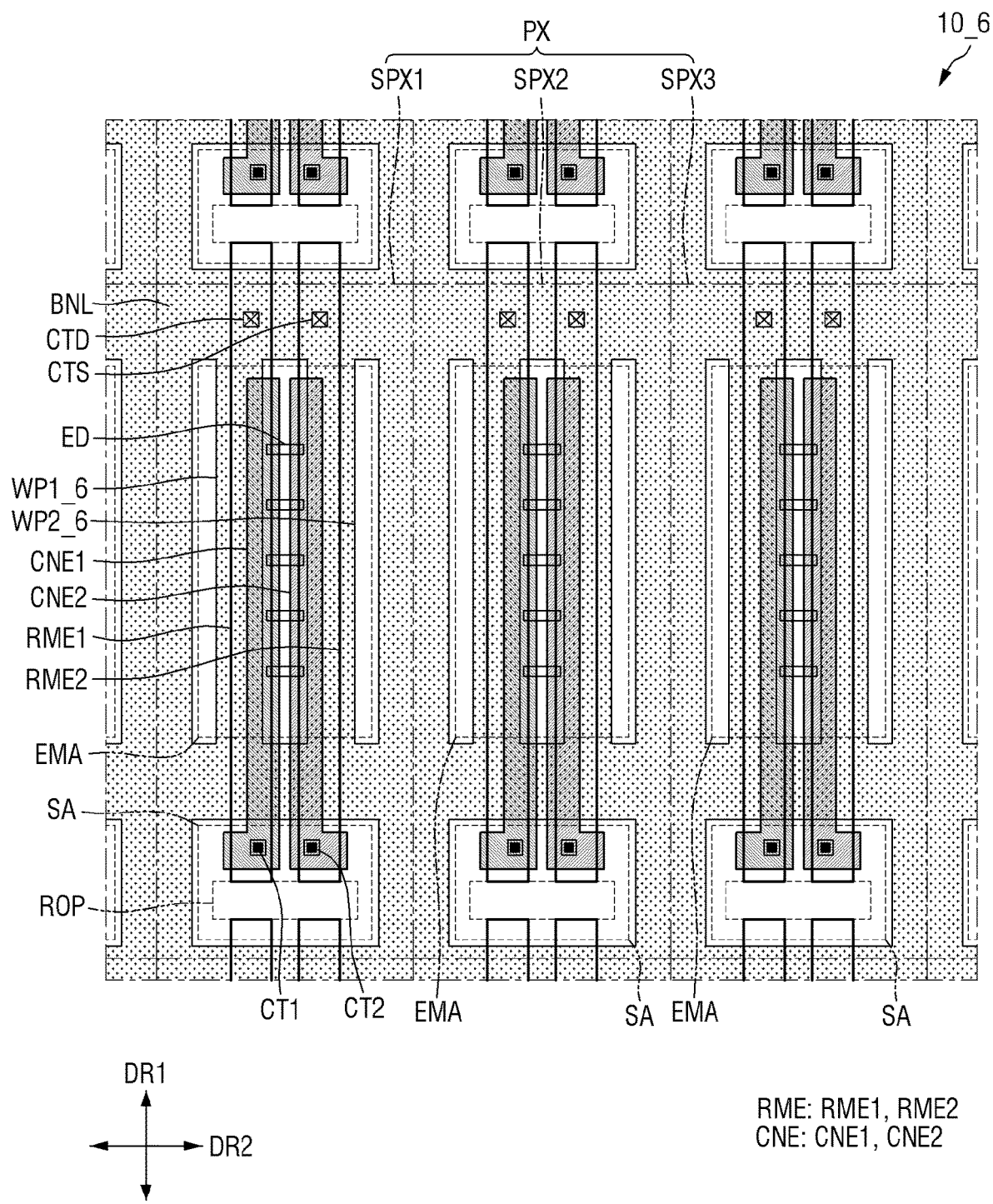
FIG. 22 is a schematic plan view of a pixel of a display device according to an embodiment.
Figure 23:
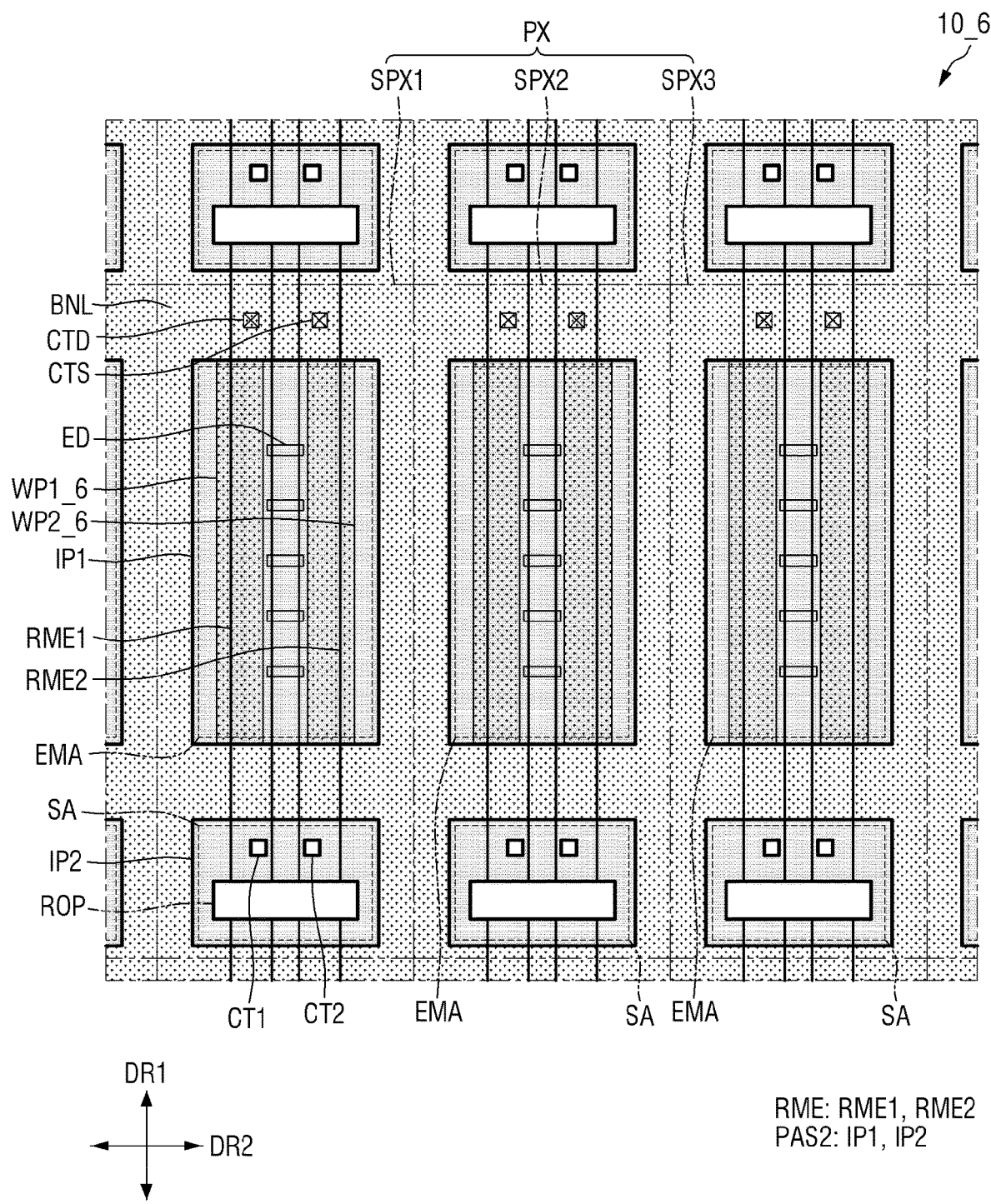
FIG. 23 is a schematic plan view illustrating a second insulating layer in the pixel of FIG. 22.

FIG. 22 is a schematic plan view of a pixel of a display device according to an embodiment. FIG. 23 is a schematic plan view illustrating a second insulating layer in the pixel of FIG. 22.

Referring to FIGS. 22 and 23, in a display device 10_6, wall patterns (WP1_6 and WP2_6) and a bank layer BNL may be integral with one another. The wall patterns (WP1_6 and WP2_6) and the bank layer BNL may be formed of a same material or a similar material at the same time, and the wall patterns (WP1_6 and WP2_6) may be connected to parts of the bank layer BNL that extend in a second direction DR2. The wall patterns (WP1_6 and WP2_6) may be disposed only in an emission area EMA, among areas surrounded by the bank layer BNL, and the emission area EMA may be divided into multiple regions by the wall patterns (WP1_6 and WP2_6) and the bank layer BNL.

For example, the emission area EMA may be surrounded by parts of the bank layer BNL that extend in a first direction DR1 and the parts of the bank layer BNL that extend in the second direction DR2 and may be divided into a region between the wall patterns (WP1_6 and WP2_6) and regions between the bank layer BNL and the wall patterns (WP1_6 and WP2_6). The wall patterns (WP1_6 and WP2_6), for example, first and second wall patterns WP1_6 and WP2_6, may be disposed to overlap first and second electrodes RME1 and RME2, respectively, and light-emitting elements ED may be disposed between the first and second wall patterns WP1_6 and WP2_6. The light-emitting elements ED may not be disposed in the regions between the bank layer BNL and the wall patterns (WP1_6 and WP2_6), or even if some or a number of the light-emitting elements ED are disposed in the regions between the bank layer BNL and the wall patterns (WP1_6 and WP2_6), the corresponding light-emitting elements ED may not be electrically connected to first and second voltage lines VL1 and VL2 of a third conductive layer. The embodiment of FIGS. 22 and 23 is advantageous in that the bank layer BNL and the wall patterns (WP1_6 and WP2_6) may be formed at the same time.

Figure 24:
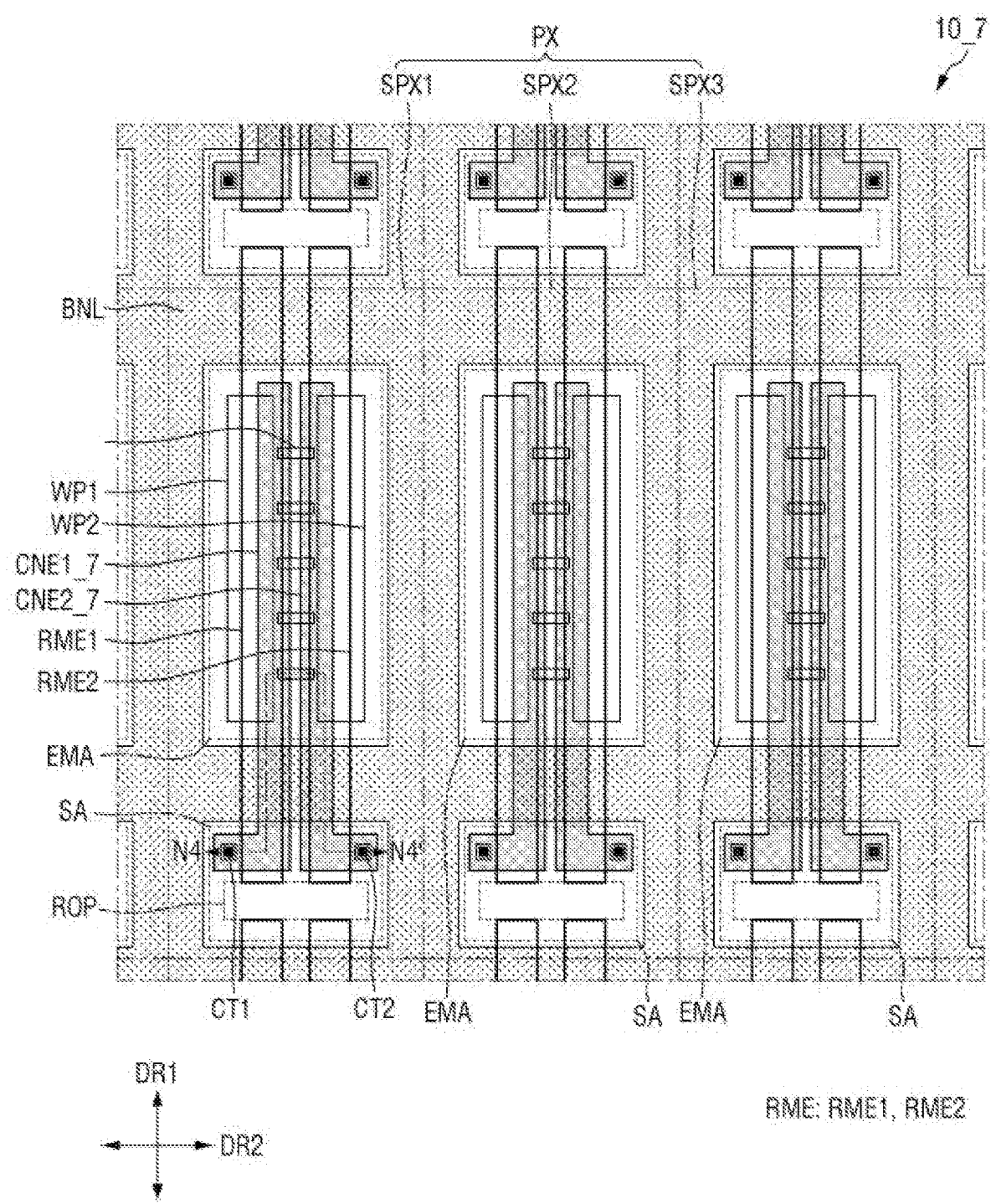
FIG. 24 is a schematic plan view of a pixel of a display device according to an embodiment.
Figure 25:
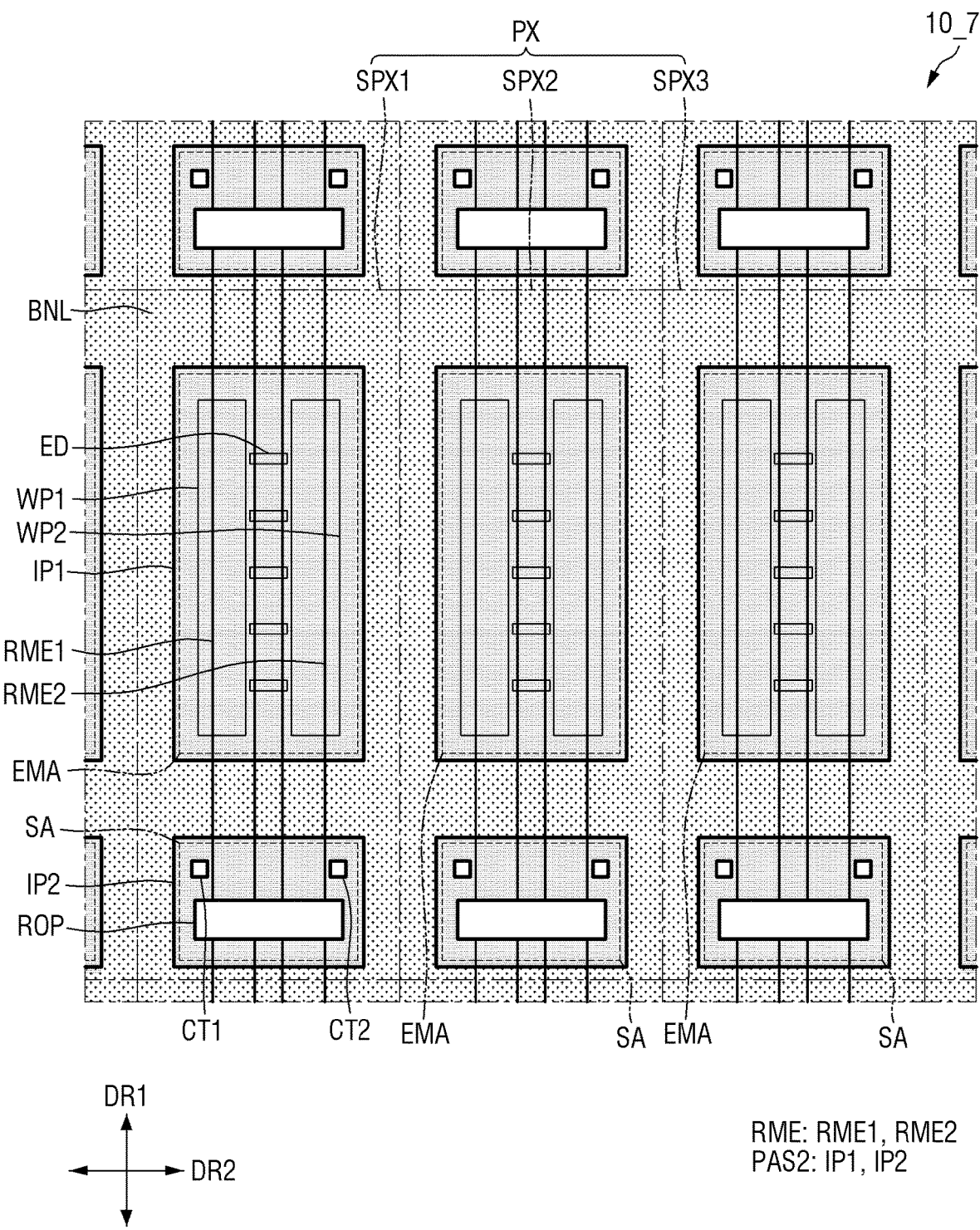
FIG. 25 is a schematic plan view illustrating a second insulating layer in the pixel of FIG. 24.
Figure 26:
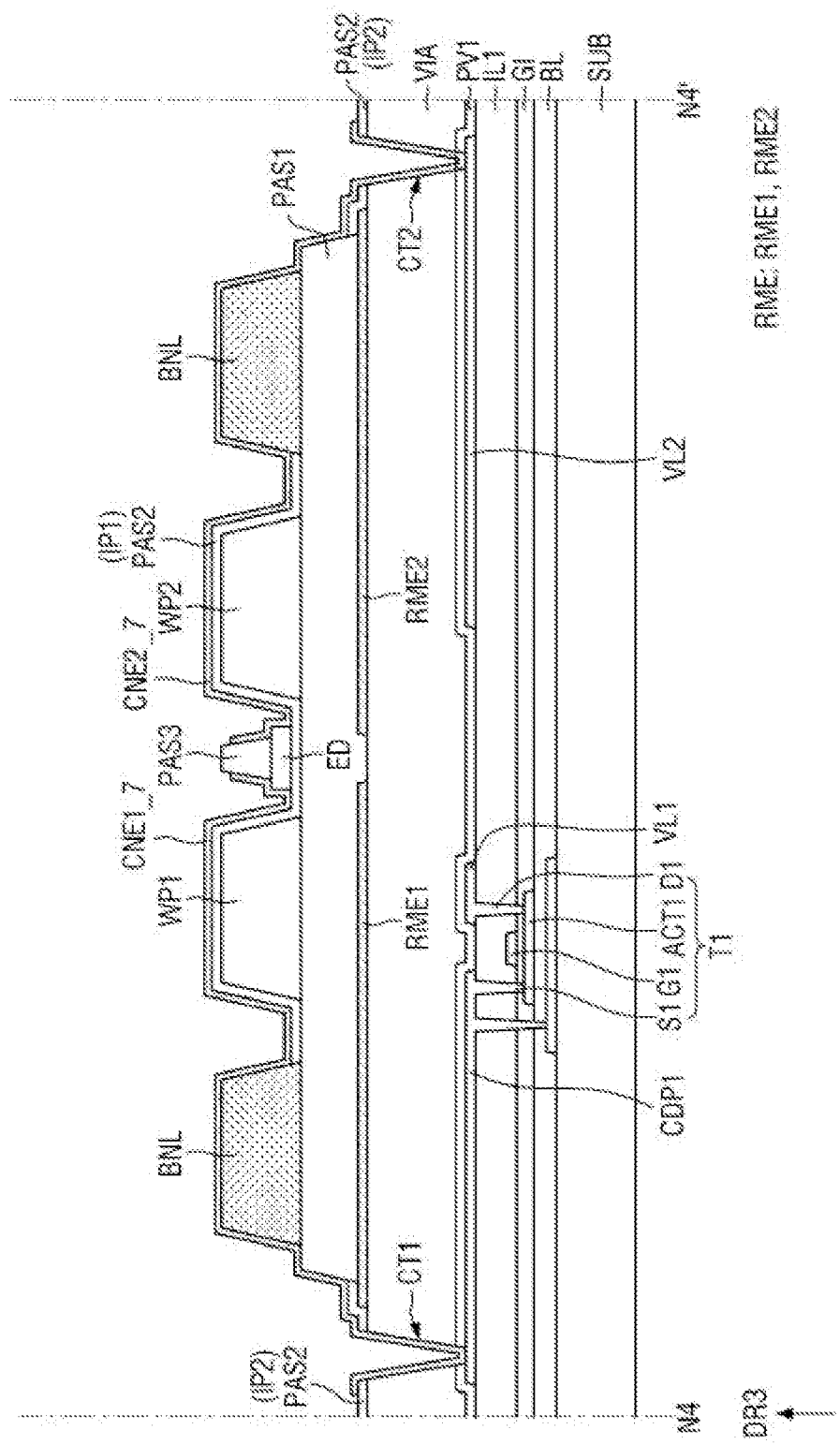
FIG. 26 is a schematic cross-sectional view taken along line N4-N4' of FIG. 24.

FIG. 24 is a schematic plan view of a pixel of a display device according to an embodiment. FIG. 25 is a schematic plan view illustrating a second insulating layer in the pixel of FIG. 24. FIG. 26 is a schematic cross-sectional view taken along line N4-N4' of FIG. 24. FIG. 26 illustrates a schematic cross-sectional view taken across both end portions of a light-emitting element ED and across contacts (CT1 and CT2) in a subarea SA.

Referring to FIGS. 24 through 26, in a display device 10_7, connecting electrode (CNE1_7 and CNE2_7) may be connected to or directly connected to a third conductive layer through the contacts (CT1 and CT2), which penetrate a second insulating layer PAS2, a via layer VIA, and a first passivation layer PV1. As contact holes (CTD and CTS) are not provided in the display device 10_7, electrodes RME may not be in direct contact with a third conductive layer, and the connecting electrode (CNE1_7 and CNE2_7) may be connected to or directly connected to the third conductive layer.

The display device 10_7 may include, in a subarea SA of each subpixel SPXn, contacts (CT1 and CT2), which penetrate the second insulating layer PAS2, the via layer VIA, and the first passivation layer PV1. The contacts (CT1 and CT2) are disposed not to overlap the electrodes RME. Even if the contacts (CT1 and CT2) penetrate a second insulating pattern IP2 of the second insulating layer PAS2, the electrodes RME may be covered or overlapped by the second insulating pattern IP2, in the subarea SA.

A first contact CT1 may expose part of the top surface of a conductive pattern CDP1 through the second insulating layer PAS2, the via layer VIA, and the first passivation layer PV1, in the subarea SA, and a first connecting electrode CNE1_7 may be in direct contact with the conductive pattern CDP1 through the first contact CT1. A second contact CT2 may expose part of the top surface of a second voltage line VL2 through the second insulating layer PAS2, the via layer VIA, and the first passivation layer PV1, in the subarea SA, and a second connecting electrode CNE2_7 may be in direct contact with the second voltage line VL2 through the second contact CT2. As the connecting electrode (CNE1_7 and CNE2_7) are in direct contact with the third conductive layer, the electrodes RME may not be electrically connected to light-emitting elements ED.

Figure 27:
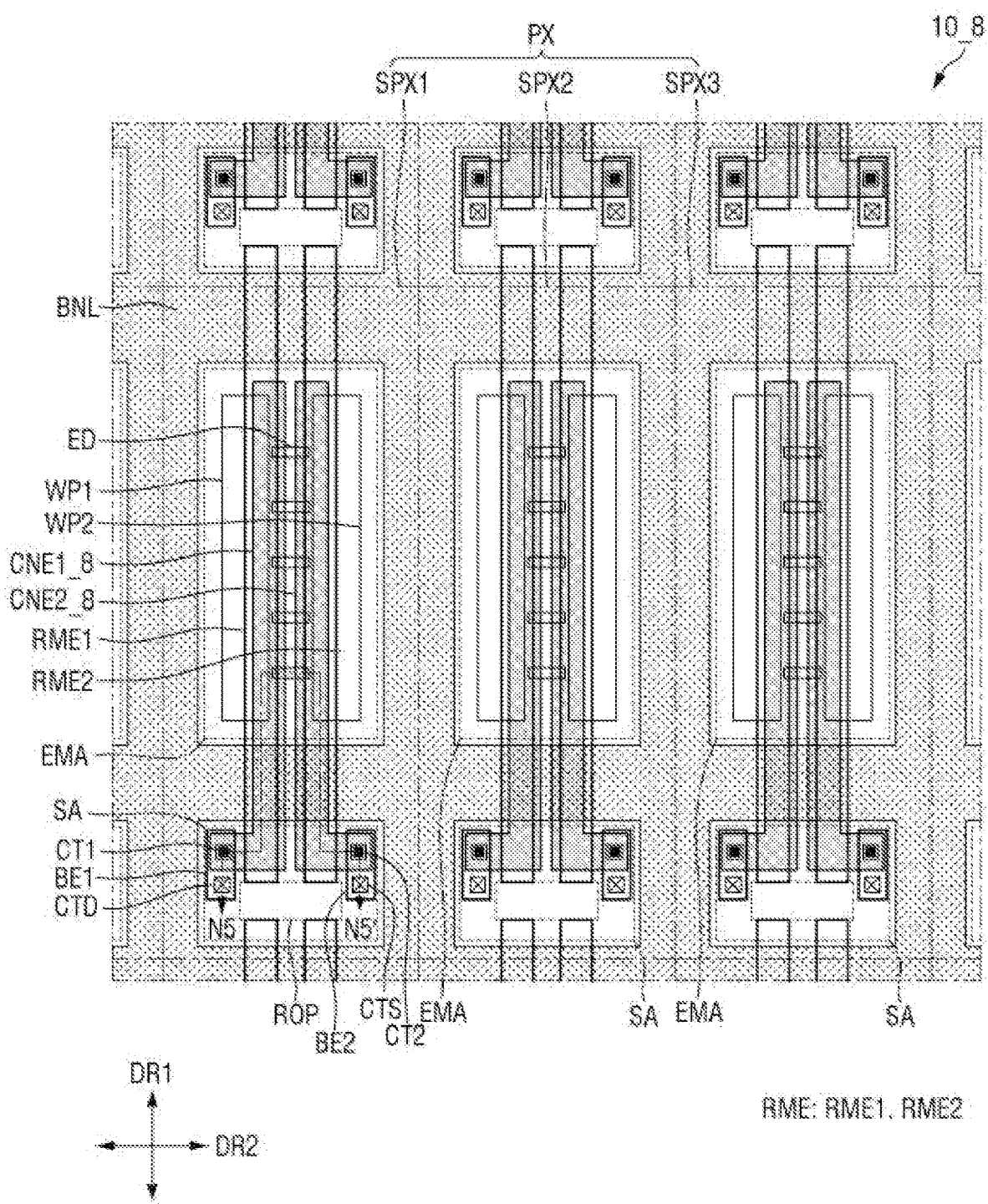
FIG. 27 is a schematic plan view of a pixel of a display device according to an embodiment.
Figure 28:
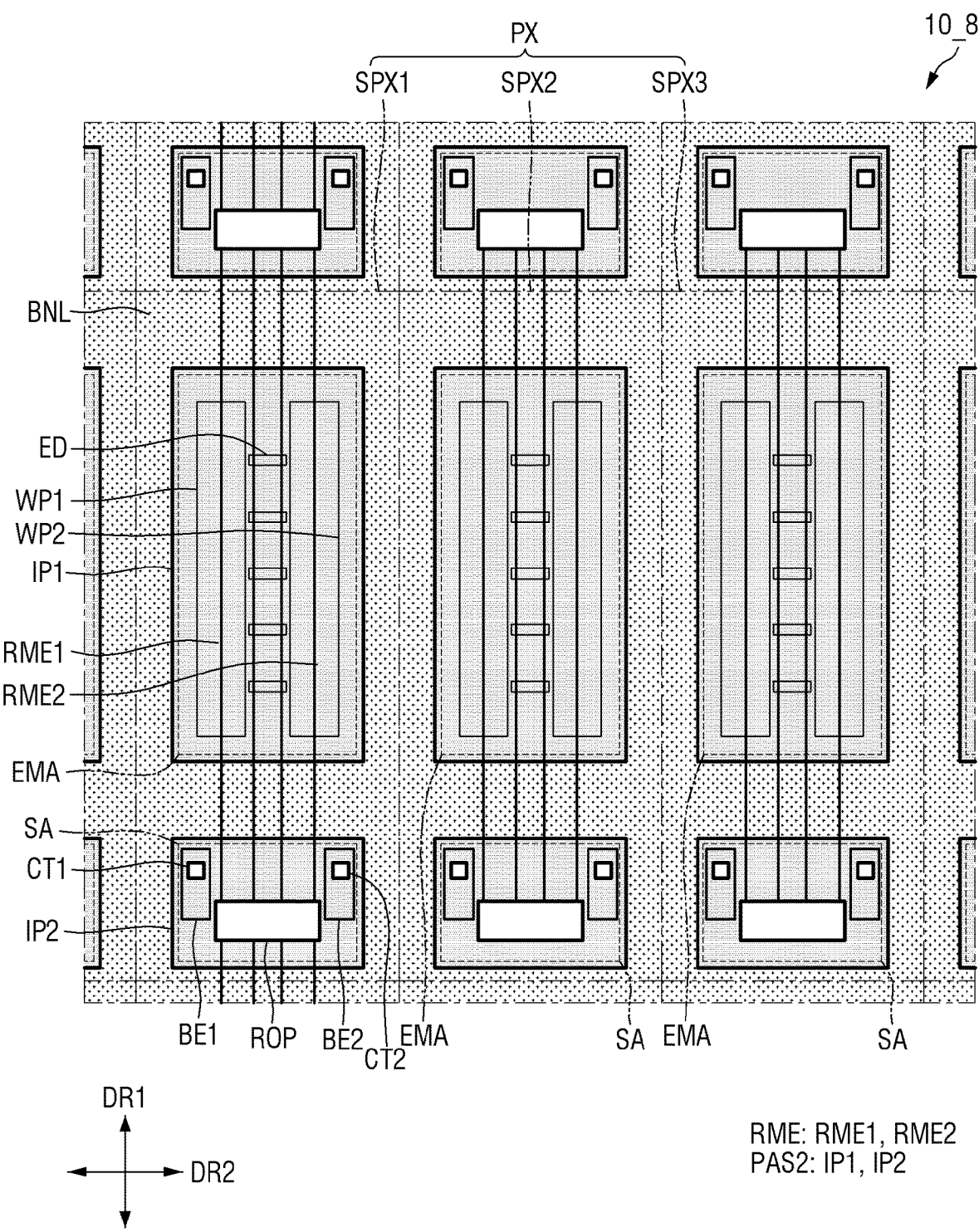
FIG. 28 is a schematic plan view illustrating a second insulating layer in the pixel of FIG. 27.
Figure 29:
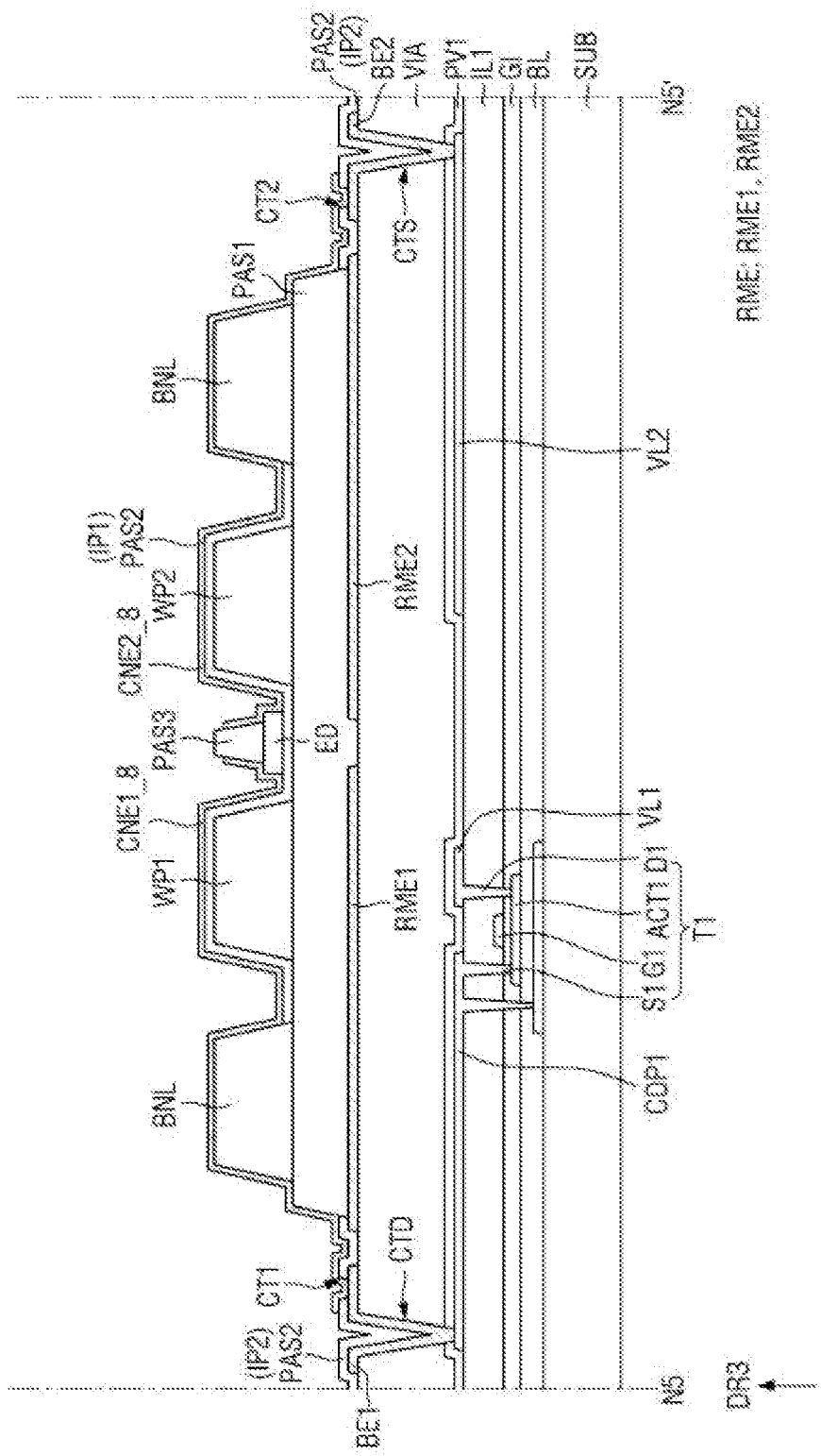
FIG. 29 is a schematic cross-sectional view taken along line N5-N5' of FIG. 27.

FIG. 27 is a schematic plan view of a pixel of a display device according to an embodiment. FIG. 28 is a schematic plan view illustrating a second insulating layer in the pixel of FIG. 27. FIG. 29 is a schematic cross-sectional view taken along line N5-N5' of FIG. 27. FIG. 29 illustrates a schematic cross-sectional view taken across both end portions of a light-emitting element ED and across bridge electrodes (BE1 and BE2) and contacts (CT1 and CT2) in a subarea SA.

Referring to FIGS. 27 through 29, a display device 10_8 may further include bridge electrodes (BE1 and BE2) in a subarea SA of each subpixel SPXn, and connecting electrodes (CNE1_8 and CNE2_8) may be electrically connected to a third conductive layer through the bridge electrodes (BE1 and BE2). Contact holes (CTD and CTS) may be disposed in the subarea SA so that the bridge electrodes (BE1 and BE2) may be in direct contact with the third conductive layer, and the connecting electrodes (CNE1_8 and CNE2_8) may be electrically connected to the third conductive layer through the bridge electrodes (BE1 and BE2). The display device 10_8 differs from the display devices 10_7 of FIGS. 24 through 26 in that it further may include the bridge electrodes (BE1 and BE2).

The bridge electrodes (BE1 and BE2) may be disposed in a same layer as electrodes RME, in the subarea SA, and may be spaced apart from the electrodes RME. For example, the bridge electrodes (BE1 and BE2) may include a first bridge electrode BE1, which is spaced apart from a first electrode RME1, near the first electrode RME1, and a second bridge electrode BE2, which is spaced apart from a second electrode RME2, near the second electrode RME2. The first bridge electrode BE1 may be disposed in the left part of the subarea SA, and the second bridge electrode BE2 may be disposed in the right part of the subarea SA. The bridge electrodes (BE1 and BE2) and the electrodes RME may be formed of a same material or a similar material by a same process.

The bridge electrodes (BE1 and BE2) may be in direct contact with the third conductive layer through the contact holes (CTD and CTS), which penetrate the layers below the bridge electrodes (BE1 and BE2). In an embodiment where the display device 10_8 may include a via layer VIA, the bridge electrodes (BE1 and BE2) may be disposed on or directly disposed on the via layer VIA. The first bridge electrode BE1 may be in direct contact with a conductive pattern CDP1 through a first contact hole CTD, which penetrates the via layer VIA and a first passivation layer PV1, and the second bridge electrode BE2 may be in contact with a second voltage line VL2 through a second contact hole CTS, which penetrates the via layer VIA and the first passivation layer PV1.

A second insulating pattern IP2, which is part of a second insulating layer PAS2 in the subarea SA, may be disposed to cover or overlap the electrodes RME and the bridge electrodes (BE1 and BE2), in the subarea SA. The contacts (CT1 and CT2), which penetrate the second insulating pattern IP2, may overlap the bridge electrodes (BE1 and BE2) and may expose parts of the top surfaces of the bridge electrodes (BE1 and BE2). A first contact CT1 may expose part of the top surface of the first bridge electrode BE1 through the second insulating layer PAS2, in the subarea SA, and a first connecting electrode CNE1_8 may be in direct contact with the first bridge electrode BE1 through the first contact CT1. A second contact CT2 may expose part of the top surface of the second bridge electrode BE2 through the second insulating layer PAS2, in the subarea SA, and a second connecting electrode CNE2_8 may be in direct contact with the second bridge electrode BE2 through the second contact CT2. As the connecting electrodes (CNE1_8 and CNE2_8) are electrically connected to the third conductive layer through the bridge electrodes (BE1 and BE2), the disconnection of electrode materials by any height differences can be prevented as compared to a case where the connecting electrodes (CNE1_8 and CNE2_8) are in direct contact with the third conductive layer.

Figure 30:
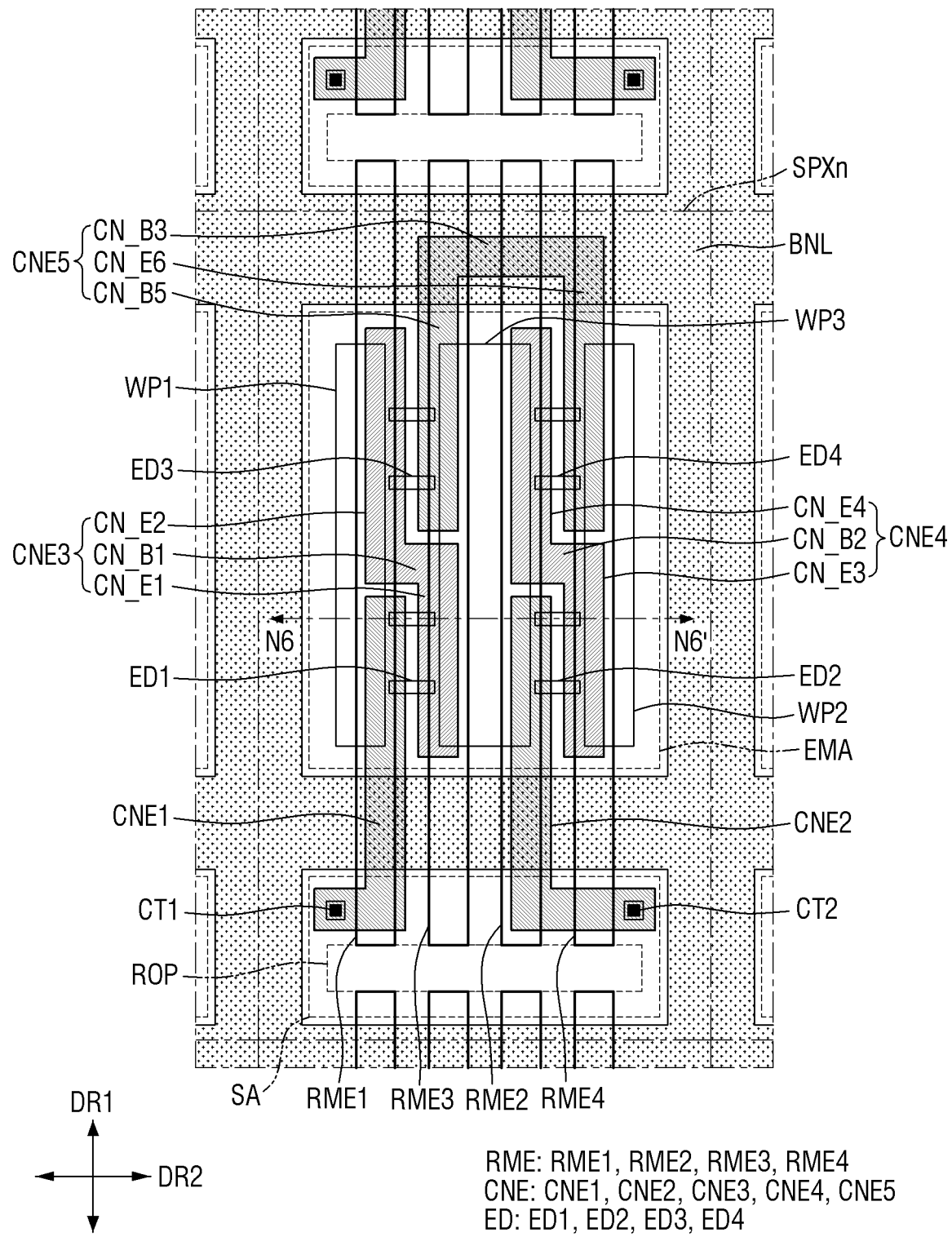
FIG. 30 is a schematic plan view of a subpixel of a display device according to an embodiment.
Figure 31:
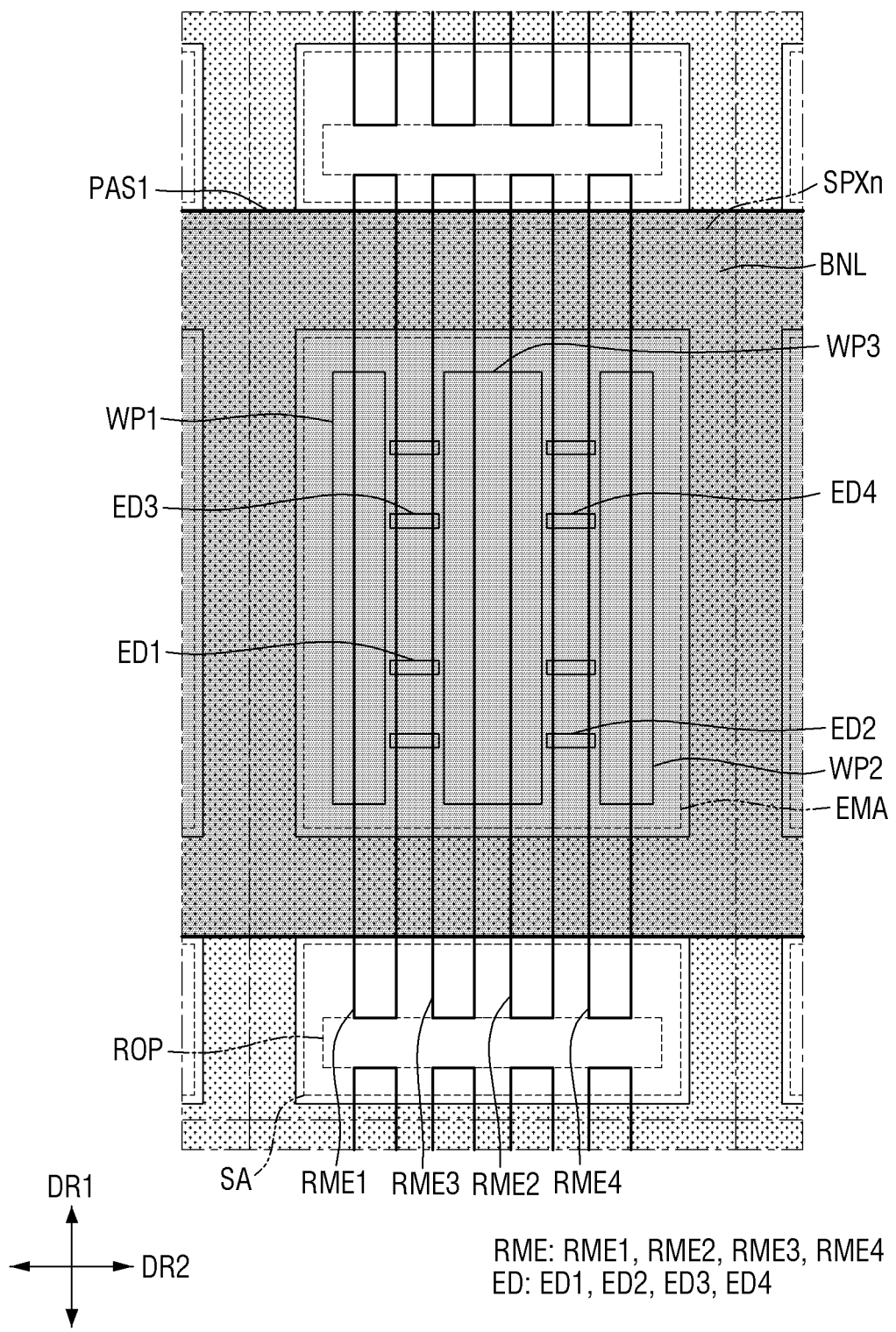
FIG. 31 is a schematic plan view illustrating a first insulating layer in the subpixel of FIG. 30.
Figure 32:
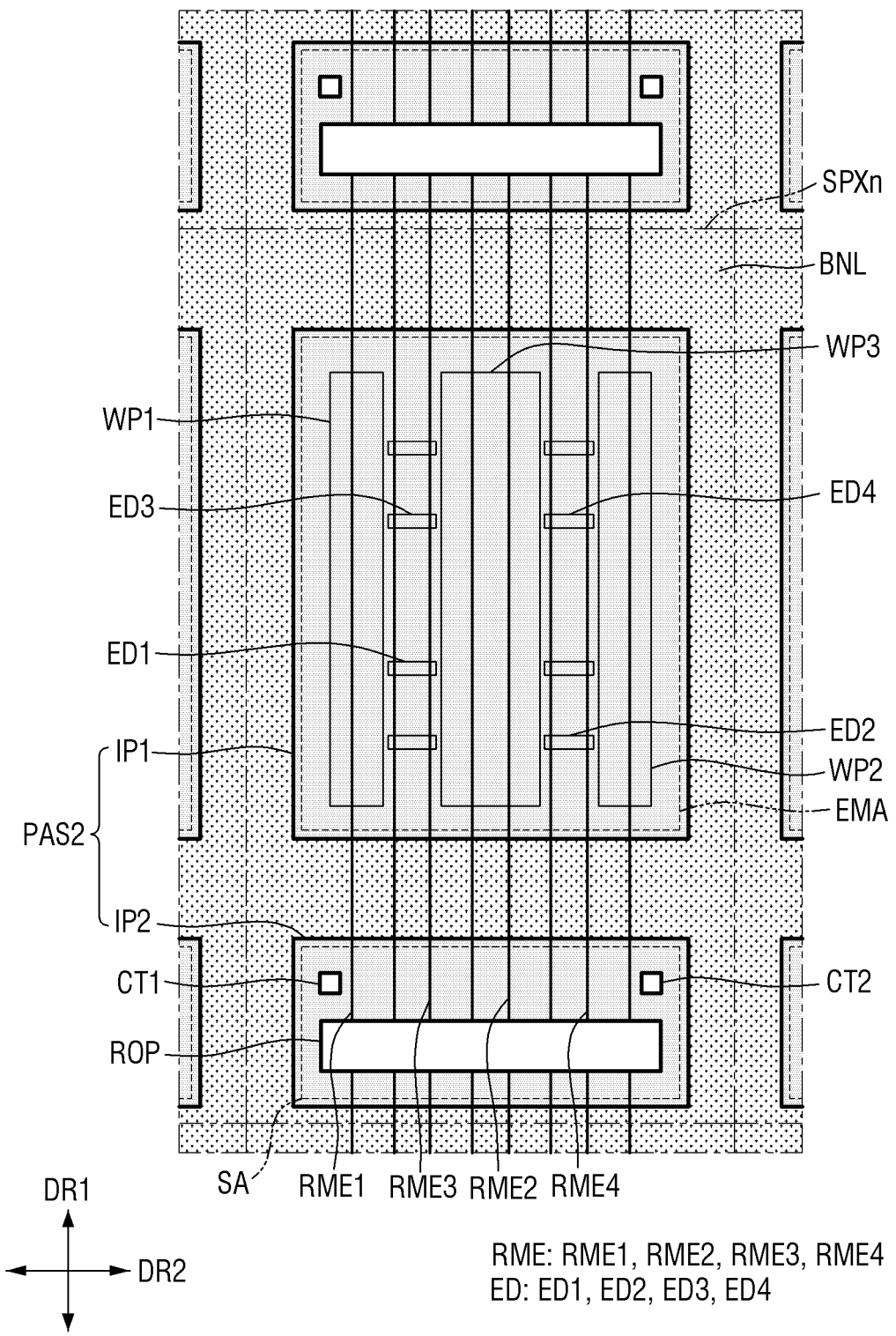
FIG. 32 is a schematic plan view illustrating a second insulating layer in the subpixel of FIG. 30.
Figure 33:
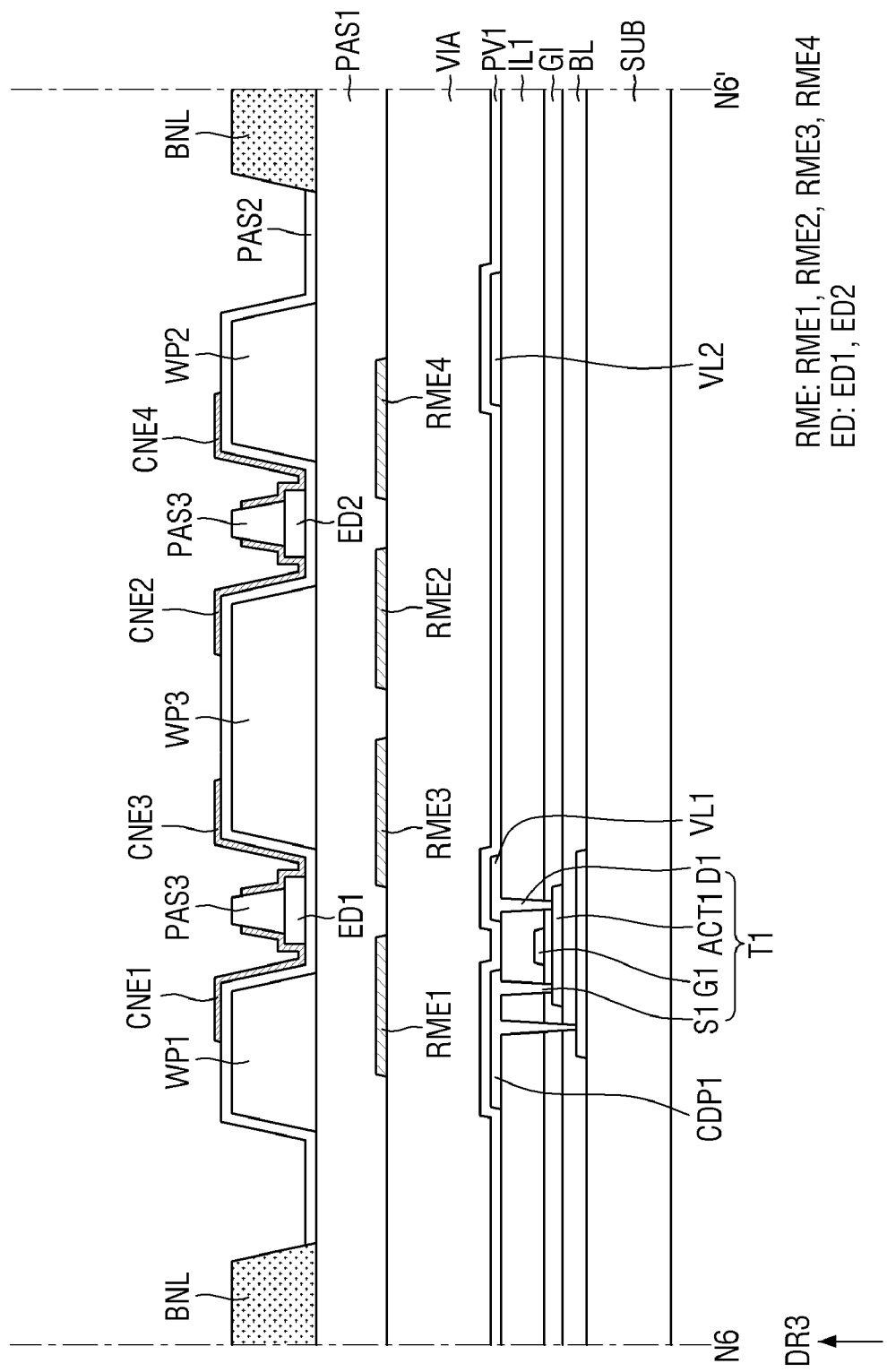
FIG. 33 is a schematic cross-sectional view taken along line N6-N6' of FIG. 30.

FIG. 30 is a schematic plan view of a subpixel of a display device according to an embodiment. FIG. 31 is a schematic plan view illustrating a first insulating layer in the subpixel of FIG. 30. FIG. 32 is a schematic plan view illustrating a second insulating layer in the subpixel of FIG. 30. FIG. 33 is a schematic cross-sectional view taken along line N6-N6' of FIG. 30.

FIG. 30 illustrates the layout of electrodes RME, wall patterns (WP1, WP2, and WP3), a bank layer BNL, light-emitting elements ED, and connecting electrodes CNE in one subpixel SPXn of a display device 10. FIG. 31 illustrates the layout of the electrodes RME, the wall patterns (WP1, WP2, and WP3), the bank layer BNL, and a first insulating layer PAS1 in the subpixel SPXn of FIG. 30, and FIG. 32 illustrates the layout of the electrodes RME, the wall patterns (WP1, WP2, and WP3), the bank layer BNL, and a second insulating layer PAS2 in the subpixel SPXn of FIG. 30. FIG. 33 illustrates a schematic cross-sectional view taken across both end portions of each of first and second light-emitting elements ED1 and ED2 on different electrodes RME.

Referring to FIGS. 30 through 33, the display device 10 may include, in a subpixel SPXn, more than two electrodes RME, for example, first, second, third, and fourth electrodes RME1, RME2, RME3, and RME4, more than two wall patterns, for example, first, second, and third wall patterns WP1, WP2, and WP3, more than two types of light-emitting elements ED, for example, first light-emitting elements ED1, second light-emitting elements ED2, third light-emitting elements ED3, and fourth light-emitting elements ED4, and more than two connecting electrodes CNE, for example, first, second, third, and fourth connecting electrodes CNE1, CNE2, CNE3, and CNE4. The display device 10 of FIGS. 30 through 33 differs from the display device 10_7 of FIG. 24 in the numbers of electrodes RME and light-emitting elements ED provided in each subpixel SPXn. The display device 10 of FIGS. 30 through 33 will hereinafter be described, focusing for example on the differences with the display device 10_7 of FIG. 24.

The electrodes RME may include the first and second electrodes RME1 and RME2 and may further include the third and fourth electrodes RME3 and RME4.

The third electrode RME3 may be disposed between the first and second electrodes RME1 and RME2, and the third and fourth electrodes RME3 and RME4 may be spaced apart from each other in a second direction DR2 with the second electrode RME2 interposed therebetween. The electrodes RME may be spaced apart from, and face, one another in the second direction DR2. The electrodes RME may be arranged (or disposed) in the order of the first, third, second, and fourth electrodes RME1, RME3, RME2, and RME4 along a left-to-right direction. The electrodes RME may be separated from electrodes RME of a neighboring subpixel SPXn, in a first direction DR1, of the subpixel SPXn by a separation part ROP of a subarea SA.

The first insulating layer PAS1 may be disposed to have a similar structure to its counterpart of any one of the previous embodiments. The first insulating layer PAS1 may be disposed to cover or overlap parts of the electrodes RME in an emission area EMA and may not be disposed in the subarea SA.

The wall patterns (WP1, WP2, and WP3) may include the first and second wall patterns WP1 and WP2 and may further include the third wall pattern WP3, which is disposed between the first and second wall patterns WP1 and WP2. The first wall pattern WP1 may be disposed on the left side of the center of the emission area EMA, the second wall pattern WP2 may be disposed on the right side of the center of the emission area EMA, and the third wall pattern WP3 may be disposed in the middle of the emission area EMA. The third wall pattern WP3 may have a larger width in the second direction DR2 than the first and second wall patterns WP1 and WP2. The distance, in the second direction DR2, between the wall patterns (WP1, WP2, and WP3) may be greater than the distance, in the second direction DR2, between the electrodes RME. The first wall pattern WP1 may be disposed to partially overlap the first electrode RME1, and the second wall pattern WP2 may be disposed to partially overlap the fourth electrode RME4. The third wall pattern WP3 may be disposed to partially overlap the second and third electrodes RME2 and RME3. At least parts of the electrodes RME may be disposed not to overlap the wall patterns (WP1, WP2, and WP3).

The layout of the second insulating layer PAS2 and the bank layer BNL may be similar to the layout of the second insulating layer PAS2 and a bank layer BNL of FIGS. 24 through 26. The bank layer BNL may be disposed to surround the emission area EMA and the subarea SA, and the second insulating layer PAS2 may include first and second insulating patterns IP1 and IP2, which are disposed in the emission area EMA and the subarea SA, respectively. The first insulating pattern IP1 may be disposed to cover or overlap the wall patterns (WP1, WP2, and WP3) and parts of the electrodes RME in the emission area EMA, and the second insulating pattern IP2 may be disposed to cover or overlap parts of the electrodes RME in the subarea SA. The second insulating pattern IP2 may cover or overlap the entire subarea SA except for the separation part ROP and contacts (CT1 and CT2). As will be described later, in an embodiment where parts of the connecting electrodes CNE are in direct contact with a third conductive layer, the contacts (CT1 and CT2), which penetrate the second insulating pattern IP2, may be disposed not to overlap the electrodes RME.

The light-emitting elements ED may be disposed between the wall patterns (WP1, WP2, and WP3) or on different electrodes. Some or a number of the light-emitting elements ED may be disposed between the first and third wall patterns WP1 and WP3, and the other light-emitting elements ED may be disposed between the second and third wall patterns WP2 and WP3. The light-emitting elements ED may include the first light-emitting elements ED1 and the third light-emitting elements ED3, which are disposed between the first and third wall patterns WP1 and WP3, and the second light-emitting elements ED2 and the fourth light-emitting elements ED4, which are disposed between the second and third wall patterns WP2 and WP3. The first light-emitting elements ED1 and the third light-emitting elements ED3 may be disposed on the first and third electrodes RME1 and RME3, and the second light-emitting elements ED2 and the fourth light-emitting elements ED4 may be disposed on the second and fourth electrodes RME2 and RME4. The first light-emitting elements ED1 and the second light-emitting elements ED2 may be disposed in the lower part of the emission area EMA or near the subarea SA, and the third light-emitting elements ED3 and the fourth light-emitting elements ED4 may be disposed in the upper part of the emission area EMA.

The light-emitting elements ED may be classified not necessarily by their locations in the emission area EMA, but by how they are connected to the connecting electrodes CNE. A set of connecting electrodes CNE that both end portions of each of the light-emitting elements ED is in contact with may vary depending on the layout of the connecting electrodes CNE, and the light-emitting elements ED may be classified in accordance with which of the connecting electrodes CNE they are each in contact with.

The connecting electrodes CNE may include first and second electrodes CNE1 and CNE2, which are disposed on the first and second electrode RME1 and RME2, respectively, and may further include third, fourth, and fifth connecting electrodes CNE3, CNE4, and CNE5, which are each disposed on multiple electrodes RME.

In the embodiment of FIGS. 30 through 33, unlike in the embodiment of FIGS. 24 through 26, the first and second connecting electrodes CNE1 and CNE2 may be relatively short in the first direction DR1. The first and second connecting electrodes CNE1 and CNE2 may be disposed on the lower side of the center of the emission area EMA. The first and second connecting electrodes CNE1 and CNE2 may be disposed not only in the emission area EMA, but also in the subarea SA beyond the emission area EMA, and may be in direct contact with the third conductive layer through the contacts (CT1 and CT2), which are formed in the subarea SA. The first connecting electrode CNE1 may be in direct contact with a conductive pattern through a first contact CT1, which penetrates the second insulating layer PAS2, a via layer VIA, and the first passivation layer PV1, and the second connecting electrode CNE2 may be in direct contact with a second voltage line VL2 through a second contact CT2, which penetrates the second insulating layer PAS2, the via layer VIA, and the first passivation layer PV1. The first and second connecting electrodes CNE1 and CNE2 may include parts extending in the second direction DR2, depending on the locations of the conductive pattern CDP1 and the second voltage line VL2. The parts of the first and second connecting electrodes CNE1 and CNE2 that extend in the second direction DR2 may be in contact with the conductive pattern CDP1 and the second voltage line VL2 through the contacts (CT1 and CT2).

The third connecting electrode CNE3 may include a first electrode extension CN_E1, which is disposed on the third electrode RME3, a second electrode extension CN_E2, which is disposed on the first electrode RME1, and a first electrode connector CN_B1, which connects the first and second electrode extensions CN_E1 and CN_E2. The first electrode extension CN_E1 may be spaced apart from, and face, the first connecting electrode CNE1 in the second direction DR2, and the second electrode extension CN_E2 may be spaced apart from, and face, the first connecting electrode CNE1 in the first direction DR1. The first electrode extension CN_E1 may be disposed in the lower part of the emission area EMA, and the second electrode extension CN_E2 may be disposed in the upper part of the emission area EMA. The first and second electrode extensions CN_E1 and CN_E2 may be disposed in the emission area EMA. The first electrode connector CN_B1 may be disposed on the first and third electrodes RME1 and RME3, in the middle of the emission area EMA. The third connecting electrode CNE3 may generally extend in the first direction DR1, may be bent in the second direction DR2, and may extend back in the first direction DR1.

The fourth connecting electrode CNE4 may include a third electrode extension CN_E3, which is disposed on the fourth electrode RME4, a fourth electrode extension CN_E4, which is disposed on the second electrode RME2, and a second electrode connector CN_B2, which connects the third and fourth electrode extensions CN_E3 and CN_E4. The third electrode extension CN_E3 may be spaced apart from, and face, the second connecting electrode CNE2 in the second direction DR2, and the fourth electrode extension CN_E4 may be spaced apart from, and face, the second connecting electrode CNE2 in the first direction DR1. The third electrode extension CN_E3 may be disposed in the lower part of the emission area EMA, and the fourth electrode extension CN_E4 may be disposed in the upper part of the emission area EMA. The third and fourth electrode extensions CN_E3 and CN_E4 may be disposed in the emission area EMA. The second electrode connector CN_B2 may be disposed on the second and fourth electrodes RME2 and RME4, in the middle of the emission area EMA. The fourth connecting electrode CNE4 may generally extend in the first direction DR1, may be bent in the second direction DR2, and may extend back in the first direction DR1.

The fifth connecting electrode CNE5 may include a fifth electrode extension CN_B5, which is disposed on the third electrode RME3, a sixth electrode extension CN_E6, which is disposed on the fourth electrode RME4, and a third electrode connector CN_B3, which connects the fifth and sixth electrode extensions CN_B5 and CN_E6. The fifth electrode extension CN_B5 may be spaced apart from, and face, the second electrode extension CN_E2 of the third connecting electrode CNE3 in the second direction DR2, and the sixth electrode extension CN_E6 may be spaced apart from, and face, the fourth electrode extension CN_E4 of the fourth connecting electrode CNE4 in the second direction DR2. The fifth and sixth electrode extensions CN_B5 and CN_E6 may be disposed in the upper part of the emission area EMA, and the third electrode connector CN_B3 may be disposed over the second, third, and fourth electrodes RME2, RME3, and RME4. The fifth connecting electrode CNE5 may be disposed to surround the fourth electrode extension CN_E4 of the fourth connecting electrode CNE4 in a plan view.

The first and second connecting electrodes CNE1 and CNE2 may be first-type connecting electrodes connected to or directly connected to the third conductive layer, and the third, fourth, and fifth connecting electrodes CNE3, CNE4, and CNE5 may be second-type connecting electrodes not in contact with the third conductive layer.

The first and second connecting electrodes CNE1 and CNE2 may be connected to or directly connected to the third conductive layer through the contacts (CT1 and CT2), and the third, fourth, and fifth connecting electrodes CNE3, CNE4, and CNE5 may not be connected to the third conductive layer. The third, fourth, and fifth connecting electrodes CNE3, CNE4, and CNE5 may not be connected to the third conductive layer and may be in contact with the light-emitting elements ED to form electrical connecting circuitry for the light-emitting elements ED, together with the first and second connecting electrodes CNE1 and CNE2. The electrodes RME may not be connected to the connecting electrodes CNE and may not be electrically connected to the light-emitting elements ED.

Also, the second-type connecting electrodes may be classified into different types depending on their shape in a plan view. For example, each of the third and fourth connecting electrodes CNE3 and CNE4 may have electrode extensions thereof extend in the first direction DR1, but not side-by-side with each other in the second direction DR2, and the fifth connecting electrode CNE5 may have electrode extensions thereof extend in the first direction DR1, side-by-side with each other in the second direction DR2. The third and fourth connecting electrodes CNE3 and CNE4 may generally extend in the first direction DR1 and may be bent, and the fifth connecting electrode CNE5 may surround part of another connecting electrode CNE.

As already mentioned above, the light-emitting elements ED may be classified into different types depending on which of the connecting electrodes CNE they are each in contact with.

The first light-emitting elements ED1 and the second light-emitting elements ED2 may have their first end portions in contact with the first-type connecting electrodes and their second end portions in contact with the second-type connecting electrodes. The first light-emitting elements ED1 may be in contact with the first and third connecting electrodes CNE1 and CNE3, and the second light-emitting elements ED2 may be in contact with the second and fourth connecting electrodes CNE2 and CNE4. The third light-emitting elements ED3 and the fourth light-emitting elements ED4 may have their first end portions in contact with the second-type connecting electrodes and their second end portions in contact with the second-type connecting electrodes. The third light-emitting elements ED3 may be in contact with the third and fifth connecting electrodes CNE3 and CNE5, and the fourth light-emitting elements ED4 may be in contact with the fourth and fifth connecting electrodes CNE4 and CNE5.

The light-emitting elements ED can be connected in series to one another through the connecting electrodes CNE. As the display device 10 may include a relatively large number of light-emitting elements ED in each subpixel SPXn and forms serial connections between the light-emitting elements ED, the amount of light emitted per unit area can be further increased.

Figure 34:
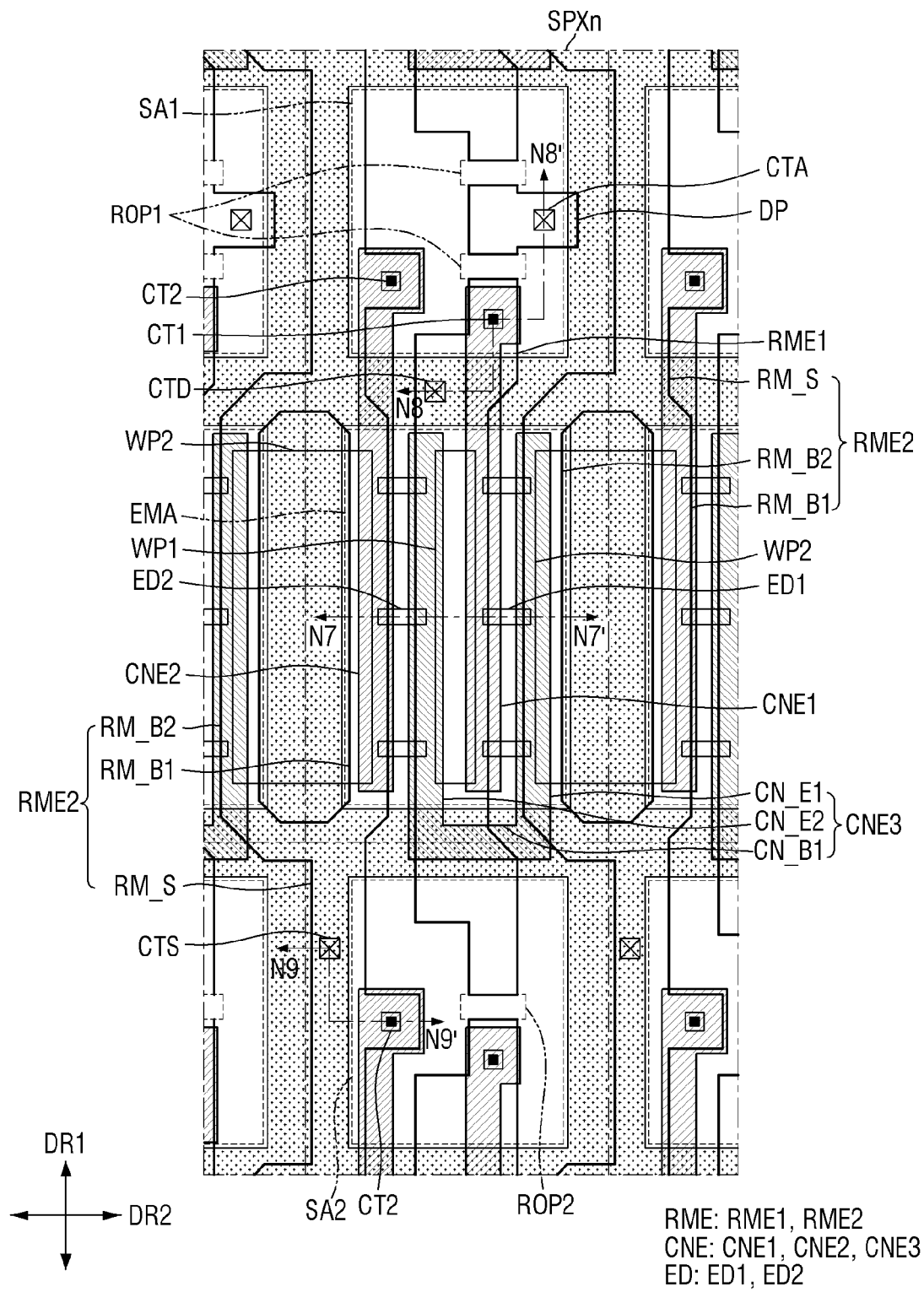
FIG. 34 is a schematic plan view of a subpixel of a display device according to an embodiment.
Figure 35:
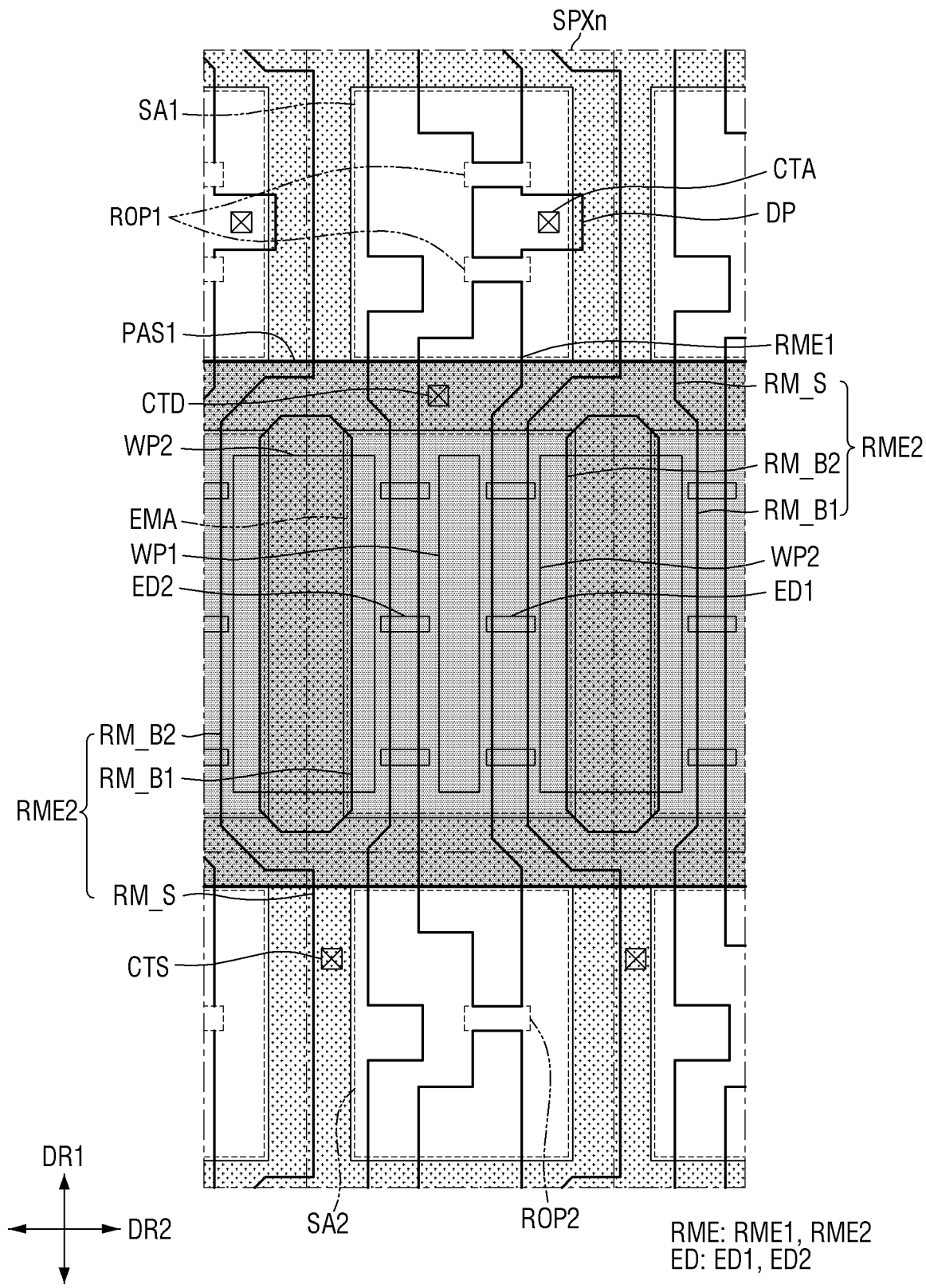
FIG. 35 is a schematic plan view illustrating a first insulating layer in the subpixel of FIG. 34.
Figure 36:
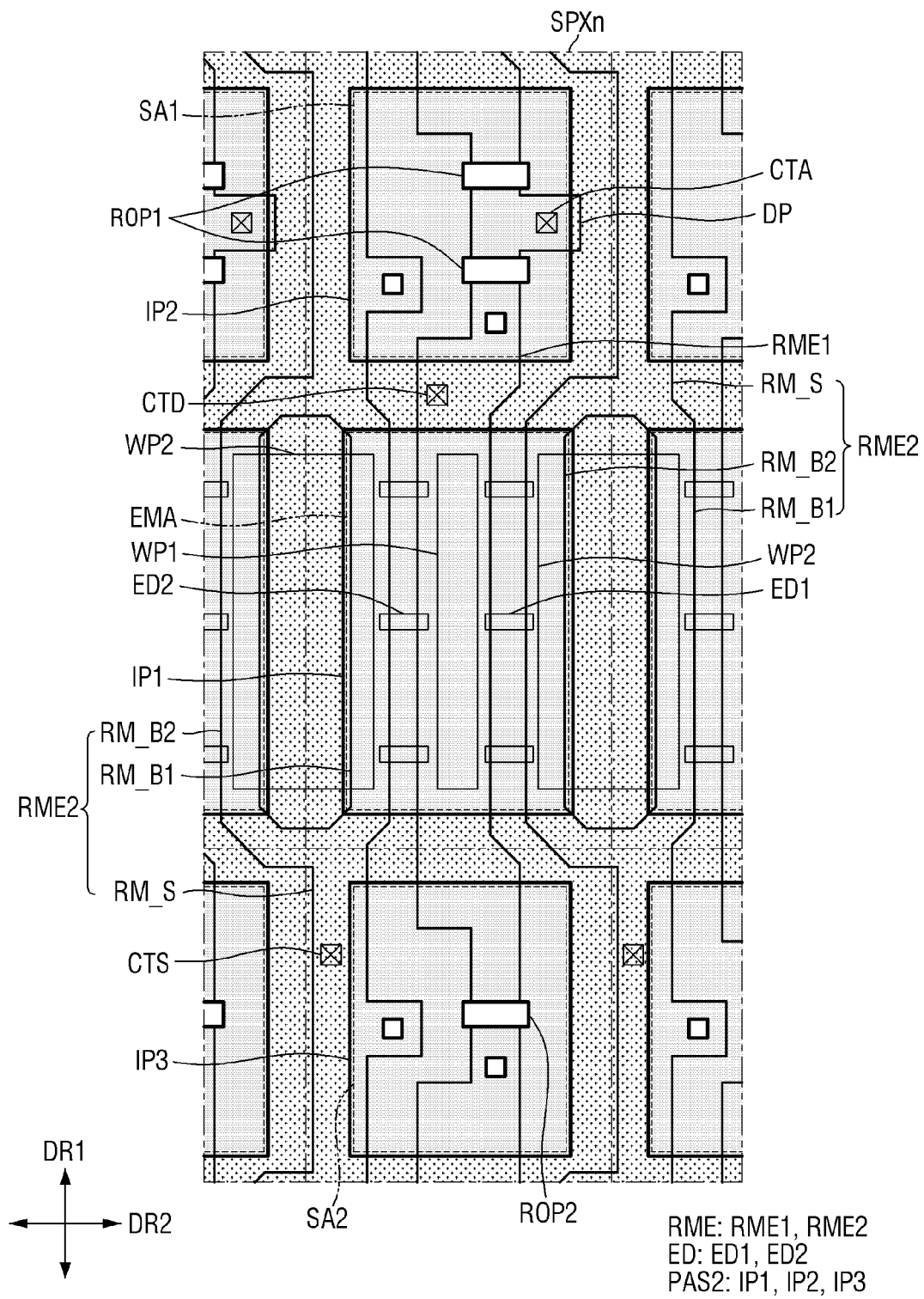
FIG. 36 is a schematic plan view illustrating a second insulating layer in the subpixel of FIG. 34.
Figure 37:
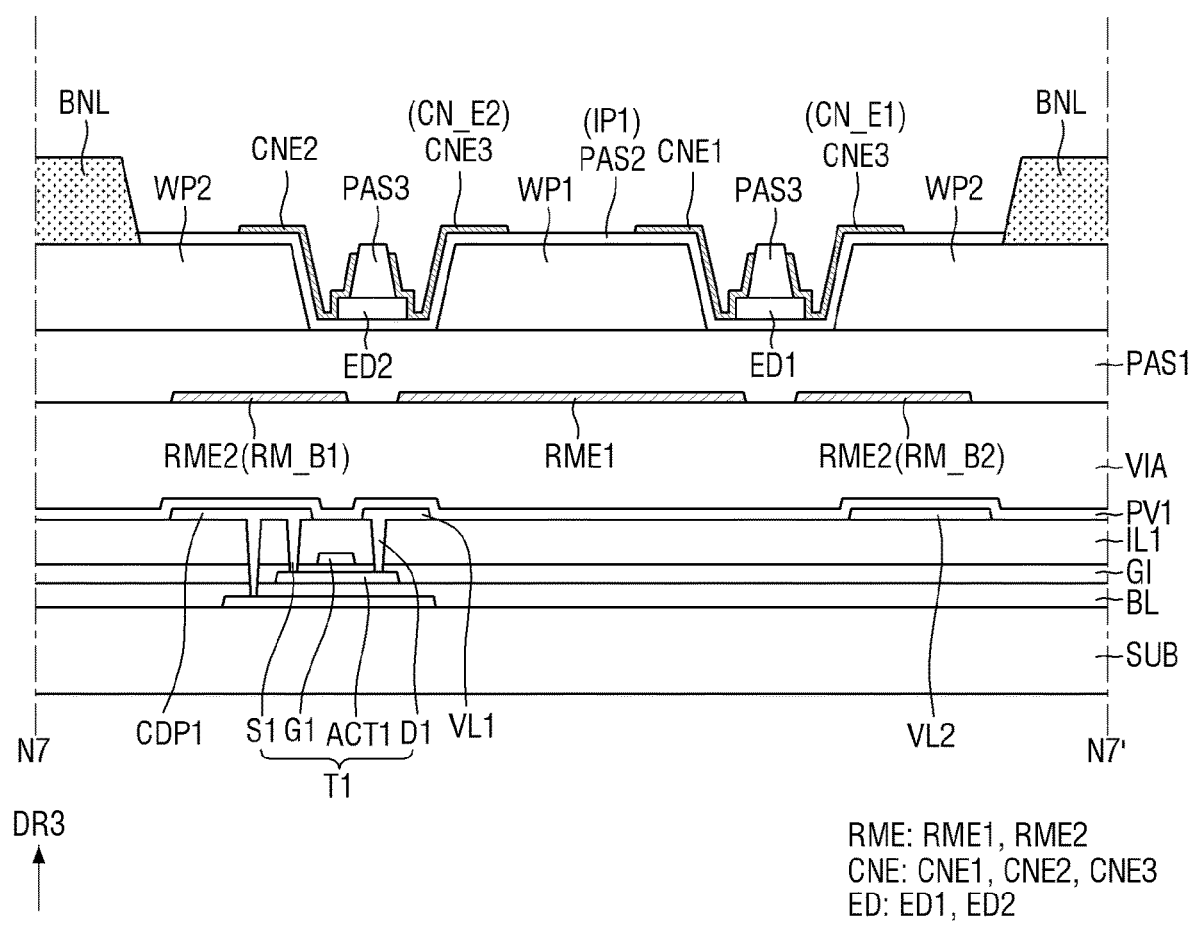
FIG. 37 is a schematic cross-sectional view taken along line N7-N7' of FIG. 34.
Figure 38:
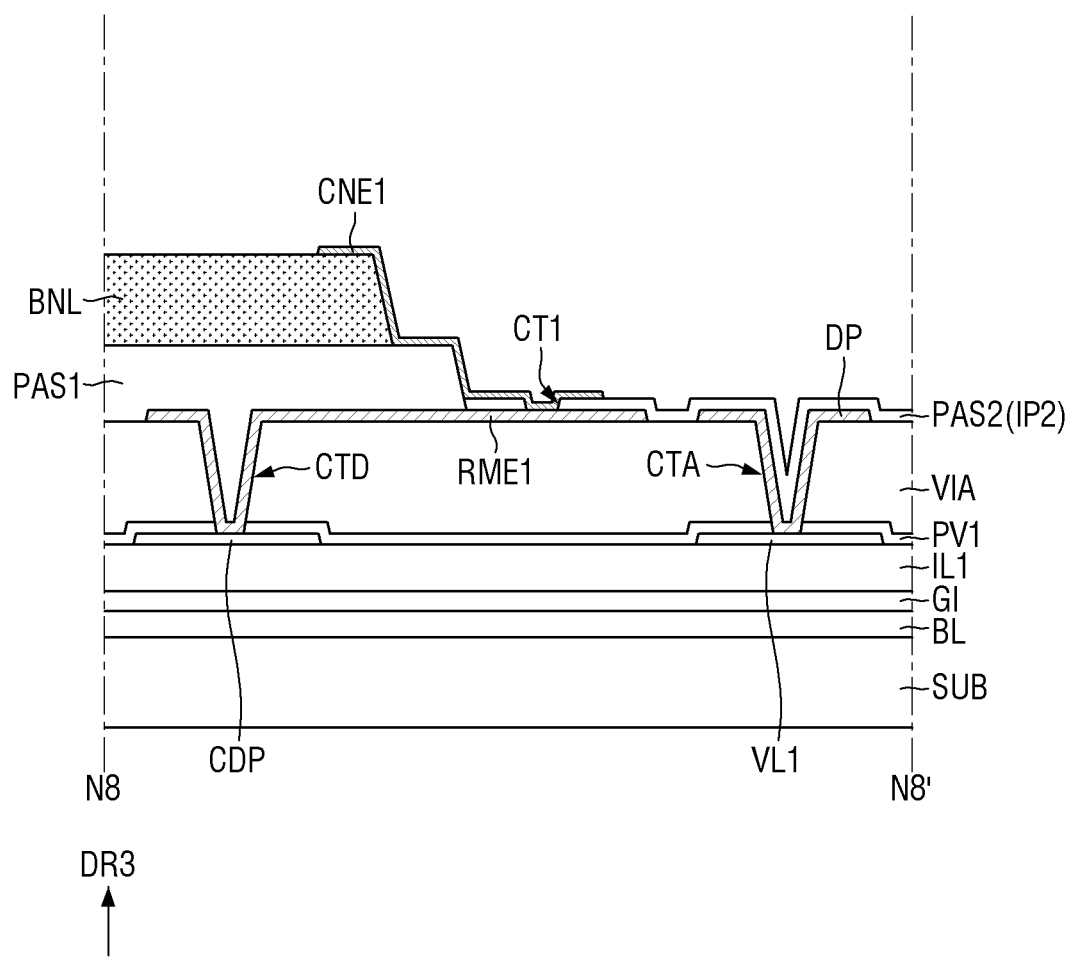
FIG. 38 is a schematic cross-sectional view taken along line N8-N8' of FIG. 34.
Figure 39:
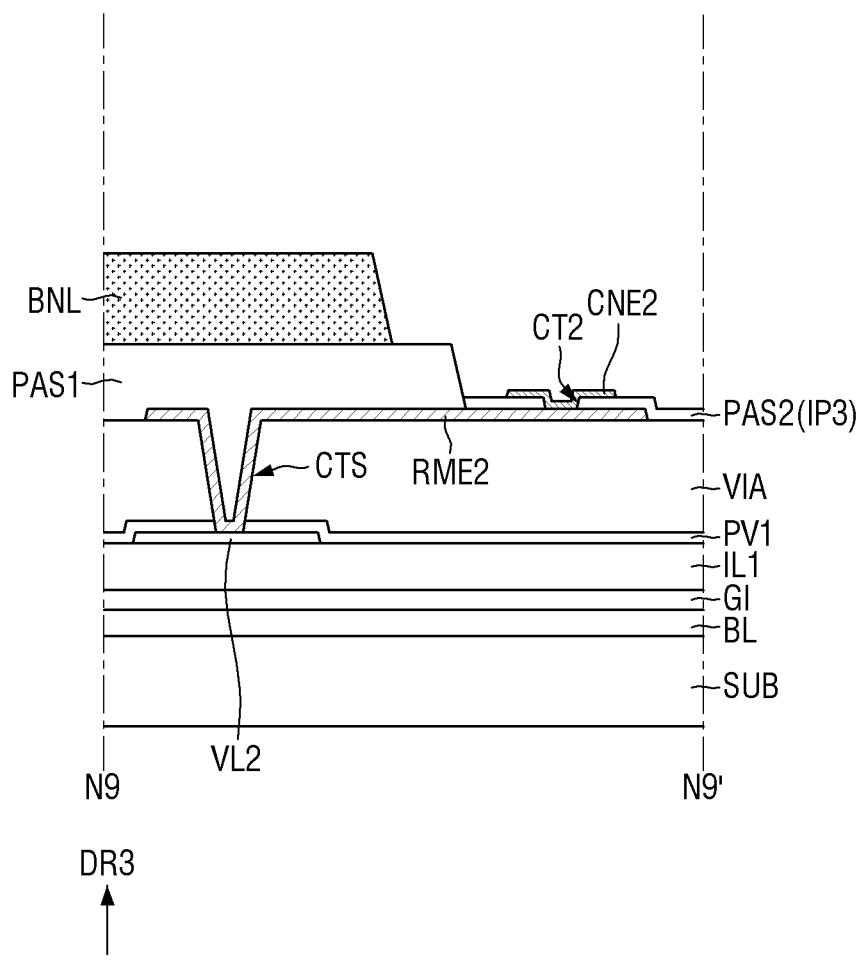
FIG. 39 is a schematic cross-sectional view taken along line N9-N9' of FIG. 34.

FIG. 34 is a schematic plan view of a subpixel of a display device according to an embodiment. FIG. 35 is a schematic plan view illustrating a first insulating layer in the subpixel of FIG. 34. FIG. 36 is a schematic plan view illustrating a second insulating layer in the subpixel of FIG. 34. FIG. 37 is a schematic cross-sectional view taken along line N7-N7' of FIG. 34. FIG. 38 is a schematic cross-sectional view taken along line N8-N8' of FIG. 34. FIG. 39 is a schematic cross-sectional view taken along line N9-N9' of FIG. 34.

FIG. 34 illustrates the layout of electrodes RME, wall patterns (WP1 and WP2), a bank layer BNL, light-emitting elements ED, and connecting electrodes CNE in a subpixel SPXn. FIG. 35 illustrates the layout of the electrodes RME, the wall patterns (WP1 and WP2), the bank layer BNL, and a first insulating layer PAS1 in the subpixel SPXn, and FIG. 36 illustrates the layout of the electrodes RME, the wall patterns (WP1 and WP2), the bank layer BNL, and a second insulating layer PAS2 in the subpixel SPXn. FIG. 37 illustrates a schematic cross-sectional view taken across both end portions of first and second light-emitting elements ED1 and ED2, which are each disposed on different electrodes RME.

The embodiment of FIGS. 34 through 39 differs from the previous embodiments in the structures of the electrodes RME, the connecting electrodes CNE, and the wall patterns (WP1 and WP2). The embodiment of FIGS. 34 through 39 will hereinafter be described, focusing for example on the differences with the previous embodiments.

Referring to FIGS. 34 through 39, the electrodes RME may include a first electrode RME1, which is disposed in the middle of the subpixel SPXn, and second electrodes RME2, which are disposed not only in the subpixel SPXn, but also in other subpixels SPXn. The first electrode RME1 and the second electrodes RME2 may generally extend in a first direction DR1 and may have different shapes in an emission area EMA.

The first electrode RME1 may be disposed in the middle of the subpixel SPXn, and part of the first electrode RME1 in an emission area EMA may be disposed on a first wall pattern WP1. The first electrode RME1, like its counterpart of FIG. 3, may extend in the first direction DR1 from a first subarea SA1 of the subpixel SPXn to a second subarea SA2 of another subpixel SPXn. The width, in a second direction DR2, of the first electrode RME1 may vary, and at least part of the first electrode RME1 that overlaps the first wall pattern WP1, in the emission area EMA, may have a larger width than the first wall pattern WP1.

The second electrodes RME2 may include parts that extend in the first direction DR1 and parts that branch off near the emission areas EMA. In one example, the second electrodes RME2 may include electrode stems RM_S, which extend in the first direction DR1, and electrode branches (RM_B1 and RM_B2), which branch off of the electrode stems RM_S to be bent in the second direction DR2 and extend back in the first direction DR1. The electrode stems RM_S may be disposed on sides, in the second direction DR2, of the first subarea SA1 to overlap parts of the bank layer BNL that extend in the first direction DR1. The electrode branches (RM_B1 and RM_B2) may branch off of the electrode stems RM_S, which are disposed not only on the parts of the bank layer BNL that extend in the first direction DR1, but also on parts of the bank layer BNL that extend in the second direction DR2, and may be bent from both sides, in the second direction DR2, of their respective electrode stems RM_S. The electrode branches (RM_B1 and RM_B2) may be arranged (or disposed) along the first direction DR1 over two different emission areas EMA and may be bent to be incorporated into, and connected to, the electrode stems RM_S. For example, the electrode branches (RM_B1 and RM_B2) may branch off of the electrode stems RM_S, above the emission area EMA, and may be connected together, below the emission area EMA.

The electrode branches (RM_B1 and RM_B2) of the subpixel SPXn of FIG. 34 may include first and second electrode branches RM_B1 and RM_B2, which are disposed on the left and right sides, respectively, of the first electrode RME1. Sets of first and second electrode branches RM_B1 and RM_B2 of one second electrode RME2 may be disposed in the emission areas EMA of multiple subpixels SPXn that are adjacent to one another in the second direction DR2, and first and second electrode branches RM_B1 and RM_B2 from two different second electrodes RME2 may be disposed in one subpixel SPXn. The first electrode branch RM_B1 of the subpixel SPXn of FIG. 34 may be disposed on the left side of the first electrode RME1, and the second electrode branch RM_B2 of the subpixel SPXn of FIG. 34 may be disposed on the right side of the first electrode RME1.

The electrode branches (RM_B1 and RM_B2) of the subpixel SPXn of FIG. 34 may overlap sides of second wall patterns WP2. The first electrode branch RM_B1 may partially overlap a second wall pattern WP2 on the left side of the first wall pattern WP1, and the second electrode branch RM_B2 may partially overlap a second wall WP2 on the right side of the first wall pattern WP1. The first electrode RME1 may be spaced apart from, and face, two different electrode branches (RM_B1 and RM_B2) of two different electrodes RME2, and the distance between the first electrode RME1 and the electrode branches (RM_B1 and RM_B2) may be less than the distance between the wall patterns (WP1 and WP2).

Also, the width, in the first direction DR2, of the first electrode RME1 may be greater than the widths of the electrode stem RM_S and the electrode branches (RM_B1 and RM_B2). The first electrode RME1 may have a greater width than the first wall pattern WP1 and cover or overlap both side surfaces of the first wall pattern WP1. On the contrary, the second electrodes RME2 may be formed to have a relatively small width, and thus, the electrode branches (RM_B1 and RM_B2) may overlap only one side surface or a side surface of their respective second wall patterns WP2.

The first electrode RME1 may be in contact with a conductive pattern CDP1 of a third conductive layer through a first contact hole CTD, in an area that overlaps the parts of the bank layer BNL that extend in the second direction DR2. The electrode stem RM_S may be in contact with a second voltage line VL2 of the third conductive layer through a second contact hole CTS. Part of the first electrode RME1 that may be disposed in the first subarea SA1 may overlap a first contact CT1, and each of the second electrodes RME2 may include protruding parts that protrude in the second direction DR2 from the electrode stem RM_S to be disposed in different subareas SA. Each of the protruding parts of each of the second electrodes RME2 may overlap a second contact CT2.

The first electrode RME1 may be disconnected in the first subarea SA1 by first separation parts ROP1 and in a second subarea SA2 by a separation part ROP2, but the second electrodes RME2 may not be disconnected in the subareas SA1 and SA2. Each of the second electrodes RME2 may include electrode stems RM_S and sets of electrode branches (RM_B1 and RM_B2) and may extend in the first direction DR1, and the second electrodes RME2 may branch off near the emission area EMA of each subpixel SPXn. The first electrode RME1 may be disposed between separation parts ROP of two different subareas SA, for example, between one of the first separation parts ROP1 of the first subarea SA1 and the second separation part ROP2 of the second subarea SA2, across the emission area EMA of the subpixel SPXn of FIG. 34.

The display area 10 may further include, in the subpixel SPXn of FIG. 34, a dummy pattern DP, which is disposed in the first subarea SA1, between the first electrode RME1 and a first electrode RME1 of another subpixel SPXn. No dummy pattern DP may be disposed in the second subarea SA, and the first electrode RME1 of the subpixel SPXn may be spaced apart from a first electrode RME1 of a lower neighboring subpixel SPXn, in the first direction DR1, of the subpixel SPXn. In the subpixel SPXn of FIG. 34, the first subarea SA1 where the dummy pattern DP is disposed may be arranged (or disposed) on the upper side of the emission area EMA, and the second subarea SA2 may be disposed on the lower side of the emission area EMA. On the contrary, in the lower neighboring subpixel SPXn of the subpixel SPXn of FIG. 34, the first subarea SA1 where the dummy pattern DP is disposed may be arranged (or disposed) on the lower side of the emission area EMA, and the second subarea SA2 may be disposed on the upper side of the emission area EMA.

The first electrode RME1 may be spaced apart from the dummy pattern DP by one of the first separation parts ROP1 in the first subarea SA1. Two first separation parts ROP1 may be provided in the first subarea SA1, and the dummy pattern DP may be spaced apart from the first electrode RME1 by the lower first separation part ROP1, and may be spaced apart from a first electrode RME1 of an upper neighboring subpixel SPXn, in the first direction DR1, of the subpixel SPXn of FIG. 34 by the upper first separation part ROP1. Only one second separation part ROP2 may be provided in the second subarea SA2, and different first electrodes RME1 may be spaced apart from one another in the first direction DR1.

The dummy pattern DP may be connected to a first voltage line VL1 of the third conductive layer through a third contact hole CTA, which penetrates a via layer VIA and a first passivation layer PV1. The first electrode RME1 may be formed to be connected to the dummy pattern DP, and an electrical signal for arranging light-emitting elements ED may be applied from the first voltage line VL1 to the first electrode RME1. The arrangement of the light-emitting elements ED may be performed by applying signals to the first and second voltage lines VL1 and VL2, and the signals may be transmitted to the first electrode RME1 and the second electrodes RME2.

The second and third contact holes CTS and CTS may have different layouts. The second contact hole CTS may be disposed in parts of the bank layer BNL that surround the second subarea SA, and the third contact hole CTA may be disposed in the first subarea SAL. The locations of the second and third contact holes CTS and CTA may be determined in consideration that the second and third contact holes CTS and CTA expose the top surfaces of different voltage lines.

The first insulating layer PAS1 may be arranged (or disposed) into a similar structure to its counterparts of the previous embodiments. The first insulating layer PAS1 may be disposed to cover or overlap parts of the electrodes RME in the emission area EMA and may not be disposed in the first and second subareas SA1 and SA2.

The wall patterns (WP1 and WP2) may extend in the first direction DR1, may have different widths in the second direction DR2, and at least one of the wall patterns (WP1 and WP2) may be disposed over two subpixels SPXn that are adjacent to each other in the second direction DR2. For example, the wall patterns (WP1 and WP2) may include the first wall pattern WP1, which is disposed in the emission area EMA of the subpixel SPXn of FIG. 34, and the second wall patterns WP2, which are each disposed over the emission areas EMA of two different adjacent subpixels SPXn including the subpixel SPXn of FIG. 34.

The first all pattern Wp1 may be disposed in the middle of the emission area EMA of the subpixel SPXn of FIG. 34, and the second wall patterns WP2 may be spaced apart from each other with the first wall pattern WP1 interposed therebetween. The first wall pattern WP1 and the second wall patterns WP2 may be alternately arranged (or disposed) in the second direction DR2. The light-emitting elements ED may be disposed in the gaps between the first wall pattern WP1 and the second wall patterns WP2.

The first wall pattern WP1 and the second wall patterns WP2 may have a same length in the first direction DR1 and different widths in the second direction DR2. The parts of the bank layer BNL that extends in the first direction DR1 may overlap the second wall patterns WP2 in a thickness direction. The first wall pattern WP1 may be disposed to overlap the first electrode RME1, and the second wall patterns WP2 may be disposed to overlap the electrode branches (RM_B1 and RM_B2) of the second electrodes RME2 and the bank layer BNL.

The bank layer BNL may surround the emission area EMA and the first and second areas SA1 and SA2. An area surrounded by the bank layer BNL may be divided. The bank layer BNL may be the same as its counterparts of the previous embodiments in that the bank layer BNL surrounds different subareas, for example, the first and second subareas SA1 and SA2.

The second insulating layer PAS2 may have substantially the same layout as its counterparts of the previous embodiments. The second insulating layer PAS2 may include the first insulating pattern IP1, which is disposed in the emission area EMA, and second and third insulating patterns IP2 and IP3, which are disposed in the first and second subareas SA1 and SA2, respectively. The first insulating pattern IP1 may be disposed to cover or overlap parts of the wall patterns (WP1 and WP2) in the emission area EMA and parts of the electrodes RME in the emission area EMA, and the second insulating pattern IP2 may be disposed to cover or overlap parts of the electrodes RME in the first subarea SA1 and the dummy pattern DP. The third insulating pattern IP3 may cover or overlap parts of the electrodes RME in the second subarea SA. The second insulating IP2 may be disposed to cover or overlap the entire first subarea SA1 except for the contacts (CT1 and CT2) and the first separation parts ROP1, and the third insulating pattern IP3 may be disposed to cover or overlap the entire second subarea SA2 except for the contacts (CT1 and CT2) and the second separation part ROP2. As will be described later, in an embodiment where the connecting electrodes CNE are in direct contact with the electrodes RME, the contacts (CT1 and CT2) may be disposed to overlap the electrodes RME.

The light-emitting elements ED may be disposed on different electrodes RME, between different wall patterns (WP1 and WP2). The light-emitting elements ED may include first light-emitting elements ED1, which are disposed between the first electrode RME1 and the second electrode branch RM_B2 of one of the second electrode RME2, and second light-emitting elements ED2, which are disposed on the first electrode RME1 and the first electrode branch RM_B1 of the other second electrode RME2. The first light-emitting elements ED1 may be disposed on the right side of the first electrode RME1, and the second light-emitting elements ED2 may be disposed on the left side of the first electrode RME1. The first light-emitting elements ED1 may be disposed on the first electrode RME1 and one of the second electrodes RME2, and the second light-emitting elements ED2 may be disposed on the first electrode RME1 and the other second electrode RME2.

The connecting electrodes CNE may include first, second, and third connecting electrodes CNE1, CNE2, and CNE3.

The first connecting electrode CNE1 may extend in the first direction DR1 and may be disposed on the first electrode RME1. Part of the first connecting electrode CNE1 on the first wall pattern WP1 may overlap the first electrode RME1, and the first connecting electrode CNE1 may extend in the first direction DR1 from its part overlapping the first electrode RME1, beyond the bank layer BNL, and may thus be disposed even in the first subarea SA1, which is disposed on the upper side of the emission area EMA. The first connecting electrode CNE1 may be in contact with the first electrode RME1 through the first contact CT1, in the first subarea SA1.

The second connecting electrode CNE2 may extend in the first direction DR2 and may be disposed on one of the second electrodes RME2, for example, on the left second electrode RME2. Part of the second connecting electrode CNE2 on the left second wall pattern WP2 may overlap the left second electrode RME2, and the second connecting electrode CNE2 may extend in the first direction DR1 from its part overlapping the left second electrode RME2, beyond the bank layer BNL, and may thus be disposed even in the first subarea SA1, which is disposed on the upper side of the emission area EMA. The second connecting electrode CNE2 may be in contact with the left second electrode RME2 through the second contact CT2, in the first subarea SA1.

The connecting electrodes CNE of the subpixel SPXn of FIG. 34 may be in contact with electrodes RME of the lower neighboring subpixel SPXn of the subpixel SPXn of FIG. 34 through the contacts (CT1 and CT2) of the second subarea SA2.

The third connecting electrode CNE3 may include first and second electrode extensions CN_E1 and CN_E2, which extend in the first direction DR1, and a first electrode connector CN_B1, which connects the first and second electrode extensions CN_E1 and CN_E2. The first electrode extension CN_E1 may face the first connecting electrode CNE1, in the emission area EMA, and may be disposed on the second electrode branch RM_B2 of the right second electrode RME2, and the second electrode extension CN_E2 may face the left second electrode RME2, in the emission area EMA, and may be disposed on the first electrode RME1. The first electrode connector CN_B1 may extend in the second direction DR2, on part of the bank layer BNL on the lower side of the emission area EMA, to connect the first and second electrode extensions CN_E1 and CN_E2. The third connecting electrode CNE3 may be disposed in the emission area EMA and on the bank layer BNL and may not be connected to or directly connected to the electrodes RME. The second electrode branch RM_B2 below the first electrode extension CN_E1 may be electrically connected to the second voltage line VL2, and a second power supply voltage applied to the second electrode branch RM_B2 may not be transmitted to the third connecting electrode CNE3.

The display device 10 may further include a color control structure (TPL, WCL1, and WCL2 of FIG. 40) and color filter layers (CFL1, CFL2, and CFL3), which are disposed on the light-emitting elements ED. Light emitted by the light-emitting elements ED may be output through the color control structure (TPL, WCL1, and WCL2) and the color filter layers (CFL1, CFL2, and CFL3), and even if light-emitting elements ED of a same type may be disposed in each subpixel SPXn, the color of light output may differ from one subpixel SPXn to another subpixel SPXn.

Figure 40:
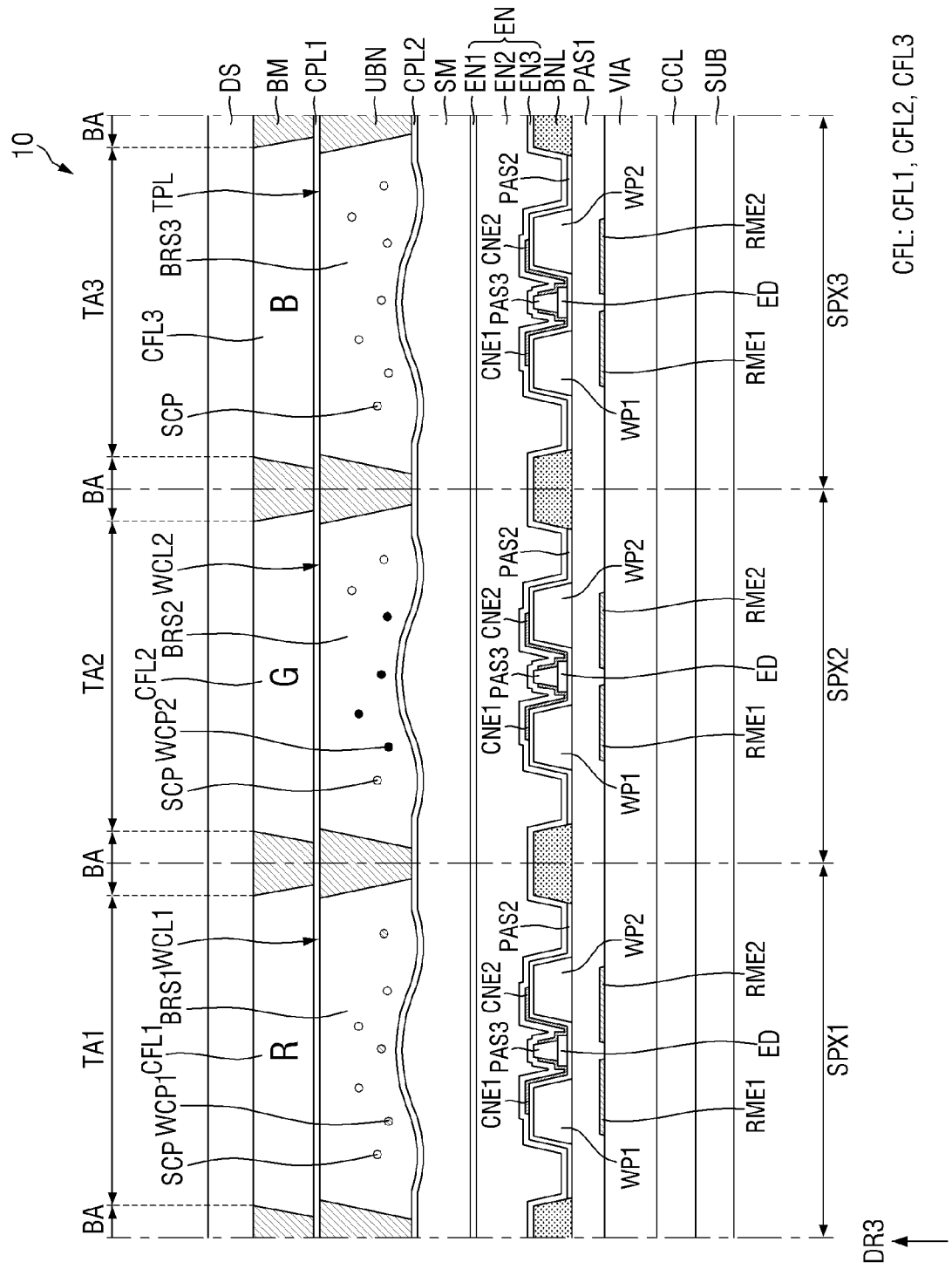
FIG. 40 is a schematic cross-sectional view of a display device according to an embodiment.

FIG. 40 is a schematic cross-sectional view of a display device according to an embodiment.

Referring to FIG. 40, a display device 10 may include a second substrate DS, which faces a first substrate SUB, and color filter layers (CFL1, CFL2, and CFL3) and a color control structure (TPL, WCL1, and WCL2), which are disposed on one surface or a surface of the second substrate DS. The display device 10 may further include encapsulation layers EN, which are provided on the first substrate SUB to be disposed on third insulating layers PAS3 and connecting electrodes (CNE1 and CNE2). The first and second substrates SUB and DS may be bonded together via a sealing member SM.

The encapsulation layers EN may be disposed on light-emitting elements ED to cover or overlap the third insulating layers PAS3 and the connecting electrodes (CNE1 and CNE2). The encapsulation layers EN may be disposed on the entire surface of the first substrate SUB and may completely cover or overlap elements disposed on the first substrate SUB.

The encapsulation layers EN may include first, second, and third encapsulation layers EN1, EN2, and EN3, which may be sequentially stacked each other on the third insulating layers PAS3. The first and third encapsulation layers EN1 and EN3 may include an inorganic insulating material, and the second encapsulation layer EN2 may include an organic insulating material. For example, the first and third encapsulation layers EN1 and EN3 may include at least one of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride ($SiO_xN_y$), and lithium fluoride, and the second encapsulation layer EN2 may include at least one of an acrylic resin, a methacrylic resin, polyisoprene, a vinyl resin, an epoxy resin, a urethane resin, a cellulose resin, and a perylene resin. The structures and the materials of the encapsulation layers (EN1, EN2, and EN3) are not particularly limited but may vary.

The color filter layers (CFL1, CFL2, and CFL3) and the color control structure (TPL, WCL1 and WCL2) of the second substrate DS may be disposed on the encapsulation layers EN. The color filter layers (CFL1, CFL2, and CFL3) an the color control structure (TPL, WCL1, and WCL2) may be formed on one surface or a surface of the second substrate DS, and the second substrate DS may be bonded to the first substrate SUB where the light-emitting elements ED are disposed, via the sealing member SM.

The display device 10 may include light-transmitting areas (TA1, TA2, and TA3, which output light due to the presence of the color filter layers (CFL1, CFL2, and CFL3), and light-blocking areas BA, which does not output light between the light-transmitting areas (TA1, TA2, and TA3). The light-transmitting areas (TA1, TA2, and TA3) may be positioned to correspond to parts of emission areas EMA of first, second, and third subpixels SPX1, SPX2, and SPX3, and the light-blocking areas BA may account for areas other than the light-transmitting areas (TA1, TA2, and TA3). As will be described later, the light-transmitting areas (TA1, TA2, and TA3) and the light-blocking areas BA may be separated by a light-blocking member BM.

The second substrate DS may be spaced apart from, and face, the first substrate SUB. The second substrate DS may be formed of a material that transmits light therethrough. In an embodiment, the second substrate DS may be a glass substrate or a plastic substrate. For example, the second substrate DS may further include a separate layer such as, for example, an insulating layer (for example, an inorganic film) on the glass substrate or the plastic substrate. Although not specifically illustrated, light-transmitting areas (TA1, TA2, and TA3) and light-blocking areas BA may also be defined on the second substrate DS.

The light-blocking member BM may be disposed on a surface of the second substrate DS that faces the first substrate SUB. The light-blocking member BM may be formed in a lattice shape to expose parts of the surface of the second substrate DS. The light-blocking member BM and a bank layer BNL may be disposed to cover or overlap subareas SA of the first, second, and third subpixels SPX1, SPX2, and SPX3 in a plan view. Areas where the light-blocking member BM is not disposed may be the light-transmitting areas (TA1, TA2, and TA3), which output light, and areas where the light-blocking member BM is disposed may be the light-blocking areas BA.

The light-blocking member BM may include an organic material that absorbs light. The light-blocking member BM may absorb external light and may thus reduce the distortion of colors that may be caused by the reflection of external light. For example, the light-blocking member BM may be formed of a material that may be used as a black matrix and may absorb all visible wavelengths.

In an embodiment, the light-blocking member BM may not be provided and may be replaced with materials that absorb light of a particular or given visible wavelength and transmitting light of another particular or given visible wavelength therethrough. The light-blocking member BM may be replaced with a color pattern that may include a same material or a similar material as at least one of the color filter layers (CFL1, CFL2, and CFL3). For example, a color pattern or a stack of color patterns including a same material or a similar material as one of the color filter layers (CFL1, CFL2, and CFL3) may be disposed in the area where the light-blocking member BM is disposed. This example will be described later.

The color filter layers (CFL1, CFL2, and CFL3) may be disposed on the surface of the second substrate DS. The color filter layers (CFL1, CFL2, and CFL3) may be disposed to correspond to areas opened by the light-blocking member, on the surface of the second substrate DS. The color filter layers (CFL1, CFL2, and CFL3) may be spaced apart from one another with the light-blocking member BM interposed therebetween, but the disclosure is not limited thereto. For example, parts of the color filter layers (CFL1, CFL2, and CFL3) may be disposed on the light-blocking member BM to be spaced apart from one another on the light-blocking member BM. By way of example, the color filter layers (CFL1, CFL2, and CFL3) may partially overlap one another.

The color filter layers (CFL1, CFL2, and CFL3) may include first, second, and third color filter layers (CFL1, CFL2, and CFL3), which are disposed in the first, second, and third subpixels SPX1, SPX2, and SPX3. The color filter layers (CFL1, CFL2, and CFL3) may be formed as island patterns to correspond to the light-transmitting areas (TA1, TA2, and TA3) or the emission areas EMA, but the disclosure is not limited thereto. For example, the color filter layers (CFL1, CFL2, and CFL3) may be formed as linear patterns.

The color filter layers (CFL1, CFL2, and CFL3) may include a colorant such as a pigment or a dye that absorb light of all wavelength ranges except for a particular or given wavelength range. The color filter layers (CFL1, CFL2, and CFL3) may be disposed in the first, second, and third subpixels SPX1, SPX2, and SPX3 to transmit therethrough only some of the light incident thereupon. The first, second, and third subpixels SPX1, SPX2, and SPX3 may selectively display light transmitted through first, second, and third color filter layers CFL1, CFL2, and CFL3, respectively. For example, the first, second, and third color filter layers CFL1, CFL2, and CFL3 may be red (R), green (G), and blue (B) filter layers, respectively. Light emitted by the light-emitting elements ED may be output through the color control structure (TPL, WCL1, and WCL2) and the color filter layers (CFL1, CFL2, and CFL3). A color filter layer CFL may generally include CFL1, CFL2, and CFL3 but the disclosure is not limited thereto.

A first capping layer CPL1 may be disposed on the color filter layers (CFL1, CFL2, and CFl3) and the light-blocking member BM. The first capping layer CPL1 may prevent the color filter layers (CFL1, CFL2, and CFL3) from being damaged or contaminated by impurities from the outside, such as moisture or the air. The first capping layer CPL1 may be formed of an inorganic insulating material.

An upper bank layer UBN may be disposed to overlap the light-blocking member BM, on one surface or a surface of the first capping layer CPL1. The upper bank layer UBN may include parts extending in a first direction DR1 and parts extending in a second direction DR2 and may thus be arranged (or disposed) in a lattice shape. The upper bank layer UBN may correspond to the light-transmitting areas (TA1, TA2, and TA3) and may surround the areas where the color filter layers (CFL1, CFL2, and CFL3) are disposed. The upper bank layer UBN may form areas in which the color control structure (TPL, WCL1, and WCL2) is disposed.

The color control structure (TPL, WCL1, and WCL2) may be disposed in the areas surrounded by the upper bank layer UBN, on the surface of the first capping layer CPL1. The color control structure (TPL, WCL1, and WCL2) may be disposed in the light-transmitting areas (TA1, TA2, and TA3) surrounded by the upper bank layer UBN and may thus form island patterns in a display area DPA, but the disclosure is not limited thereto. The color control structure (TPL, WCL1, and WCL2) may continue to extend in one direction or in a direction across multiple subpixels SPXn and may thus form linear patterns.

In a case where the light-emitting elements ED emit third-color light, for example, blue light, the color control structure (TPL, WCL1, and WCL2) may include a first wavelength conversion layer WCL1, which corresponds to a first light-transmitting area TA1 and is disposed in the first subpixel SPX1, a second wavelength conversion layer WCL2, which corresponds to a second light-transmitting area TA2 and is disposed in the second subpixel SPX2, and a light-transmitting layer TPL, which corresponds to a third light-transmitting area TA3 and is disposed in the third subpixel SPX3.

The first wavelength conversion layer WCL1 may include a first base resin BRS1 and a first wavelength conversion material WCP1, which is disposed in the first base resin BRS1. The second wavelength conversion layer WCL2 may include a second base resin BRS2 and a second wavelength conversion material WCP2, which is disposed in the second base resin BRS2. The first and second wavelength conversion layers WCL1 and WCL2 may convert blue light incident from the light-emitting elements ED and may transmit the converted light therethrough. Each of the first and second wavelength conversion layers WCL1 and WCL2 may further include a scatterer SCP, which is included in the first or second base resin BRS1 or BRS2, and the scatterer SCP may increase the efficiency of wavelength conversion.

The light-transmitting layer TPL may include a third base resin BRS3 and a scatterer SCP, which is disposed in the third base resin BRS3. The light-transmitting layer TPL may transmit blue light incident from the light-emitting elements ED therethrough while maintaining the wavelength of the blue light. The scatterer SCP of the light-transmitting layer TPL may control the path of light output through the light-transmitting layer TPL. The light-transmitting layer TPL may not include a wavelength conversion material.

The scatterers SCP of the color control structure (TPL, WCL1, and WCL2) may include particles of a metal oxide or an organic material. The metal oxide may be titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$), and the organic material may be an acrylic resin or a urethane-based resin.

The first, second, and third base resins BRS1, BRS2, and BRS3 may include a light-transmitting organic material. For example, the first, second, and third base resins BRS1, BRS2, and BRS3 may include an epoxy resin, an acrylic resin, a cardo resin, or an imide resin. The first, second, and third base resins BRS1, BRS2, and BRS3 may all be formed of a same material or a similar material, but the disclosure is not limited thereto.

The first wavelength conversion material WCP1 may convert third-color light, for example, blue light, into first-color light, for example, red light, and the second wavelength conversion material WCP2 may convert blue light into second-color light, for example, green light. The first and second wavelength conversion materials WCP1 and WCP2 may include quantum dots, quantum rods, or phosphors. The quantum dots may include group IV nanocrystals, group II-VI compound nanocrystals, group III-V compound nanocrystals, group IV-VI nanocrystals, or a combination thereof.

The layers of the color control structure (TPL, WCL1, and WCL2) are illustrated as having an uneven top surface, and the height of the color control structure (TPL, WCL1, and WCL2) may be greater in parts of the color control structure (TPL, WCL1, and WCL2) near the bank layer BNL than in the middle of the first, second, and third subpixels SPX1, SPX2, and SPX3, but the disclosure is not limited thereto. For example, the layers of the color control structure (TPL, WCL1, and WCL2) may be formed to have a flat top surface or may be formed to be higher in the middle of the first, second, and third subpixels SPX1, SPX2, and SPX3 than in parts of the color control structure (TPL, WCL1, and WCL2) near the bank layer BNL.

The light-emitting elements ED may emit light of a same color, for example, blue light, in each of the first, second, and third subpixels SPX1, SPX2, and SPX3, or the color of light emitted may differ from the first subpixel SPX1 to the second subpixel SPXn to the third subpixel SPX3. For example, light emitted from the light-emitting elements ED in the first subpixel SPX1 may be incident upon the first wavelength conversion layer WCL1, light emitted from the light-emitting elements ED in the second subpixel SPX2 may be incident upon the second wavelength conversion layer WCL2, and light emitted from the light-emitting elements ED in the third subpixel SPX3 may be incident upon the light-transmitting layer TPL. The light incident upon the first wavelength conversion layer WCL1 may be converted into red light, the light incident upon the second wavelength conversion layer WCL2 may be converted into green light, and light incident upon the light-transmitting layer TPL may be output as blue light without being wavelength-converted. Even if light-emitting elements ED emitting light of a same color are included in each of the first, second, and third subpixels SPX1, SPX2, and SPX3, the first, second, and third subpixels SPX1, SPX2, and SPX3 may emit light of different colors depending on the layout of the color control structure (TPL, WCL1, and WCL2).

The light-emitting elements ED in the first subpixel SPX1 may emit third-color light, for example, blue light, and the blue light may be incident upon the first wavelength conversion layer WCL1 through the encapsulation layers EN and the second capping layer CPL2. The first base resin BRS1 of the first wavelength conversion layer WCL1 may be formed of a transparent material, and some of the blue light incident upon the first wavelength conversion layer WCL1 may be incident upon the first capping layer CPL1 through the first base resin BRS1. At least some of the blue light incident upon the first wavelength conversion layer WCL1 may be incident upon the scatterer SCP and the first wavelength conversion material WCP1 in the first base resin BRS1 and may thus be scattered or wavelength-converted to be incident upon the first capping layer CPL1 as red light. Light incident upon the second capping layer CPL2 may be incident upon the first color filter layer CFL1, and the first color filter layer CFL1 may block the transmission of all beams of light other than red light. As a result, the first subpixel SPX1 may emit red light.

Similarly, light emitted from the light-emitting elements ED in the second subpixel SPX2 may be output as green light through the encapsulation layers EN, the second capping layer CPL2, the second wavelength conversion layer WCL2, the first capping layer CPL1, and the second color filter layer CFL2.

The light-emitting elements ED in the third subpixel SPX3 may emit third-color light, for example, blue light, and the blue light may be incident upon the light-transmitting layer TPL through the encapsulation layers EN and the second capping layer CPL2. The third base resin BRS3 of the light-transmitting layer TPL may be formed of a transparent material, and some of the blue light incident upon the light-transmitting layer TPL may be incident upon the first capping layer CPL1 through the third base resin BRS3. At least some of the blue light incident upon the first wavelength conversion layer WCL1 may be incident upon the third color filter layer CFL3 through the first capping layer CPL1, and the third color filter layer CFL3 may block the transmission of all beams of light other than blue light. As a result, the third subpixel SPX3 may emit blue light.

As the display device 10 may include the color control structure (TPL, WCL1, and WCL2) and the color filter layers (CFL1, CFL2, and CFL3) above the light-emitting elements ED, the display device 10 may display light of different colors, even in case that light-emitting elements ED of a same type are disposed in each of the first, second, and third subpixels SPX1, SPX2, and SPX3.

FIG. 40 illustrates that the color filter layers (CFL1, CFL2, and CFL3) and the color control structure (TPL, WCL1, and WCL2) are formed on the second substrate DS and may be bonded to the first substrate SUB via the sealing member SM, but the disclosure is not limited thereto. For example, the color control structure (TPL, WCL1, and WCL2) may be formed on or directly formed on the first substrate SUB. By way of example, the color control structure (TPL, WCL1, and WCL2) and the color filter layers (CFL1, CFL2, and CFL3) may both be formed on or directly formed on the first substrate SUB, in which case, the second substrate DS may not be provided.

Figure 41:
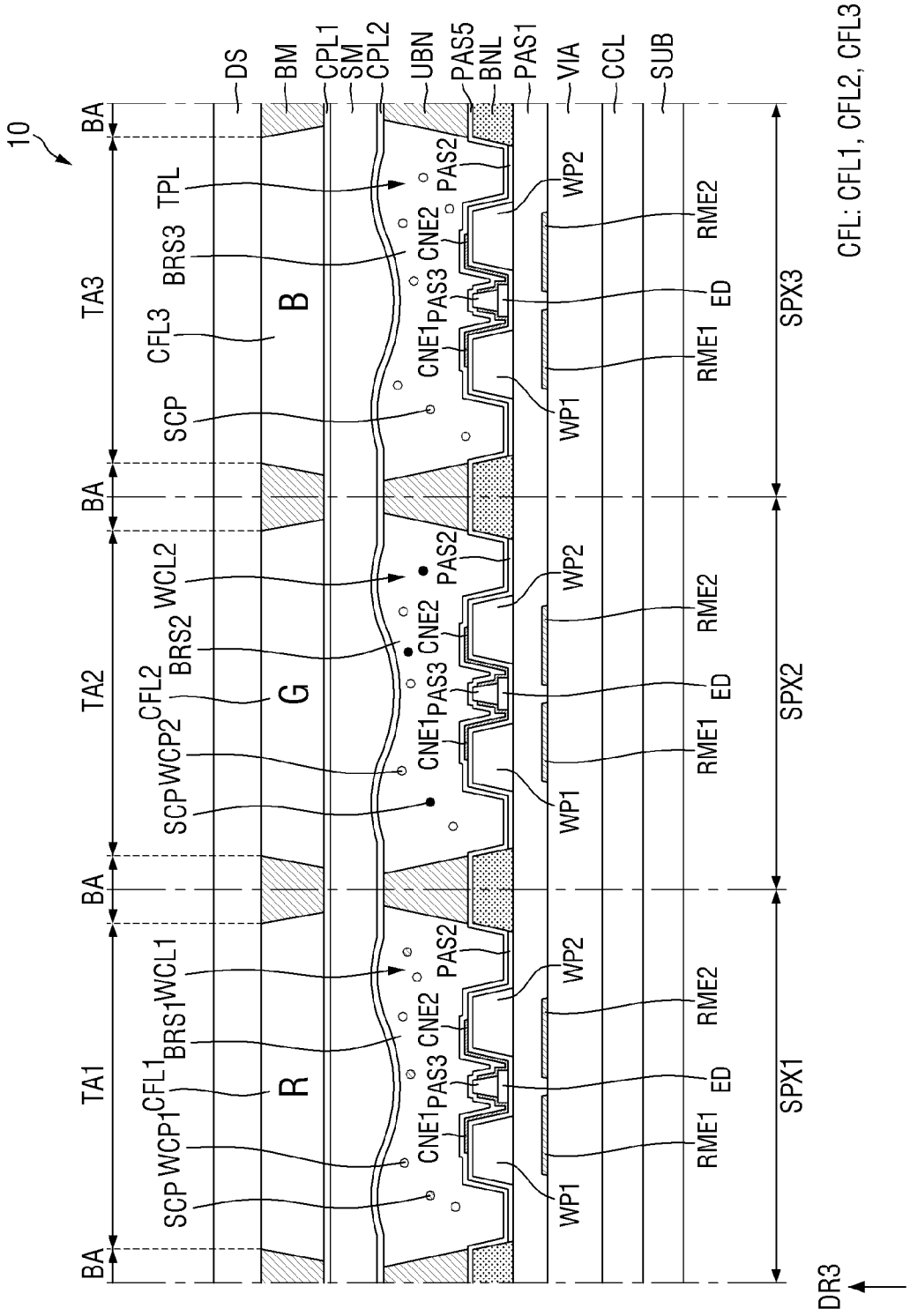
FIGS. 41 through 43 are schematic cross-sectional views of display devices according to embodiments.
Figure 42:
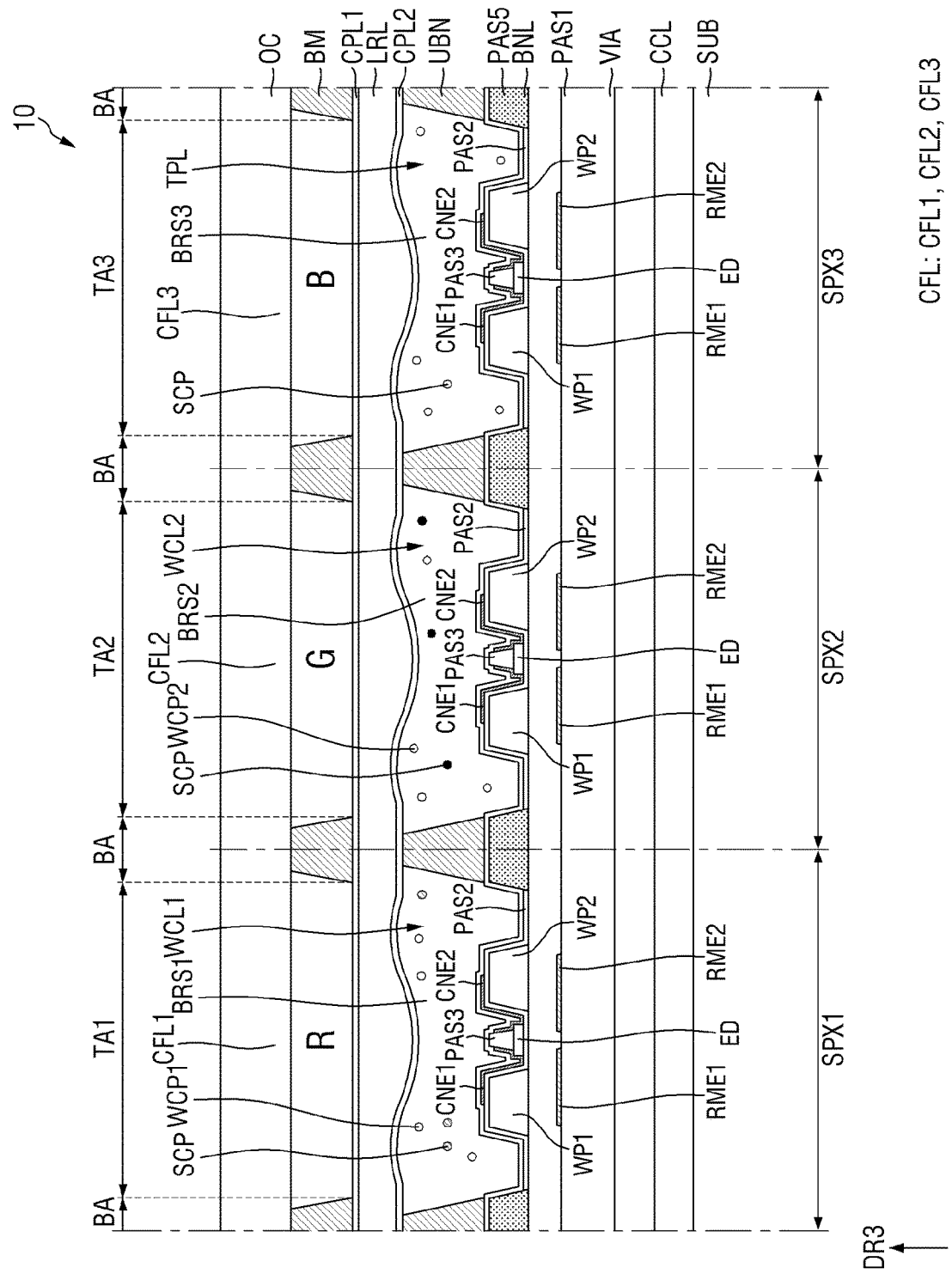
Figure 43:
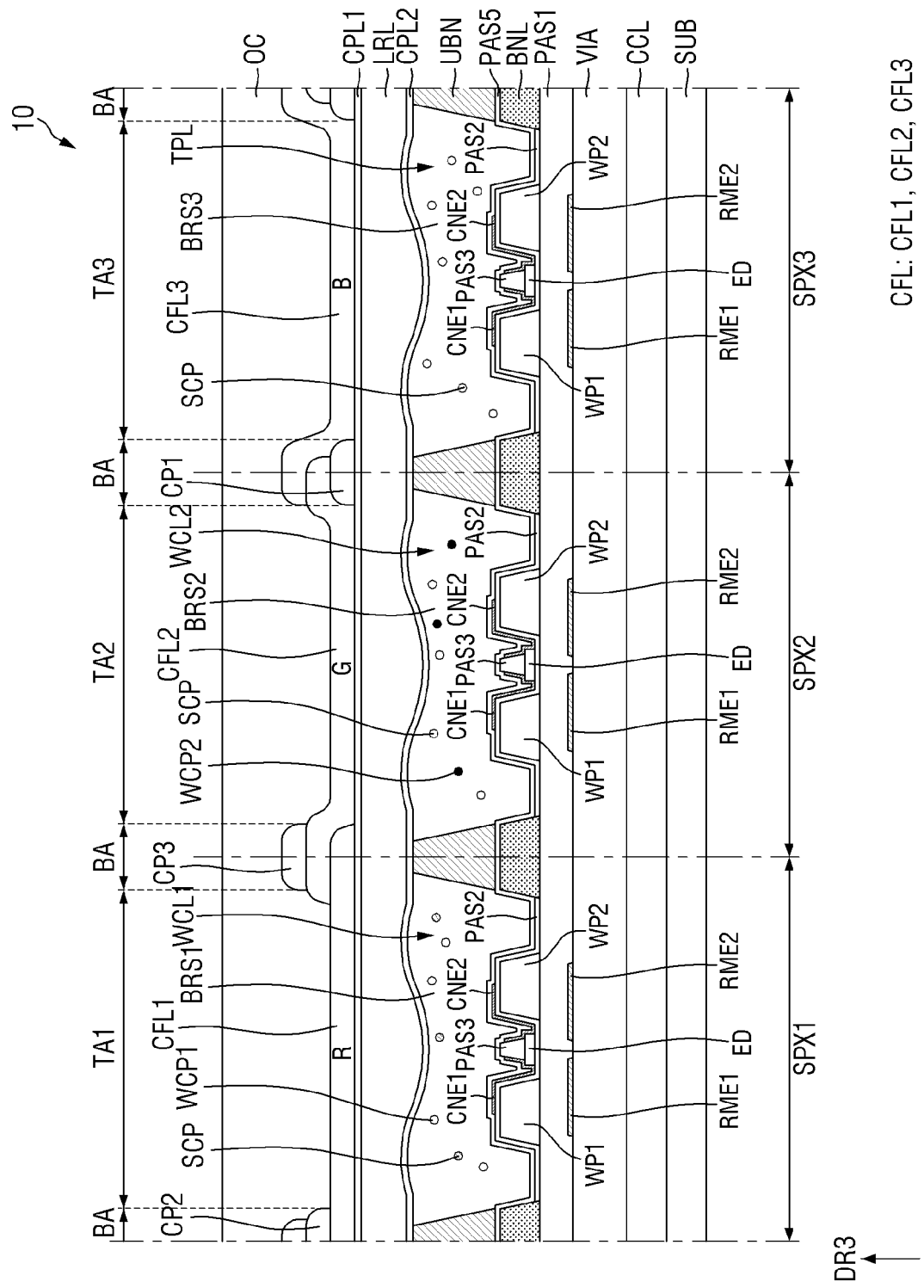

FIGS. 41 through 43 are schematic cross-sectional views of display devices according to embodiments.

Referring to FIG. 41, a color control structure (TPL, WCL1, and WCL2) and an upper bank layer UBN may be formed on a first substrate SUB, and color filter layers (CFL1, CFL2, and CFL3) may be formed on a second substrate DS. The embodiment of FIG. 41 differs from the embodiment of FIG. 40 in the layout of the color control structure (TPL, WCL1, and WCL2).

A fifth insulating layer PAS5 may be further disposed on third insulating layers PAS3, connecting electrodes (CNE1 and CNE2), and a bank layer BNL. The fifth insulating layer PAS5, like the first encapsulation layer EN1 of FIG. 40, may protect all the layers disposed on the first substrate SUB. In an embodiment, the fifth insulating layer PAS5 may not be provided.

The upper bank layer UBN may be disposed on or directly disposed on the fifth insulating layer PAS5 to overlap the bank layer BNL in a thickness direction. The upper bank layer UBN may be disposed to surround at least emission areas EMA of first, second, and third subpixels SPX1, SPX2, and SPX3, and the color control structure (TPL, WCL1, and WCL2) may be disposed to correspond to the emission areas EMA. For example, the color control structure (TPL, WCL1, and WCL2) may be formed as linear patterns and may thus be disposed across multiple emission areas EMA.

The color control structure (TPL, WCL1, and WCL2) may be disposed on or directly disposed on the fifth insulating layer PAS5. Light-emitting elements ED, which emit light, and the color control structure (TPL, WCL1, and WCL2) may be continuously disposed on one first substrate SUB. The upper bank layer UBN may have a height and may be disposed to surround areas where the light-emitting elements ED are disposed, and base resins (BRS1, BRS2, and BRS3) of the color control structure (TPL, WCL1, and WCL2) may be disposed on or directly disposed on the fifth insulating layer PAS5, in the areas surrounded by the upper bank layer UBN. Scatterers SCP and wavelength conversion materials (WCP1 and WCP2) of the color control structure (TPL, WCL1, and WCL2) may be disposed near the light-emitting elements ED, in the base resins (BRS1, BRS2, and BRS3).

A second capping layer CPL2 is disposed on the upper bank layer UBN and the color control structure (TPL, WCL1, and WCL2). The color control structure (TPL, WCL1, and WCL2) may be formed on the first substrate SUB after the formation of a circuit layer CCL, the light-emitting elements ED, and electrodes RME. Color filter layers (CFL1, CFL2, and CFL3), a light-blocking member BM, and a first capping layer CPL1 may be disposed on one surface or a surface of the second substrate DS, and the second substrate DS may be bonded to the first substrate SUB where the color control structure (TPL, WCL1, and WCL2), via a sealing member SM. As the distance between the color control structure (TPL, WCL1, and WCL2) and the light-emitting elements ED is reduced, the efficiency of color conversion can be improved. Also, as the color control structure (TPL, WCL1, and WCL2) is disposed on or directly disposed on the fifth insulating layer PAS5, the encapsulation layers EN of FIG. 40 may not be provided.

Referring to FIG. 42, light-emitting elements ED may be disposed on a first substrate SUB, and a color control structure (TPL, WCL1, and WCL2) and color filter layers (CFL1, CFL2, and CFL3) may be sequentially disposed on the light-emitting elements ED. The embodiment of FIG. 42 differs from the embodiment of FIG. 41 in that a second substrate DS and a sealing member SM are not provided and layers that may be formed on a second substrate DS may all be formed on the first substrate SUB.

A low refractive layer LRL may be disposed on the color control structure (TPL, WCL1, and WCL2) and the upper bank layer UBN, and a first capping layer CPL1, the color filter layers (CFL1, CFL2, and CFL3), a light-blocking member BM, and an overcoat layer OC may be disposed on the low refractive layer LRL.

The low refractive layer LRL, which is an optical layer for recycling light transmitted through the color control structure (TPL, WCL1, and WCL2), can improve the emission efficiency and color purity of a display device 10. The low refractive layer LRL may be formed of an organic material having a low refractive index and may compensate for height differences formed by the color control structure (TPL, WCL1, and WCL2) and the upper bank layer UBN.

The first capping layer CPL1, the color filter layers (CFL1, CFL2, and CFL3), and the light-blocking member BM may be substantially the same as their respective counterparts of the previous embodiments, except for their locations.

The first capping layer CPL1 may be disposed on the low refractive layer LRL and may prevent the low refractive layer LRL from being damaged or contaminated by impurities from the outside, such as moisture or the air. The light-blocking member BM may be disposed on the first capping layer CPL1 to overlap the upper bank layer UBN. The light-blocking member BM may be formed in a lattice shape to expose parts of the surface of the first capping layer CPL1. The color filter layers (CFL1, CFL2, and CFL3) may be disposed on the first capping layer CPL1 to correspond to areas opened by the light-blocking member BM.

The overcoat layer OC may be disposed on the color filter layers (CFL1, CFL2, and CFL3) and the light-blocking member BM. The overcoat layer OC may be disposed in an entire display area DPA, and part of the overcoat layer OC may be disposed even in a non-display area NDA. The overcoat layer OC may include an organic insulating material and may protect the members disposed in the display area DPA from the outside.

Referring to FIG. 43, a light-blocking member BM may not be provided, and color patterns (CP1, CP2, and CP3) may be disposed. The embodiment of FIG. 43 differs from the embodiment of FIG. 42 in that a light-blocking member BM is replaced with the color patterns (CP1, CP2, and CP3).

The color patterns (CP1, CP2, and CP3) may be formed in substantially the same lattice pattern as the light-blocking member BM of FIG. 42. The color patterns (CP1, CP2, and CP3) may include a same material or a similar material as color filter layers (CFL1, CFL2, and CFL3) and may be integral with the color filter layers (CFL1, CFL2, and CFL3). The color patterns (CP1, CP2, and CP3) may be stacked each other in light-blocking areas BA so that the transmission of light may be blocked in the light-blocking areas BA.

First color patterns CP1 may include a same material or a similar material as a first color filter layer CFL1 and may be disposed in the light-blocking areas BA. The first color patterns CP1 may be disposed on or directly disposed on a first capping layer CPL1, in the light-blocking areas BA, and may be integral with the first color filter layer CFL1, in light-blocking areas BA adjacent to a first light-transmitting area TA1 of a first subpixel SPX1.

Second color patterns CP2 may include a same material or a similar material as a second color filter layer CFL2 and may be disposed in the light-blocking areas BA. The second color patterns CP2 may be disposed on or directly disposed on the first color patterns CP1, in the light-blocking areas BA, and may be integral with the second color filter layer CFL2, in light-blocking areas BA adjacent to a second light-transmitting area TA2 of a second subpixel SPX2. Similarly, third color patterns CP3 may include a same material or a similar material as a third color filter layer CFL3 and may be disposed in the light-blocking areas BA. The third color patterns CP3 may be disposed on or directly disposed on the second color patterns CP2, in the light-blocking areas BA, and may be integral with the third color filter layer CFL3, in light-blocking areas BA adjacent to a third light-transmitting area TA3 of a third subpixel SPX3.

As the color patterns (CP1, CP2, and CP3) may be stacked each other to perform a same functions as a light-blocking member BM, color mixing that may be caused between adjacent areas by different colorants can be prevented. Also, as the color patterns (CP1, CP2, and CP3) include a same material or a similar material as the color filter layers (CFL1, CFL2, and CFL3), external light or reflected light transmitted through the light-blocking areas BA may have a wavelength range corresponding to a particular or given color. The eye color sensibility perceived by the eyes of a user varies depending on the color of light, and blue-wavelength light may be perceived less sensitively than green and red-wavelength light to the user. As a light-blocking member BM is not provided in the light-blocking areas BA, and instead, the color patterns (CP1, CP2, and CP3) are provided, the transmission of light can be blocked, and at the same time, reflected light can be perceived less sensitively by the user. Also, reflected light from external light can be reduced by absorbing the external light.

Figure 44:
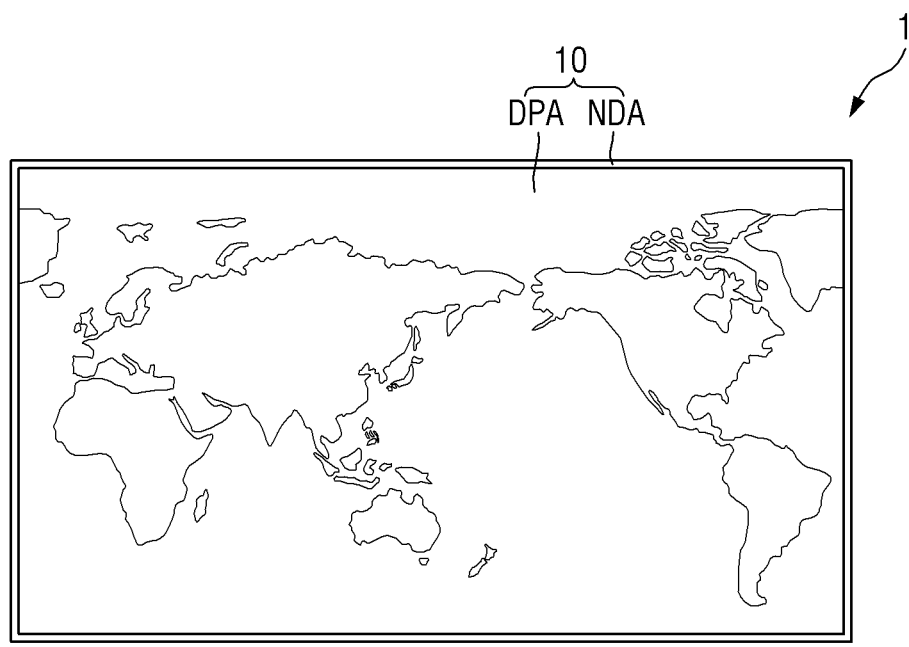
FIG. 44 is a schematic view of a large-size display device including a display device according to an embodiment.

FIG. 44 is a schematic view of a large-size display device including a display device according to an embodiment.

Referring to FIG. 44, a display device 10 may be applied to a large-size display device 1, that displays a large-size image. A first substrate SUB of the display device 10 may be a large-size substrate having a large size in first and second directions DR1 and DR2, and the display device 10 may include relatively large numbers of pixels PX and subpixels SPXn on the first substrate SUB. As the size of the display device 10 increases and a relatively large number of pixels PX are provided in the display device 10, the large-size display device 1 can provide an ultrahigh-resolution image to a user through a large-size screen.

FIG. 45 is a schematic plan view of a tiled display device according to an embodiment.

Referring to FIG. 45, display devices 10 may form a tiled display device TD together. The tiled display device TD may include the display devices 10. The display devices 10 may be arranged (or disposed) in a lattice pattern, but the disclosure is not limited thereto. The display devices 10 may be connected in a first direction DR1 or a second direction DR2, and the tiled display device TD may have a particular or given shape. In one example, the display devices 10 may all have a same size, but the disclosure is not limited thereto. In another example, the display devices 10 may have different sizes.

The tiled display device TD may generally have a flat shape, but the disclosure is not limited thereto. The tiled display device TD may have a stereoscopic shape and may thus provide a sense of depth to a user. In one example, in a case where the tiled display device TD has a stereoscopic shape, at least some or a number of the display devices 10 may have a curved shape. In another example, the display devices 10 may all have a flat shape and may be connected to one another at an angle so that the tiled display device TD may have a stereoscopic shape.

The tiled display device TD may include bonding areas 20, which are disposed between display areas DPA of the display devices 10. The tiled display device TD may be obtained by connecting non-display areas NDA of the display devices 10. The display devices 10 may be connected to one another via a bonding member or an adhesive member disposed in the bonding areas SA. The bonding areas 20 of the display devices 10 may not include pad portions in the non-display areas NDA and flexible films that may be attached to the pad portions. Thus, the distance between the display areas DPA of the display devices 10 may be small enough to be almost unrecognizable to the user. The reflectance of the display areas DPA of the display devices 10 may be substantially the same as the reflectance of the bonding areas 20 of the display devices 10. Thus, the tiled display device TD can overcome the sense of discontinuity between the display devices 10 and improve the degree of immersion of an image by preventing the bonding areas 20 of the display devices 10 from becoming recognizable to the user.

The display devices 10 may be arranged (or disposed) by connecting the long sides or the short sides of each of the display devices 10. Some or a number of the display devices 10 may be arranged (or disposed) along the edges of the tiled display device TD to form the sides of the tiled display device TD. Some or a number of the display devices 10 may be arranged (or disposed) at the corners of the tiled display device TD to form each pair of adjacent sides of the tiled display device TD. Some or a number of the display devices 10 may be disposed in the middle of the tiled display device TD and may be surrounded by other display devices 10. As a single tiled display device TD can be formed by connecting multiple display devices 10, a large-size screen image can be displayed.

In concluding the detailed description, those skilled in the art will appreciate that many variations and modifications can be made to the embodiments without substantially departing from the principles of the disclosure. Therefore, the disclosed embodiments are used in a generic and descriptive sense only and not for purposes of limitation.

What is claimed is:

1. A display device comprising:
   a first electrode and a second electrode disposed on a substrate, the first electrode and the second electrode being spaced apart from each other;
   a first insulating layer disposed on the first electrode and the second electrode;
   wall patterns disposed on the first insulating layer and overlapping the first electrode and the second electrode;
   a second insulating layer disposed on the first insulating layer and overlapping the wall patterns;
   light-emitting elements disposed directly on the second insulating layer and disposed between the wall patterns;
   a bank layer disposed on the first insulating layer and surrounding an area including the light-emitting elements;
   a first connecting electrode disposed on the first electrode and electrically contacting the light-emitting elements; and
   a second connecting electrode disposed on the second electrode and electrically contacting the light-emitting elements, wherein
   the first insulating layer includes an organic insulating material, and the second insulating layer includes an inorganic insulating material,
wherein the first electrode and the second electrode are spaced apart from a trahsistor of a pixel driving circuit by an insulating layer therebetween in a thickness direction.

2. The display device of claim 1, wherein
the wall patterns are disposed directly on the first insulating layer, and
parts of the second insulating layer are disposed directly on the wall patterns.

3. The display device of claim 2, wherein
the bank layer is disposed directly on the first insulating layer, and
the second insulating layer is disposed in the area surrounded by the bank layer.

4. The display device of claim 2, wherein the bank layer overlaps parts of the second insulating layer disposed directly on the first insulating layer.

5. The display device of claim 1, wherein
the second insulating layer is disposed directly on the first insulating layer, and
the wall patterns are disposed directly on the second insulating layer.

6. The display device of claim 5, wherein the bank layer is disposed directly on the first insulating layer and does not overlap the second insulating layer.

7. The display device of claim 1, further comprising:
a via layer disposed between the substrate and the first electrode and disposed between the substrate and the second electrode, the via layer including an organic insulating material,
wherein a thickness of the first insulating layer is less than a thickness of the via layer.

8. The display device of claim 1, wherein a distance between the first electrode and the second electrode is less than a distance between the wall patterns.

9. The display device of claim 1, further comprising:
a first voltage line and a second voltage line disposed on the substrate; and
a passivation layer disposed on the first voltage line and the second voltage line,
wherein the first electrode and the second electrode are disposed on the passivation layer and spaced apart from the first voltage line and the second voltage line by the passivation layer.

10. The display device of claim 9, wherein the first connecting electrode and the second connecting electrode are electrically connected to the first voltage line and the second voltage line, respectively.

11. The display device of claim 10, wherein
a part of the second electrode that does not overlap the first insulating layer directly electrically contacts the second voltage line through a contact hole penetrating the passivation layer, in an area that does not overlap the first insulating layer, and
a part of the second connecting electrode that does not overlap the first insulating layer directly electrically contacts the second electrode through a contact hole penetrating the second insulating layer.

12. The display device of claim 10, wherein the second connecting electrode directly electrically contacts the second voltage line through a contact hole penetrating the second insulating layer and the passivation layer.

13. The display device of claim 1, further comprising:
a third electrode disposed on the substrate and disposed between the first electrode and the second electrode; and
a fourth electrode disposed on the substrate, the fourth electrode being spaced apart from the third electrode, the second electrode being disposed between the fourth electrode and the third electrode, wherein
the wall patterns include:
a first wall pattern overlapping the first electrode;
a second wall pattern overlapping the fourth electrode; and
a third wall pattern overlapping the second electrode and the third electrode, and
the light-emitting elements include:
first light-emitting elements disposed between the first wall pattern and the third wall pattern; and
second light-emitting elements disposed between the second wall pattern and the third wall pattern.

14. The display device of claim 13, wherein
the first connecting electrode electrically contacts the first light-emitting elements,
the second connecting electrode electrically contacts the second light-emitting elements, and
the display device includes a third connecting electrode disposed on the third electrode and electrically contacting the first light-emitting elements, and
a fourth connecting electrode disposed on the fourth electrode and electrically contacting the second light-emitting elements.

15. The display device of claim 1, further comprising:
a color control structure disposed on the light-emitting elements, the color control structure including wavelength conversion particles;
a color filter layer disposed on the color control structure; and
a light-blocking member disposed on the bank layer, the light-blocking member surrounding the color filter layer.

16. The display device of claim 15, further comprising:
an upper bank layer disposed on the bank layer; and
a low refractive layer disposed between the color control structure and the color filter layer,
wherein the color control structure is disposed in an area surrounded by the upper bank layer.

17. The display device of claim 1, wherein the second insulating layer overlaps the wall patterns in their entirety.

18. The display device of claim 17, wherein the second insulating layer directly contacts upper surfaces of the wall patterns in their entirety.

19. The display device of claim 1, wherein
the first electrode and the second electrode extend in a first direction on the substrate, and spaced apart from each other in a second direction;
the wall patterns extend in the first direction and spaced apart from one another in the second direction.

20. A display device comprising:
a substrate including an emission area and a subarea disposed on a side in a first direction of the emission area;
a first electrode and a second electrode extending in the first direction on the substrate, spaced apart from each other in a second direction, and disposed in the emission area and the subarea;
a first insulating layer disposed in the emission area and overlapping parts of the first electrode and the second electrode in the emission area;

wall patterns extending in the first direction in the emission area and spaced apart from one another in a second direction;
a bank layer surrounding the emission area and the subarea;
a second insulating layer including:
   a first insulating pattern disposed in the emission area and overlapping the wall patterns; and
   a second insulating pattern disposed in the subarea;
light-emitting elements disposed on the second insulating layer and disposed between the wall patterns;
a first connecting electrode disposed on the first electrode in the emission area and the subarea, and electrically contacting the light-emitting elements; and
a second connecting electrode disposed on the second electrode in the emission area and the subarea, and electrically contacting the light-emitting elements.

21. The display device of claim 20, wherein
the first insulating layer overlaps parts of the bank layer that surround the emission area of the substrate, and
the first insulating pattern of the second insulating layer does not overlap the parts of the bank layer that surround the emission area of the substrate.

22. The display device of claim 21, wherein
the second insulating pattern includes:
   a first contact exposing a part of a top surface of the first electrode in the subarea; and
   a second contact exposing a part of a top surface of the second electrode in the subarea,
the first connecting electrode directly electrically contacts the first electrode through the first contact, and
the second connecting electrode directly electrically contacts the second electrode through the second contact.

23. The display device of claim 20, wherein
the second insulating pattern includes:
   a first contact which does not overlap the first electrode in the subarea; and
   a second contact which does not overlap the second electrode in the subarea,
the first connecting electrode does not contact the first electrode, and
the second connecting electrode does not contact the second electrode.

24. The display device of claim 23, wherein
the first insulating layer includes an organic insulating material, and
the second insulating layer includes an inorganic insulating material.

25. The display device of claim 24, further comprising:
a third insulating layer disposed on the light-emitting elements and disposed between the wall patterns.

26. The display device of claim 25, further comprising:
a third electrode disposed between the first electrode and the second electrode; and
a fourth electrode spaced apart from the third electrode in the second direction, the second electrode being disposed between the fourth electrode and the third electrode,
wherein the wall patterns include:
   a first wall pattern overlapping the first electrode;
   a second wall pattern overlapping the fourth electrode; and
   a third wall pattern overlapping the second electrode and the third electrode.

27. The display device of claim 26, wherein
the light-emitting elements include first light-emitting elements, second light-emitting elements, third light-emitting elements, and fourth light-emitting elements,
the first light-emitting elements and the third light-emitting elements are disposed on the first electrode and the third electrode and disposed between the first wall pattern and the third wall pattern, and
the second light-emitting elements and the fourth light-emitting elements are disposed on the second electrode and the fourth electrode and disposed between the second wall pattern and the third wall pattern.

28. The display device of claim 26, further comprising:
a third connecting electrode spaced apart from the first connecting electrode and disposed on the first electrode and the third electrode;
a fourth connecting electrode spaced apart from the second connecting electrode and disposed on the second electrode and the fourth electrode; and
a fifth connecting electrode spaced apart from the third connecting electrode and the fourth connecting electrode and disposed on the third electrode and the fourth electrode.

* * * * *